(12) United States Patent
Aiouaz et al.

(10) Patent No.: US 11,907,063 B2
(45) Date of Patent: Feb. 20, 2024

(54) READ-DISTURB-BASED PHYSICAL STORAGE READ TEMPERATURE INFORMATION IDENTIFICATION SYSTEM

(71) Applicant: Dell Products L.P., Round Rock, TX (US)

(72) Inventors: Ali Aiouaz, Bee Cave, TX (US); Walter A. O'Brien, III, Westborough, MA (US); Leland W. Thompson, Tustin, CA (US)

(73) Assignee: Dell Products L.P., Round Rock, TX (US)

( * ) Notice: Subject to any disclaimer, the term of this patent is extended or adjusted under 35 U.S.C. 154(b) by 223 days.

(21) Appl. No.: 17/581,874

(22) Filed: Jan. 22, 2022

(65) Prior Publication Data

US 2023/0236928 A1    Jul. 27, 2023

(51) Int. Cl.
| | | |
|---|---|---|
| *G11C 7/00* | (2006.01) | |
| *G06F 11/10* | (2006.01) | |
| *G06F 11/30* | (2006.01) | |
| *G06F 3/06* | (2006.01) | |
| *G11C 7/04* | (2006.01) | |

(52) U.S. Cl.
CPC .......... *G06F 11/1068* (2013.01); *G06F 3/064* (2013.01); *G06F 3/0619* (2013.01); *G06F 3/0679* (2013.01); *G06F 11/3058* (2013.01); *G11C 7/04* (2013.01)

(58) Field of Classification Search
CPC ... G11C 7/04; G11C 11/406; G11C 11/40626; G11C 5/147; G11C 5/142
USPC ........................................................ 365/211
See application file for complete search history.

(56) References Cited

U.S. PATENT DOCUMENTS

| | | | |
|---|---|---|---|
| 8,726,140 B2 | 5/2014 | Chang et al. | |
| 11,586,385 B1 | 2/2023 | Lercari et al. | |
| 2017/0371559 A1 | 12/2017 | Higgins et al. | |
| 2020/0395087 A1* | 12/2020 | Banerjee ................ | G11C 16/14 |
| 2021/0318827 A1 | 10/2021 | Bernat et al. | |

* cited by examiner

*Primary Examiner* — Son T Dinh
(74) *Attorney, Agent, or Firm* — Joseph Mencher

(57) ABSTRACT

A read-disturb-based physical storage read temperature information identification system includes a global read temperature identification subsystem coupled to at least one storage device. Each at least one storage device reads valid data and obsolete data from at least one physical block in that storage device and, based on the reading of the valid data and the obsolete data, generates read disturb information associated with each row provided by the at least one physical block in that storage device. Each at least one storage devices then uses the read disturb information associated with each row provided by the at least one physical block in that storage device to generate a local logical storage element read temperature map for that storage device that it provides to the global read temperature identification subsystem.

20 Claims, 29 Drawing Sheets

READ-DISTURB-BASED PHYSICAL STORAGE READ TEMPERATURE INFORMATION IDENTIFICATION SYSTEM

BACKGROUND

The present disclosure relates generally to information handling systems, and more particularly to identifying physical storage read temperatures associated with physical storage in an information handling system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices and/or storage systems, and/or other computing devices known in the art, includes storage systems having one or more storage devices (e.g., Solid State Drive (SSD) storage devices) for storing data generated by the computing device. In some situations, it may be desirable to identify how often logical storage locations associated with any storage device are read. For example, different storage devices with different capabilities are associated with different costs (e.g., storage devices with relatively "higher" capabilities are more expensive than storage devices with relative "lower" capabilities), while different data stored in a storage system may have different characteristics, with some data being read relatively often (also referred to as data having a relatively "hot" read temperature) and other data being read relatively less often (also referred to as data having a relatively "cold" read temperature). As will be appreciated by one of skill in the art in possession of the present disclosure, financial margins of storage providers (e.g., entities that provide storage for customers) may be improved by offering particular storage Service Level Agreements (SLAs) while using relatively cheaper storage devices, and value can be passed on to customers by providing improved storage SLAs for data with relatively "hot" read temperatures without incurring higher costs for all storage devices in the storage system (e.g., by storing data with relatively "hot" read temperatures on relatively higher capability/cost storage devices, and storing data with relatively "cold" read temperatures on relatively lower capability/cost storage devices).

Conventional read temperature identification systems typically utilize a host processor (or a storage processor) and a host memory in a server device and/or storage system to identify read temperatures of logical storage locations in SSD storage device(s) included in, connected to, and/or otherwise coupled to that server device and/or storage system. For example, a Logical Block Address (LBA) range may be divided into smaller address ranges or logical "chunks" (e.g., 128 KB chunks). A counter (e.g., a Dynamic Random Access Memory (DRAM) counter) in the host memory may then be assigned to track read access to each logical chunk, and when the host processor performs read operations to read data from each of the SSD storage device(s) in the server device and/or storage system, the host processor will map the LBA range of that read operation to the corresponding logical chunk(s) being read, and increment the counter(s) for those physical storage element chunk(s) in the host memory. However, such conventional read temperature identification systems suffer from a number of issues.

For example, the conventional read temperature identification systems discussed above require dedicated host memory (e.g., for a 16 TB SSD storage device with 128 KB logical chunks, 32 MB of dedicated host memory is required if 8 bit counters are utilized), and the read temperature information identified will not be power-fail safe without a persistent power implementation (e.g., a battery backup, the use of Storage Class Memory (SCM) devices, etc.), each of which increases costs. In another example, the conventional read temperature identification systems discussed above increase complexity, as for a High Availability (HA) system each of multiple host processors included in a server device and/or storage system must generate its own read temperature map that tracks read temperatures of its storage devices in that server device and/or storage system, and then those host processors must synchronize their respective read temperature maps. Further complexity may be introduced when more Input/Output (I/O) initiators are utilized (e.g., when additional host processors are utilized in Non-Volatile Memory express over Fabrics (NVMe-oF) Just a Bunch Of Drives (JBOD) systems, disaggregated storage systems, and/or other systems that would be apparent to one of skill in the art in possession of the present disclosure).

In yet another example, the conventional read temperature identification systems discussed above may be inaccurate in some situations, as read temperature identification operations may be performed "in the background" with a "best effort" approach, and when host processors in a server device and/or storage system are busy performing other operations, those read temperature identification operations may not be performed in order to prevent I/O latency and/or other performance issues. While the host processors in a server device and/or storage system may sometimes only delay the read temperature identification operations in those situations, in some cases the read temperature identification operations may simply not be performed. In yet another example, the conventional read temperature identification systems discussed above can introduce a performance impact to data path(s) in a server device and/or storage system due to the use of the host processor and the host memory bus in performing the read temperature identification (e.g., via Read Modify Write (RMW) operations to provide these relatively small read temperature data writes via 64 byte cache line host memory entries, resulting in increased cache thrashing operations).

One conventional read temperature identification solution to the issues discussed above is to assume or characterize (a priori) the read temperatures of a storage device based on the type of data being read (e.g., metadata vs customer data), the type of application instructing the read operation (e.g., Relational Database Management System (RDBMS) applications vs. social media post applications (e.g., applications provided "tweets" via the TWITTER® social networking service available from TWITTER® of San Francisco, California, United States) vs. video streaming applications), the type of workload being performed (e.g., 4K vs. 8K video streaming workloads, sequential access vs. random access workloads, etc.). However, such conventional read temperature identification solutions suffer from a number of issues as well.

For example, the conventional read temperature identification solutions discussed above require pre-qualification or classification of data attributes, and cannot provide granularity beyond the particular classification that is used. In another example, conventional read temperature identification solutions do not allow for sub-classifications of data (e.g., a video type of the read data) that may be useful, will not allow data (e.g., video data such as that providing a movie) that is read often to be provided on a faster storage device or replicated at additional storage locations, and present issues with tracking effective "hits" per storage device and load balancing (as conventional read temperature identification solutions are typically limited to tracking data requests (e.g., video data requests) at the application level). In yet another example, conventional read temperature identification solutions require modification of software when new types of data, applications, and/or workloads are introduced and, as such, are less resilient with regard to optimizing read performance for use cases that emerge over time, and present additional costs associated with research and development to qualify new workloads or applications, develop software, test that software, perform software patch updates on server devices and/or storage systems that will use that software, and/or introduce other added cost factors that would be apparent to one of skill in the art in possession of the present disclosure.

Accordingly, it would be desirable to provide read temperature identification system that addressees the issues discussed above.

SUMMARY

According to one embodiment, a storage device includes a processing system; and a memory system that is coupled to the processing system and that includes instructions that, when executed by the processing system, cause the processing system to provide a read-disturb-based physical storage read temperature information identification engine that is configured to: read, from at least one physical block in a storage device, valid data and obsolete data; identify, based on the reading of the valid data and the obsolete data from the at least one physical block in the storage device, read disturb information associated with each row provided by the at least one physical block in the storage device; generate, using the read disturb information associated with each row provided by the at least one physical block in the storage device, a local logical storage element read temperature map for the storage device; and provide the local logical storage element read temperature map to a global read temperature identification subsystem.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more solid state drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
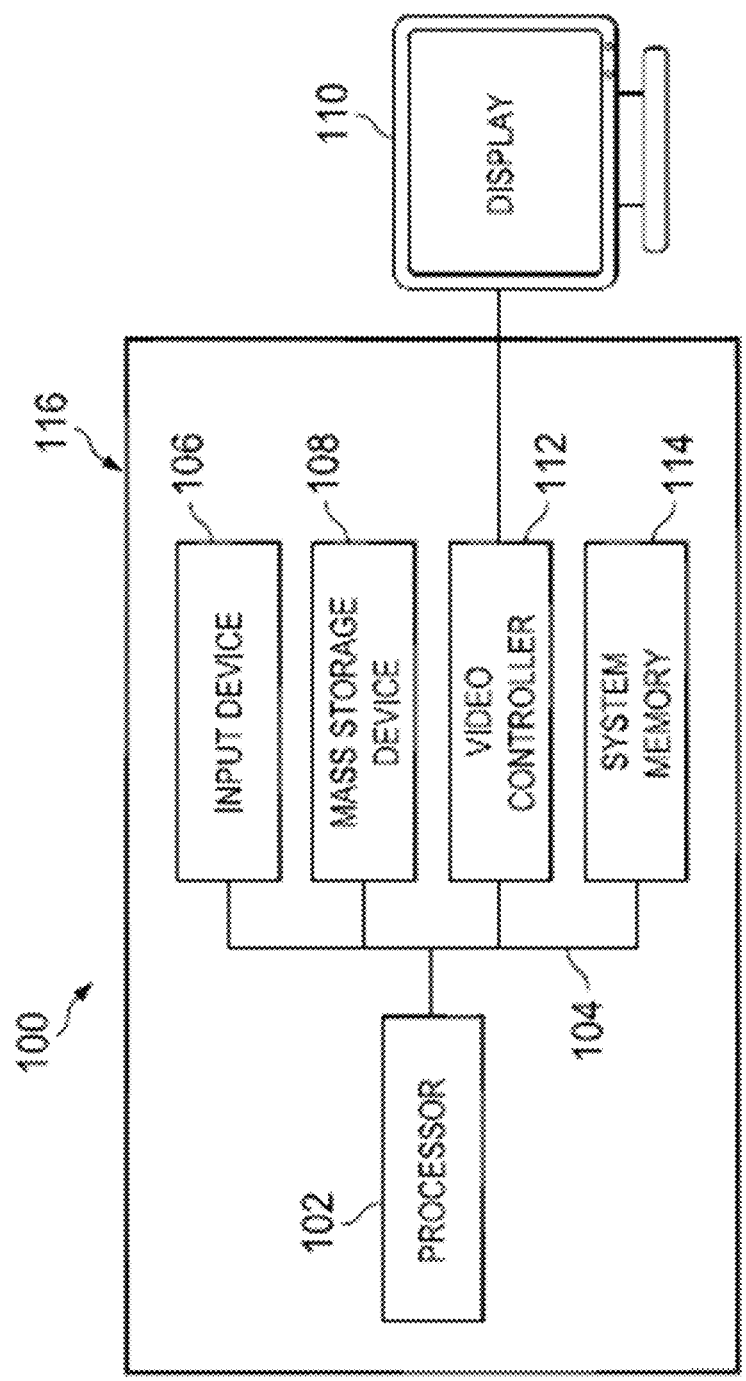
FIG. 1 is a schematic view illustrating an embodiment of an Information Handling System (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
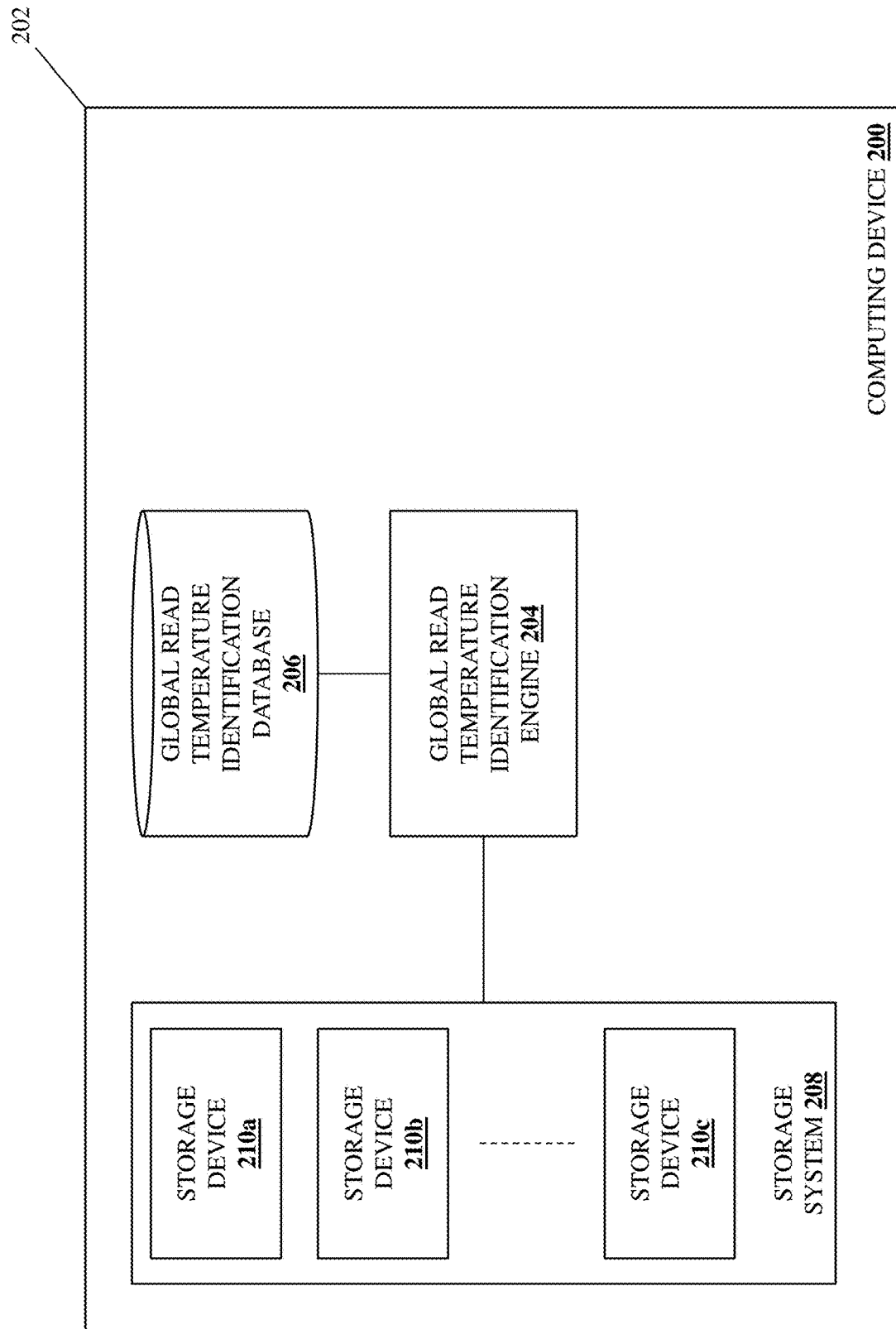
FIG. 2 is a schematic view illustrating an embodiment of a computing device that may include the read-disturb-based read temperature identification system of the present disclosure.

Referring now to FIG. 2, an embodiment of a computing device 200 is illustrated that may include the read-disturb-based read temperature identification system of the present disclosure. In an embodiment, the computing device 200 may be provided by the IHS 100 discussed above with reference to FIG. 1 and/or may include some or all of the components of the IHS 100, and in the specific examples below is illustrated and described as being provided by a server device and/or a storage system. However, while illustrated and discussed as being provided by particular computing devices, one of skill in the art in possession of the present disclosure will recognize that the functionality of the computing device 200 discussed below may be provided by other devices that are configured to operate similarly as the computing device 200 discussed below. In the illustrated embodiment, the computing device 200 includes a chassis 202 that houses the components of the computing device 200, only some of which are illustrated and discussed below. For example, the chassis 202 may house a processing system (not illustrated, but which may include the processor 102 discussed above with reference to FIG. 1 that may be provided by a Central Processing Unit (CPU) and/or other processing systems that one of skill in the art in possession of the present disclosure would recognize as providing a computing device host processor) and a memory system (not illustrated, but which may include the memory 114 discussed above with reference to FIG. 1) that is coupled to the processing system and that includes instructions that, when executed by the processing system, cause the processing system to provide a global read temperature identification engine 204 that is configured to perform the functionality of the global read temperature identification engines and/or computing devices discussed below.

The memory system housed in the chassis 202 may also include a global read temperature identification database 206 that is configured to store any of the information utilized by the global read temperature identification engine 204 discussed below. The chassis 202 may also house a storage system 208 that, in the illustrated embodiment, includes a plurality of storage devices 210a, 210b, and up to 210c. In the specific examples below, each of the storage devices 210a-210c in the storage system 208 are described as being provided by particular Solid State Drive (SSD) storage devices, but one of skill in the art in possession of the present disclosure will appreciate how the teachings of the present disclosure may benefit other storage device technologies, and thus storage devices utilizing those other types of storage device technologies are envisioned as falling within the scope of the present disclosure as well. However, while a specific computing device 200 has been illustrated and described, one of skill in the art in possession of the present disclosure will recognize that computing devices (or other devices operating according to the teachings of the present disclosure in a manner similar to that described below for the computing device 200) may include a variety of components and/or component configurations for providing conventional computing device functionality, as well as the functionality discussed below, while remaining within the scope of the present disclosure as well.

Figure 3A:
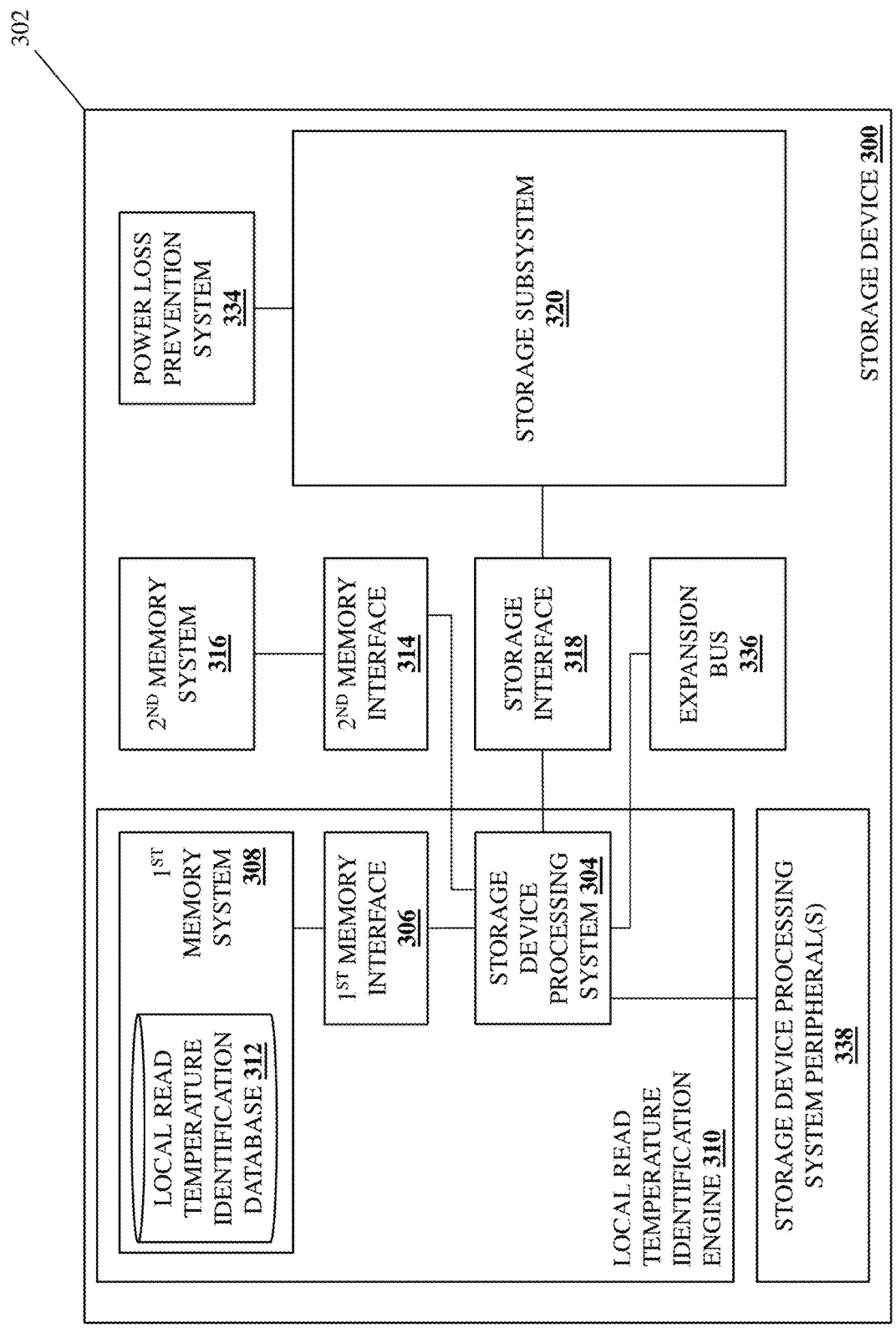
FIG. 3A is a schematic view illustrating an embodiment of a storage device that may be included in the computing device of FIG. 2 and that may provide the read-disturb-based read temperature identification system of the present disclosure.

Referring now to FIG. 3A, an embodiment of a storage device 300 is illustrated that may provide any or each of the storage devices 210a-210c in the storage system 208 discussed above with reference to FIG. 2. In an embodiment, the storage device 300 may be provided by the IHS 100 discussed above with reference to FIG. 1 and/or may include some or all of the components of the IHS 100, and in the specific examples below is illustrated and described as being provide by an SSD storage device (e.g., a Non-Volatile Memory express (NVMe) SSD storage device). However, while illustrated and discussed as being provided by a particular storage device, one of skill in the art in possession of the present disclosure will appreciate that the teachings of the present disclosure may be implemented in other storage devices that are configured to operate similarly as the storage device 200 discussed below. In the illustrated embodiment, the storage device 200 includes a chassis 302 that houses the components of the storage device 300, only some of which are illustrated and discussed below.

For example, the chassis 302 may house a storage device processing system 304 (which may include the processor 102 discussed above with reference to FIG. 1 such as a Central Processing Unit (CPU), storage device controller, and/or other processing systems that one of skill in the art in possession of the present disclosure would recognize as being provided in an SSD storage device) that is coupled via a first memory interface 306 (e.g., a Dual Data Rate (DDR) interface) to a first memory system 308 (which may include the memory 114 discussed above with reference to FIG. 1 such as Dynamic Random Access Memory (DRAM) devices and/or other memory systems that would be apparent to one of skill in the art in possession of the present disclosure). As illustrated in the specific examples provided herein, the first memory system 308 may include instructions that, when executed by the storage processing system 304, cause the storage device processing system 304 to provide a local read temperature identification engine 310 that is configured to perform the functionality of the local read temperature identification engines and/or storage devices discussed below.

As also illustrated in the specific examples provided herein, the first memory system 308 may include a local read temperature identification database 312 that is configured to store any of the information utilized by the local read temperature identification engine 310 discussed below. However, one of skill in the art in possession of the present disclosure will recognize that other embodiments of the present disclosure may provide the local read temperature identification database 312 in other locations while remaining within the scope of the present disclosure as well. For example, as illustrated, the storage device processing system 304 may also be coupled via a second memory interface 314 (e.g., a Storage Class Memory (SCM) interface) to a second memory system 316 (which may include the memory 114 discussed above with reference to FIG. 1 such as SCM devices and/or other memory systems that would be apparent to one of skill in the art in possession of the present disclosure), and the local read temperature identification database 312 may be provided by the second memory system 316 while remaining within the scope of the present disclosure as well.

Figure 3B:
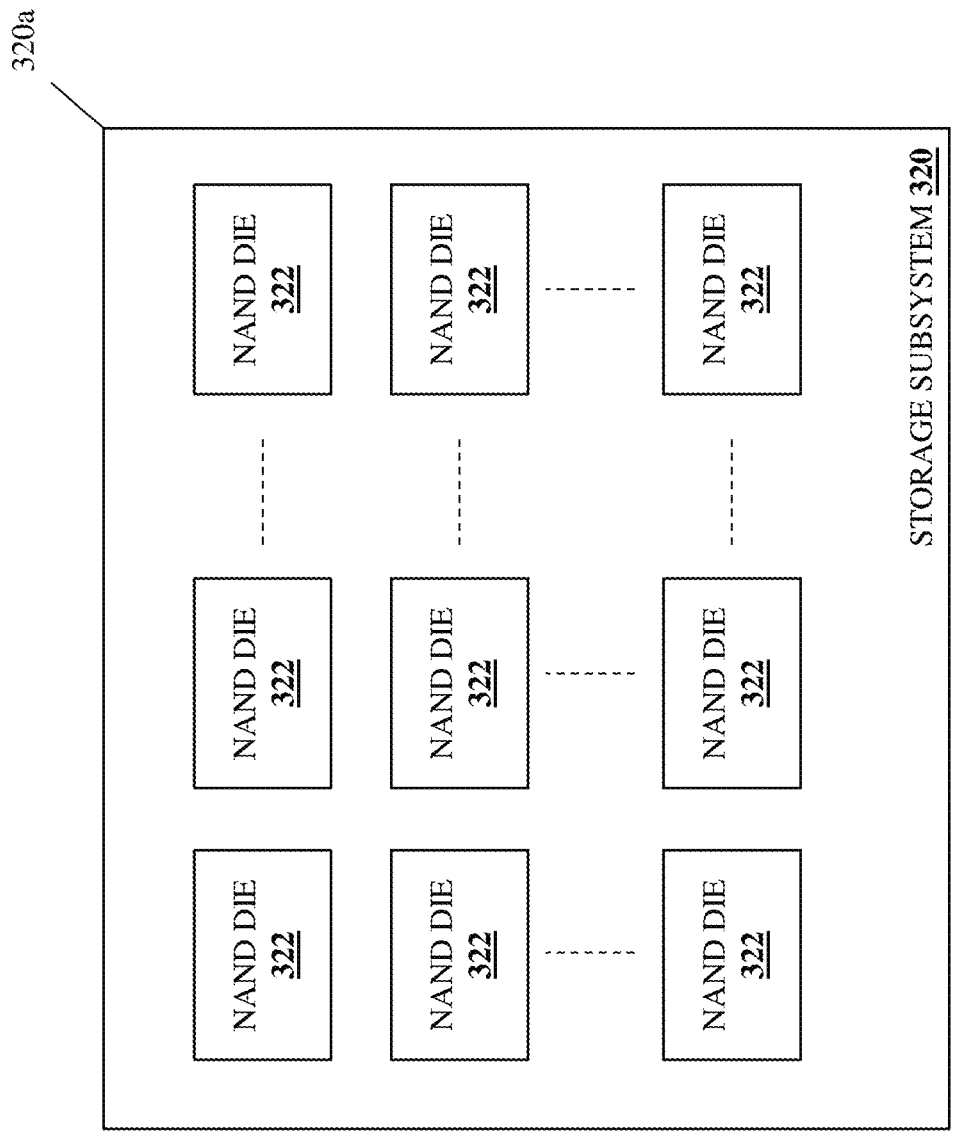
FIG. 3B is a schematic view illustrating an embodiment of a storage subsystem that may be included in the storage device of FIG. 3A.
Figure 3C:
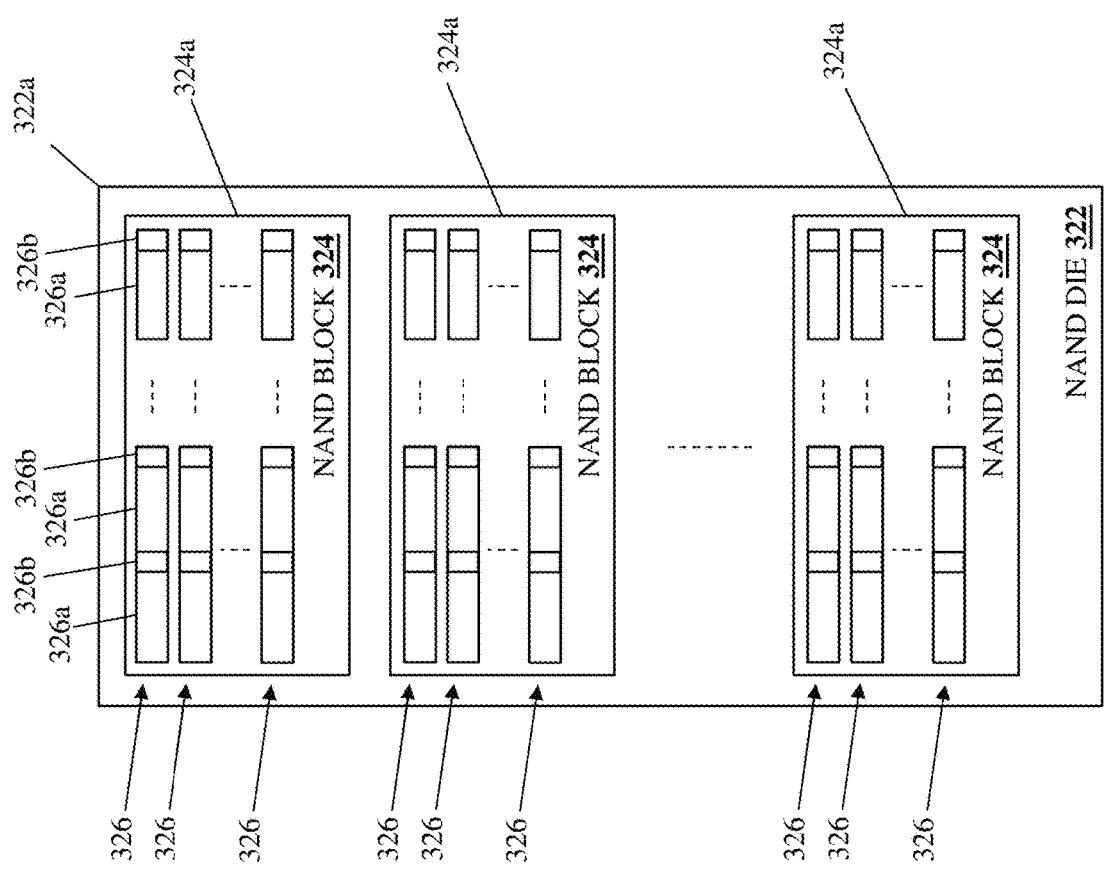
FIG. 3C is a schematic view illustrating an embodiment of NAND die that may be included in the storage subsystem of FIG. 3B.

The storage device processing system 304 may also be coupled via a storage interface 318 to a storage subsystem 320. With reference to FIG. 3B, in some embodiments, the storage subsystem 320 may include a storage subsystem chassis 320a that supports a plurality of NAND die 322. With reference to FIG. 3C, each NAND die 322 may include a chassis 322a that supports a plurality of NAND blocks 324, with each NAND block 324 including a chassis 324a that supports a plurality of NAND wordlines 326. Furthermore, each NAND wordline 326 may include a plurality of cells that provide a plurality of data portions 326a, and a respective error check portion 326b (e.g., a Cyclic Redundancy Check (CRC) portion and/or other error check data known in the art) may be associated with each of those data portions 326a. However, one of skill in the art in possession of the present disclosure will appreciate how in some embodiments the data written to a NAND block 324 may include "padding" data or other data which conventionally does require the writing of associated error check portions.

To provide a specific example, the storage subsystem 320 may include 128, 256, or 512 NAND die, with each NAND die including approximately 2000 NAND blocks, and with each NAND block including NAND wordlines grouped into 100-200 NAND layers (although forecasts predict that NAND wordlines will be grouped into up to 800 layers by the year 2030). As will be appreciated by one of skill in the art in possession of the present disclosure, conventional Triple Level Cell (TLC) technology typically allows on the order of tens to hundreds of K of data (e.g., 96 KiB on a NAND wordline, 48 KiB on a NAND wordline with two NAND wordlines activated at any particular time, up to hundreds of KiB when more planes are utilized, etc.) to be stored per NAND wordline (i.e., in the data portions of those NAND wordlines), resulting in NAND wordlines with ~250K cells.

Figure 3D:
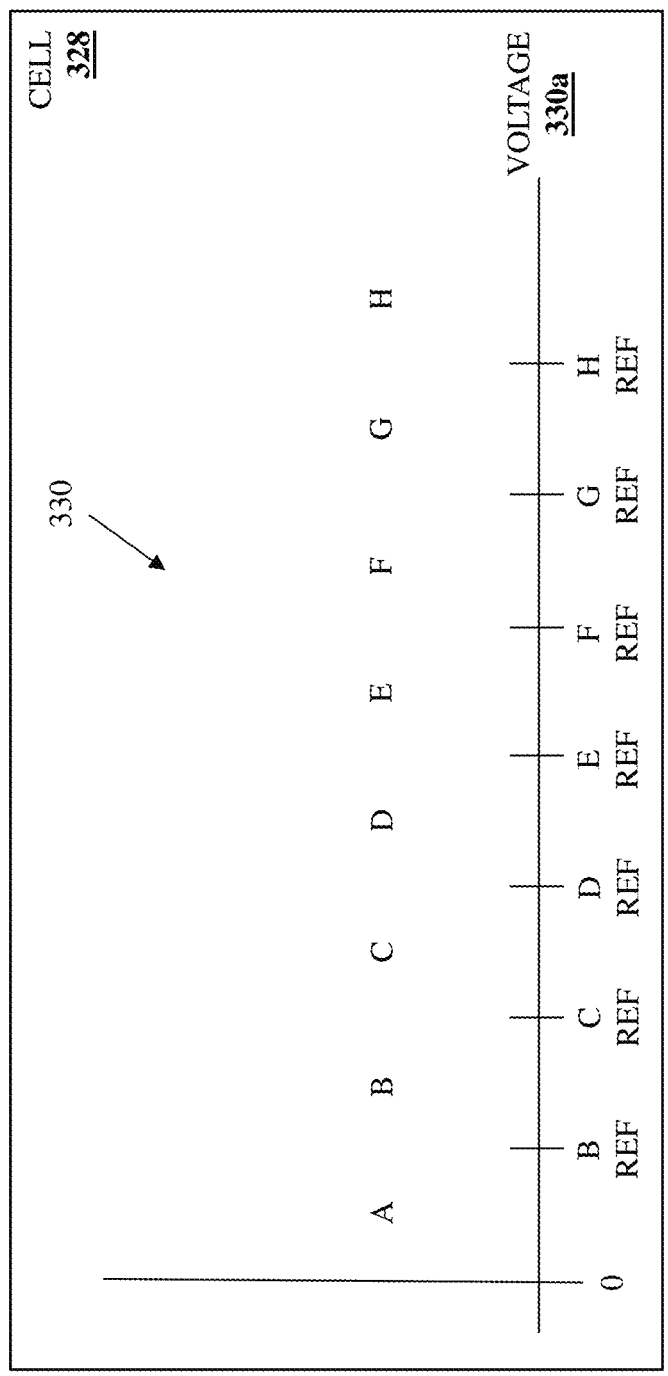
FIG. 3D is a graph view illustrating an embodiment of voltages/values available in a cell of a NAND wordline in a NAND block that is included in the NAND die of FIG. 3C.
Figure 3E:
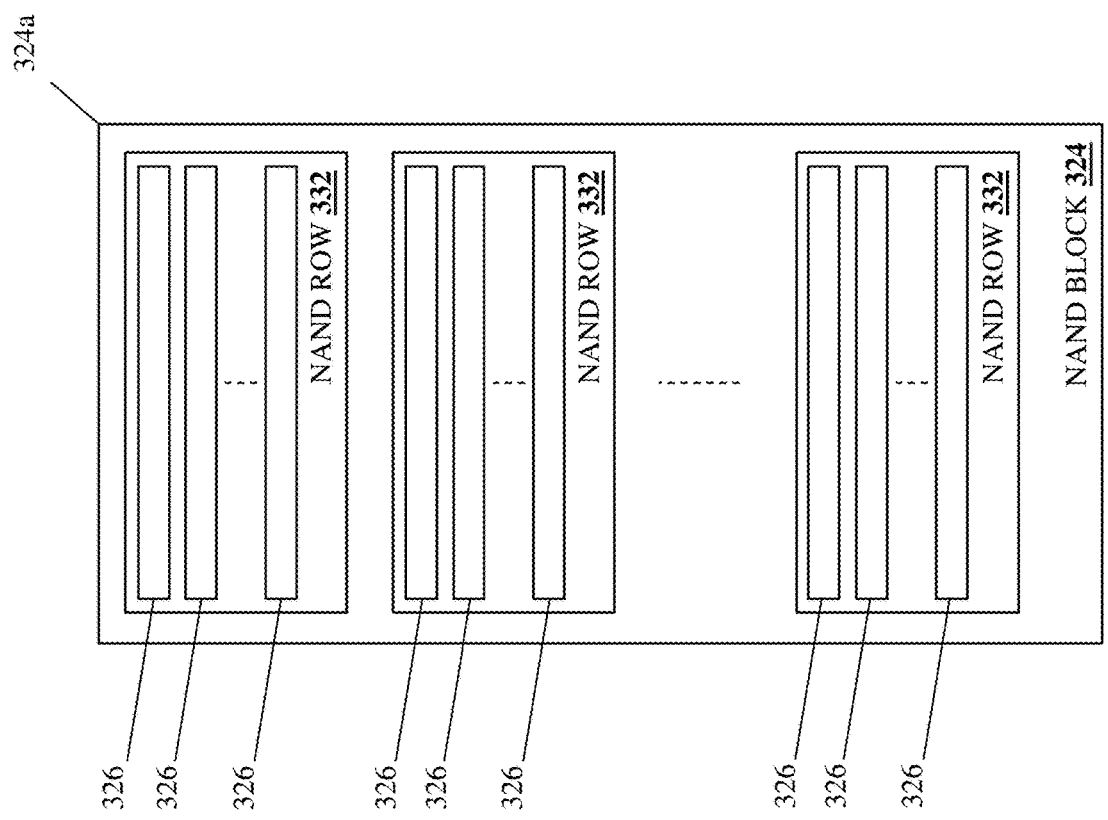
FIG. 3E is a schematic view illustrating an embodiment of a NAND block that is abstracted with "NAND rows" for purposes of describing different embodiments the read-disturb-based read temperature identification system of the present disclosure.

With reference to FIG. 3D, a simplified representation of how data may be stored in a cell 328 is provided, and one of skill in the art in possession of the present disclosure will appreciate how data may be stored in any of the plurality of cells in any of the plurality of NAND wordlines discussed above in the manner described below. The data storage representation of the cell 328 in FIG. 3D includes a graph 330 with voltage 330a on the X-axis, and illustrates how different voltages of the cell 228 may be associated with different values for that cell 328, which in specific example illustrated in FIG. 3E includes values "A", "B", "C", "D", "E", "F", "G", and "H". Furthermore, the data storage representation of the cell 328 also illustrated how reference voltages may be defined to distinguish whether a voltage in the cell provide a particular value, with a B reference ("B REF") distinguishing between a value "A" or a value "B" for the cell 328, a C reference ("C REF") distinguishing between a value "B" or a value "C" for the cell 328, a D reference ("D REF") distinguishing between a value "C" or a value "D" for the cell 328, an E reference ("E REF") distinguishing between a value "D" or a value "E" for the cell 328, an F reference ("F REF") distinguishing between a value "E" or a value "F" for the cell 328, a G reference ("G REF") distinguishing between a value "F" or a value "G" for the cell 328, an H reference ("H REF") distinguishing between a value "G" or a value "H" for the cell 328.

As such, when the cell 328 includes a voltage below "B REF" it will provide a value "A", when the cell 328 includes a voltage between "B REF" and "C REF" it will provide a value "B", when the cell 328 includes a voltage between "C REF" and "D REF" it will provide a value "C", when the cell 328 includes a voltage between "D REF" and "E REF" it will provide a value "D", when the cell 328 includes a voltage between "E REF" and "F REF" it will provide a value "E", when the cell 328 includes a voltage between "F REF" and "G REF" it will provide a value "F", when the cell 328 includes a voltage between "G REF" and "H REF" it will provide a value "G", when the cell 328 includes a voltage over "H REF" it will provide a value "H". While not illustrated or described in detail herein, one of skill in the art in possession of the present disclosure will appreciate that each value A-H illustrated in FIG. 3D may be configured to store more than one bit depending on the amount of voltage that is provided to indicate that value (e.g., a first voltage level between "B REF" and "C REF" will provide a first set of bits for the value "B", a second voltage level between "B REF" and "C REF" will provide a second set of bits for the value "B", and so on).

As will be appreciated by one of skill in the art in possession of the present disclosure, different storage device manufacturers/providers may configure the NAND word-lines/NAND layers in NAND blocks differently, with some storage devices including NAND blocks with separate NAND wordlines, some storage devices including NAND blocks with NAND layers that each include a plurality of NAND wordlines, and some storage devices including NAND blocks with groups of NAND layers that each include a plurality of NAND wordlines. As such, with reference to FIG. 3E, the present disclosure abstracts the physical implementation of NAND wordlines and NAND layers into "NAND rows", with each NAND block 324 discussed in the examples below including a plurality of NAND rows 332. In other words, any one of the NAND rows 332 may include NAND wordline(s), NAND layer(s) each including a plurality of NAND wordlines, or group(s) of NAND layers that each include a plurality of NAND wordlines. As will be appreciated by one of skill in the art in possession of the present disclosure, the read disturb signatures discussed below may vary based on the design of the storage subsystem/storage device, as it may effect a NAND wordline or group of NAND wordlines, and thus the abstraction of the physical implementation of NAND wordlines into NAND rows is provided to simplify the discussion below while encompassing such different storage subsystem/storage device designs.

However, while the specific examples discussed above describes the storage device 300 as including the storage interface 318 that may be provided by a flash device interface and the storage subsystem 320 that is described as being provided by NAND devices (e.g., NAND flash devices), one of skill in the art in possession of the present disclosure will appreciate how the teachings of the present disclosure may benefit other storage technologies, and thus storage devices utilizing those other types of storage technologies are envisioned as falling within the scope of the present disclosure as well. Furthermore, while a specific example of cells that may store 8 values ("A"-"H" in the examples above) are provided, one of skill in the art in possession of the present disclosure will appreciate how the cells may store 2 values (e.g., "A"/"0" and "B"/"1"), 4 values (e.g., "A"/"00", "B"/"01", "C"/"10", and "D"/"11"), or more than 8 values while remaining within the scope of the present disclosure as well). Furthermore, one of skill in the art in possession of the present disclosure will appreciate how different NAND rows 332 in any particular NAND block 324 of the storage subsystem 302 may use different value encoding techniques (e.g., "A" and "B", "A"-"D", "A"-"H" in the examples above), and such mixed encoding NAND rows 332 will fall within the scope of the present disclosure.

In the illustrated embodiment, a power loss prevention system 334 is housed in the chassis 302 and coupled to the storage subsystem 320, and in specific examples may be provided by a Power Loss Prevention (PLP) capacitor and/or other power storage/provisioning subsystems that would be apparent to one of skill in the art in possession of the present disclosure. In the illustrated embodiments, the storage device processing system 304 is also coupled to an expansion bus 336 such as, for example, a Peripheral Component Interconnect express (PCIe) expansion bus that may provide the connection to the global read temperature identification engine 204, as well as to one or more storage device processing system peripherals 338. Furthermore, the expansion bus 336 may provide one or more connections for performing operations associated with the storage device 300 (e.g., connection(s) for reading/writing, connections for managing any of the data/information discussed below, etc.), and may also provide out-of-band interface(s), side channel interface(s), and/or other interfaces that provide access to the storage device processing system 304 for other systems. However, while a specific storage device 300 has been illustrated and described, one of skill in the art in possession of the present disclosure will recognize that storage devices (or other devices operating according to the teachings of the present disclosure in a manner similar to that described below for the storage device 300) may include a variety of components and/or component configurations for providing conventional storage device functionality, as well as the functionality discussed below, while remaining within the scope of the present disclosure as well.

Figure 4:
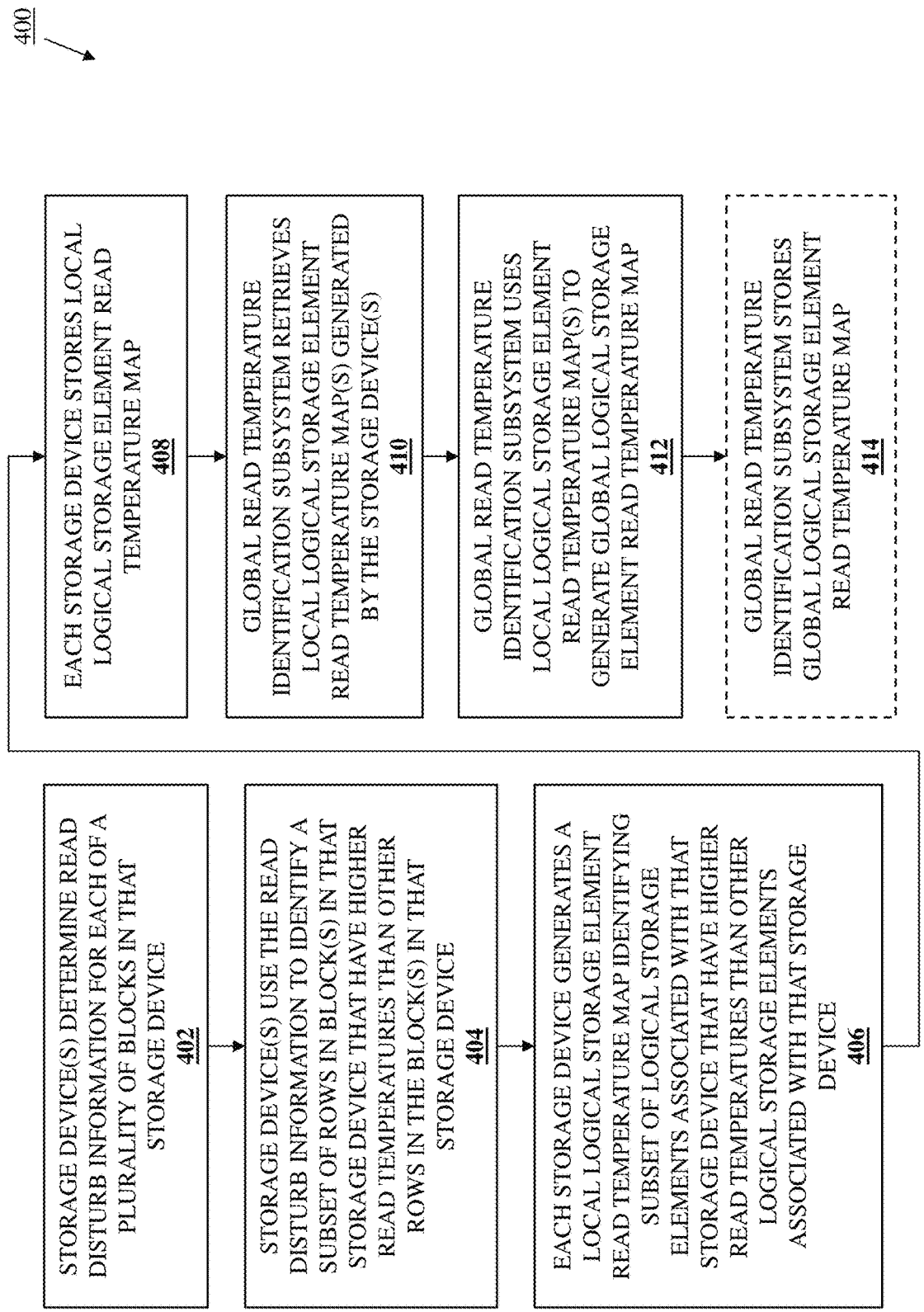
FIG. 4 is a flow chart illustrating an embodiment of a method for providing read-disturb-based read temperature identification.

Referring now to FIG. 4, an embodiment of a method 400 for providing read-disturb-based read temperature identification is illustrated. As discussed below, the systems and methods of the present disclosure utilize the read disturb effect that produces noise in adjacent NAND rows when any particular NAND row is read in order to identify NAND rows that are read more often than other NAND rows and thus have higher "read temperatures" than those other NAND rows. For example, the read-disturb-based read temperature identification system of the present disclosure may include storage device(s) that each determine read disturb information for each block in that storage device, use that read disturb information to identify a subset of rows in at least one block in that storage device that have a higher read temperature than the other rows in the at least one block in that storage device and, based on that identification, generate and store a local logical storage element read temperature map that identifies a subset of logical storage elements associated with that storage device that have a higher read temperature than the other logical storage elements associated with that storage device. A global read temperature identification subsystem coupled to the storage device(s) may then retrieve the local logical storage element read temperature map generated by each of the storage device(s) and use them to generate a global logical storage element read temperature map.

As such, the read disturb effect, which occurs automatically in response to conventional read operations and persists across power cycles, may be leveraged to generate read temperature maps for storage devices and storage systems, thus addressing many of the issues with conventional read temperature identification systems discussed above. As will be appreciated by one of skill in the art in possession of the present disclosure, the local logical storage element read temperature maps of the present disclosure are generated by the storage devices themselves (rather than the host processor/storage processor in the server device and/or storage system in which they are located), limiting read temperature identification operations performed by that host processor/storage processor to the utilization of those local logical storage element read temperature maps to generate a global logical storage element read temperature map in embodiments of the present disclosure. Furthermore, the local logical storage element read temperature maps of the present disclosure may be generated without any knowledge of the type of data being read, the application performing the read operation, or the workload being performed that resulted in the read operation.

The method 400 begins at block 402 where storage device(s) determine read disturb information for each of a plurality of blocks in that storage device. During or prior to the method 400, the computing device 200 may be utilized to write data to the storage devices 210a, 210b, and up to 210c in the storage system 208, and then read that data from those storage device(s). As will be appreciated by one of skill in the art in possession of the present disclosure, a simplified example of the writing of data to a NAND block in a storage device using the specific examples provided above includes a processing system in the computing device 200 (e.g., the processing system that provides the global read temperature identification engine 204) erasing all of the NAND rows in that NAND block to set each of their cells to the "A" value, and then selectively applying voltages across "vertical" bitlines in the NAND block and one or more "horizontal" NAND wordline(s) in NAND row(s) in that NAND block in order to cause the cells in those one or more NAND wordlines(s) to switch from the "A" value to a value indicated by a higher voltage in that cell (e.g., one of the values "B", "C", "D", "E", "F", "G", and "H" in the example above), resulting in each of those cells in the one or more NAND row(s) in that NAND block storing some number of electrons to provide one of the values "A" "B", "C", "D", "E", "F", "G", or "H" discussed above. As will be appreciated by one of skill in the art in possession of the present disclosure, the selective application of voltages discussed above may include no application of a voltage for a cell that is desired to have an "A" value.

Subsequently, data may be read from a NAND block by determining what values the cells in its NAND rows store. As will be appreciated by one of skill in the art in possession of the present disclosure, a simplified example of the reading of data from a first NAND row in a NAND block in a storage device includes a processing system in the computing device 200 (e.g., the processing system that provides the global read temperature identification engine 204) "selecting" the first NAND row by providing a voltage across the "vertical" bitlines in the NAND block, with the electrons stored in the cells in the first NAND row (i.e., to provide the values discussed above) operating to reduce the current that is sensed at the bottom of the "vertical" bitlines in the NAND block and that is produced in response to the applied voltage (with the sensing of that reduced current operating to identify particular values in the cells in the first NAND row). However, in order to prevent other second NAND rows in that NAND block that are not being read from effecting the current resulting from the voltage provided across the "vertical" bitlines in that NAND block (i.e., in order to ensure the effect on that current by the electrons stored in the cells of the first NAND row may be sensed as discussed above), those second NAND rows are "deselected" by providing a "bypass" voltage across each of those "horizontal" second NAND rows that forces its cell(s) to conduct current on the bitline.

As will be appreciated by one of skill in the art in possession of the present disclosure, the provisioning of that "bypass" voltage across each of the "horizontal" second NAND rows results in the "micro-programming" of those second NAND rows caused by electrons accumulating in those second NAND rows each time the first NAND row is read (i.e., due to the "bypass" voltage used to "deselect" them attracting electrons out of the bitline), which is referred to as the "read disturb effect" herein. Furthermore, one of skill in the art in possession of the present disclosure will appreciate how the read disturb effect/microprogramming/electron accumulation discussed above is higher in second NAND rows that are closer to the first NAND row being read, and the amount of read disturb effect/microprogramming/electron accumulation in NAND rows will depend on the type of SSD technology used in the SSD storage device.

As will be appreciated by one of skill in the art in possession of the present disclosure, while each NAND row includes many cells that may each identify multiple different values, any read of a NAND row operates to read all the cells in that NAND row and, as such, it is the read temperature of the NAND row that is of concern. Furthermore, while it is possible to read a portion of a NAND row (some subset of the NAND wordlines in that NAND row), that read operation will still apply a voltage to that entire NAND row in order to accomplish the read, thus introducing the same read disturb effect in that NAND row that would have occurred if the entire NAND row had been read.

Conventionally, the read disturb effect discussed above is considered a problem that must be corrected, as the microprogramming/electron accumulation in second NAND row (s) adjacent a first NAND row that is read often can cause a desired value in one or more of the cells in those second NAND row(s) to be mistakenly read as a different value, which one of skill in the art in possession of the present disclosure will appreciate results in a number of incorrect or "flipped" bits (i.e., bits that do not match their originally written value) that provide a "fail bit count" and must be corrected (e.g., using the error check portion 326b associated with the data portion 326a provided by the cell in the NAND wordline) to reverse the change in the value read for that cell in that NAND row. However, as discussed in further detail above, the inventors of the present disclosure have discovered that the read disturb effect may be leveraged in order to identify the read temperature of NAND rows in NAND blocks in a manner that eliminates many of the issues present in conventional read temperature identification systems.

As such, subsequent to the writing of data to the storage device(s) 210a-210c and the reading of that data from those storage device(s) 210a-210c, any or all of those storage device(s) 210a-210c/300 may operate at block 402 to determine read disturb information for each of the NAND blocks 324 included in the NAND die 322 in the storage subsystem 320 in that storage device. As will be appreciated by one of skill in the art in possession of the present disclosure, the discussion below of the determination of read disturb information by the storage device 300 may apply to any of the storage devices 210a-210c, and may be performed upon startup, reset, or other initialization of the storage device 300, periodically by the storage device during runtime, at the request of a user of the computing device 200, and/or on any other schedule or at any other time that would be apparent to one of skill in the art in possession of the present disclosure.

Figure 5A:
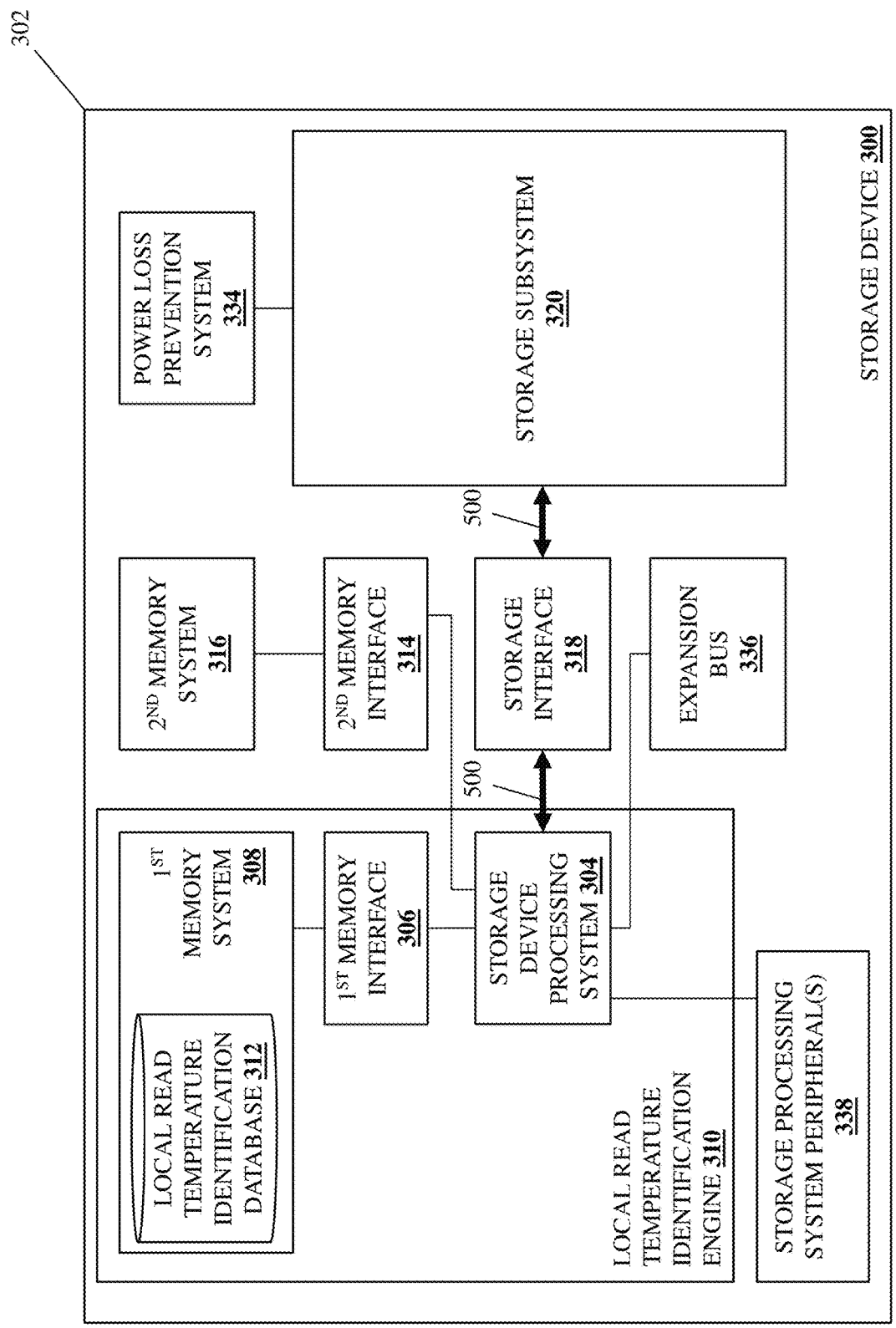
FIG. 5A is a schematic view illustrating an embodiment of the storage device of FIG. 3A operating during the method of FIG. 4.

With reference to FIG. 5A, in an embodiment of block 402, the storage device processing system 304 in the storage device 300 may perform read disturb information retrieval operations 506 that may include the storage device processing system 304 retrieving, via the storage interface 318, read disturb information associated with each of the NAND blocks 324 included in the NAND die 322 in the storage subsystem 320. As described in further detail below, the retrieval of read disturb information from physical storage may be accomplished by reading obsolete data along with valid data from physical storage locations, and in some embodiments may also include providing and utilizing error check portions (e.g., ECC data) for all data in that physical storage (e.g., including padding data and/or other data that is not conventionally written with error check portions). However, while specific techniques for retrieving read disturb information from physical storage locations are described in detail below, one of skill in the art in possession of the present disclosure will appreciate how read disturb information may be retrieved from physical storage in other manners that will fall within the scope of the present disclosure as well. Furthermore, while the retrieval of read disturb information from each of the NAND rows 332 in each of the NAND blocks 324 in the storage subsystem 320 is described, one of skill in the art in possession of the present disclosure will appreciate how the retrieval of read disturb information for a subset of NAND rows 332 in a subset of NAND blocks 324 in the storage subsystem 320 will fall within the scope of the present disclosure as well (e.g., when a previously "hot" subset of NAND rows in NAND block(s) are being checked to determine whether they are still "hot").

Figure 5B:
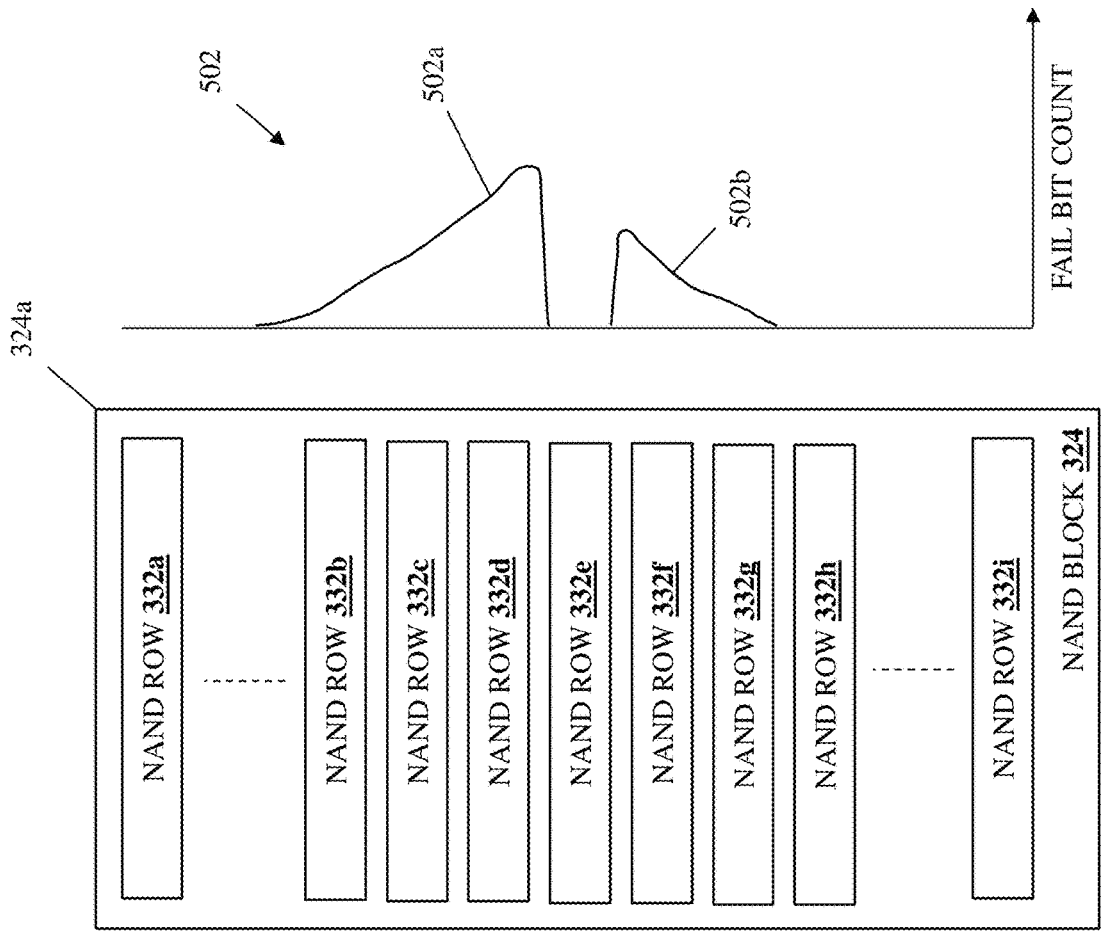
FIG. 5B is a schematic view illustrating an embodiment of a read disturb signature identified for the NAND rows in the NAND block of FIG. 3E during the method of FIG. 4.

For example, the read disturb information retrieval operations 506 performed at block 402 may include the storage device processing system 304 in the storage device 300 accessing each NAND block 324 to identify a read disturb "signature" for each of a plurality of NAND rows 332a-332i in that NAND block 324 that may be provided by fail bit counts in one or more adjacent NAND rows. With reference to FIG. 5B, a specific example of the read disturb information for the NAND row 332e in a NAND block 324 is provided, and illustrates a read disturb signature 502 provided by fail bit counts for some of the NAND rows 332a-332d and 332f-332i.

In particular, the read disturb signature 502 illustrated in FIG. 5B includes a fail bit count portion 502a associated with the NAND rows 332a-332e on a "first side" of the NAND row 332e, and a fail bit count portion 502b associated with the NAND rows 332f-332i on a "second side" of the NAND row 332e. As will be appreciated by one of skill in the art in possession of the present disclosure, the distribution of the read disturb signature 502 provides a histogram across all the cells in NAND wordlines of the NAND rows (e.g., with some cells in the NAND wordline(s) in the NAND row 332f relatively more effected by the read disturb effect than other cells in that NAND wordlines in that NAND row 332f), with all of the NAND wordlines in the NAND rows impacted by the read disturb effect to some extent (i.e., due to electron accumulation prior to the attenuation effects discussed above). However, while a particular example is provided, one of skill in the art in possession of the present disclosure will appreciate that other storage subsystem technologies (e.g., SCM storage devices, Dual Data Rate (DDR) storage devices, etc.) provide similar effects (e.g., DDR storage devices experience a "row hammer" effect) that will fall within the scope of the present disclosure as well. As will be appreciated by one of skill in the art in possession of the present disclosure, the fail bit count portion 502a illustrates how the NAND row 332d experiences a higher fail bit count than the NAND row 332c, which experiences a higher fail bit count than the NAND row 332b, and so on due to their relative proximity to the NAND row 332e. Similarly, the fail bit count portion 502b illustrates how the NAND row 332f experiences a higher fail bit count than the NAND row 332g, which experiences a higher fail bit count than the NAND row 332h, and so on due to their relative proximity to the NAND row 332e.

Furthermore, the fail bit count portions 502a and 502b also illustrate how the NAND row 332d experiences a higher fail bit count than the NAND row 332f due to the NAND row 332d seeing the "full" current resulting from the voltage applied to the "vertical" bitlines in the NAND block when performing a read of the NAND row 332e relative to the current that is attenuated by the charge in the cell of the NAND row 332e (e.g., if the charge in the cell(s) of a NAND row provides a relatively low voltage value (e.g., the "A" value discussed below), the "downstream" NAND rows will see relatively more electrons than the "upstream" NAND rows, while if the charge in the cell(s) of a NAND row provides a relatively high voltage value (e.g., the "H" value discussed below), the "downstream" NAND rows will see relatively less electrons than the "upstream" NAND rows).

Figure 5C:
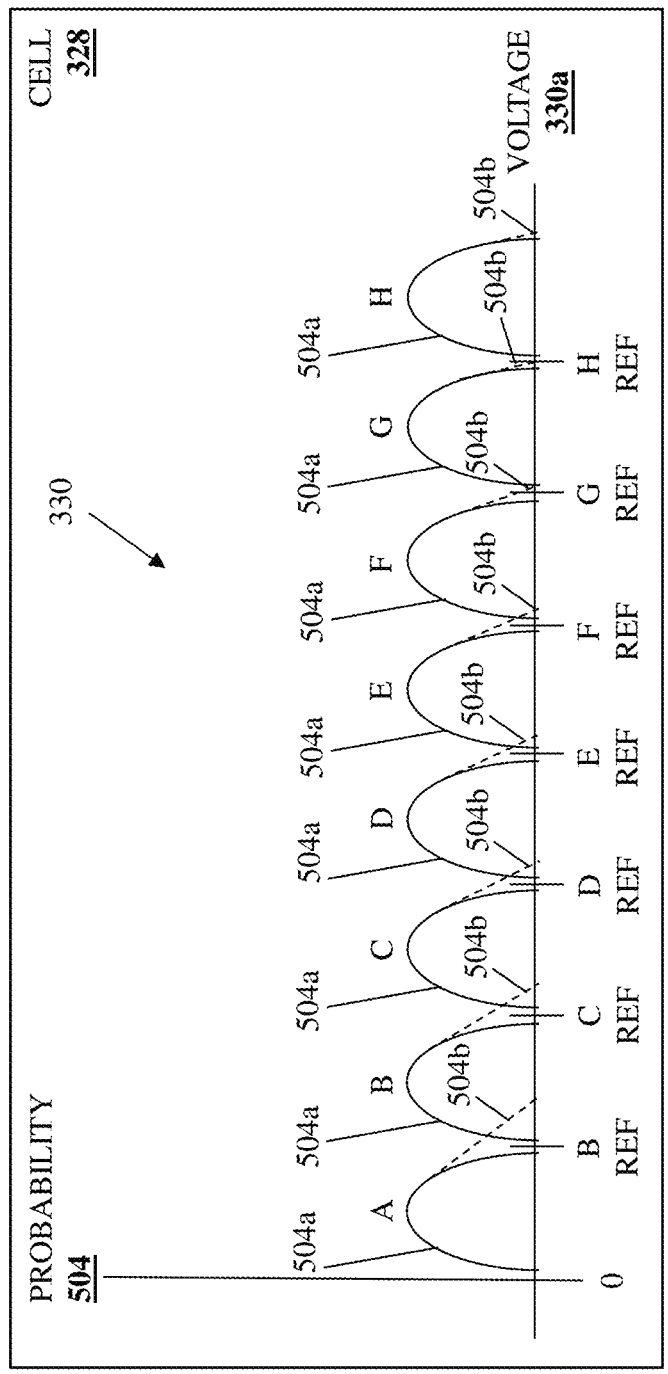
FIG. 5C is a graph view illustrating an embodiment of voltage skewing in a cell that provides a portion of the read disturb signature of FIG. 5B during the method of FIG. 4.

With reference to FIG. 5C, the simplified representation from FIG. 3D of how data may be stored in a cell 328 is reproduced, but with the data storage representation of the cell 328 in FIG. 5C including the graph 330 with voltage 330a on the X-axis and probability 504 on the Y-axis. The graph 330 in FIG. 5C also includes voltage/value probabilities 504a (provided in solid lines) for each value "A"-"H" available in the cell 328 that, as can be seen, is highest in the middle of the voltage range for each value "A"-"H", and reduces to near-zero near the bounds of the voltage range for each value "A"-"H" (e.g., the voltage/value probability for the value "A" is highest midway between "0" and "B REF" and reduces to near-zero at both "0" and "B REF", the voltage/value probability for the value "B" is highest midway between "B REF" and "C REF" and reduces to near-zero at both "B REF" and "C REF", and so on).

As will be appreciated by one of skill in the art in possession of the present disclosure, the cell 328 associated with the graph 330 in FIG. 5C has experienced the read disturb effect (e.g., it is a cell in one of the NAND rows 332b-d, 332f, or 332g in FIG. 5B), and the graph 330 illustrates a read disturb effect skew 504b (provided in dashed lines) that illustrates how the read disturb effect skews the voltage/value probabilities 504a for each value "A"-"H" available in the cell 328. As discussed above, after a plurality of reads to an adjacent NAND row (e.g., the NAND row 332e) that causes the accumulation of charge in a particular NAND row (e.g., the NAND row 332d), a desired value in some cells may be mistakenly read as a different value due to the voltage in those cells crossing the reference voltage that defines that different value.

For example, FIG. 5C illustrates how the accumulation of charge in the NAND row 332d may introduce the read disturb effect skew 504b for one or more of the values "A"-"H" that can cause at least a portion of the voltage/value probabilities 504a for those values to shift across the reference voltage for an adjacent value. As can be seen in FIG. 5C, the read disturb effect skew 504b to the voltage/value probability 504a for the value "A" causes that voltage/value probability 504a to skew past the B REF, and thus some reads of voltages in the cell 328 that are desired to provide the value "A" will instead mistakenly provide the value "B" (i.e., due to the actual voltage read being between the B REF and the C REF because it was "pushed" in that "direction" due to the read disturb effect). Furthermore, while a single example is provided, one of skill in the art in possession of the present disclosure will appreciate how the read disturb effect skew 504b to the voltage/value probability 504a for any of the values "B"-"H" can result in the identification of a mistaken value in a similarly manner.

One of skill in the art in possession of the present disclosure will recognize how conventional systems (e.g., SSD storage device firmware and controllers) may utilize software to shift the reference voltages for one or more values in a cell to compensate for this read disturb effect. However, at block 402, the storage device processing system 304 may instead identify this read disturb information for each NAND row in each of a plurality of NAND blocks 324 in its storage device 300, and one of skill in the art in possession of the present disclosure will appreciate how the read disturb signature for each of those NAND rows will differ depending on whether that NAND row has been read a relatively higher number of times (in which case its read disturb signature will include relatively high fail bit counts for its adjacent NAND rows), whether that NAND row has been read a relatively lower number of times (in which case its read disturb signature will include relatively lower fail bit counts for its adjacent NAND rows), whether that NAND row has been read a relatively intermediate number of times (in which case its read disturb signature will include relatively intermediate fail bit counts for its adjacent NAND rows), etc.

Techniques for using fail bit counts that provide read disturb signatures in order to determine read disturb information are described by the inventors of the present disclosure in more detail in U.S. patent application Ser. No. 17/581,882, filed Jan. 22, 2022; and U.S. patent application Ser. No. 17/581,896, filed Jan. 22, 2022; the disclosures of which are incorporated by reference herein in their entirety. However, one of skill in the art in possession of the present disclosure will appreciate that other techniques may be utilized to determine read disturb information while remaining within the scope of the present disclosure. For example, the inventors of the present disclosure have developed techniques for determining read disturb information without the need to explicitly identify failed bit counts, which are described in U.S. patent application Ser. No. 17/581,879, filed Jan. 22, 2022, the disclosure of which is incorporated by reference herein in its entirety.

Figure 5D:
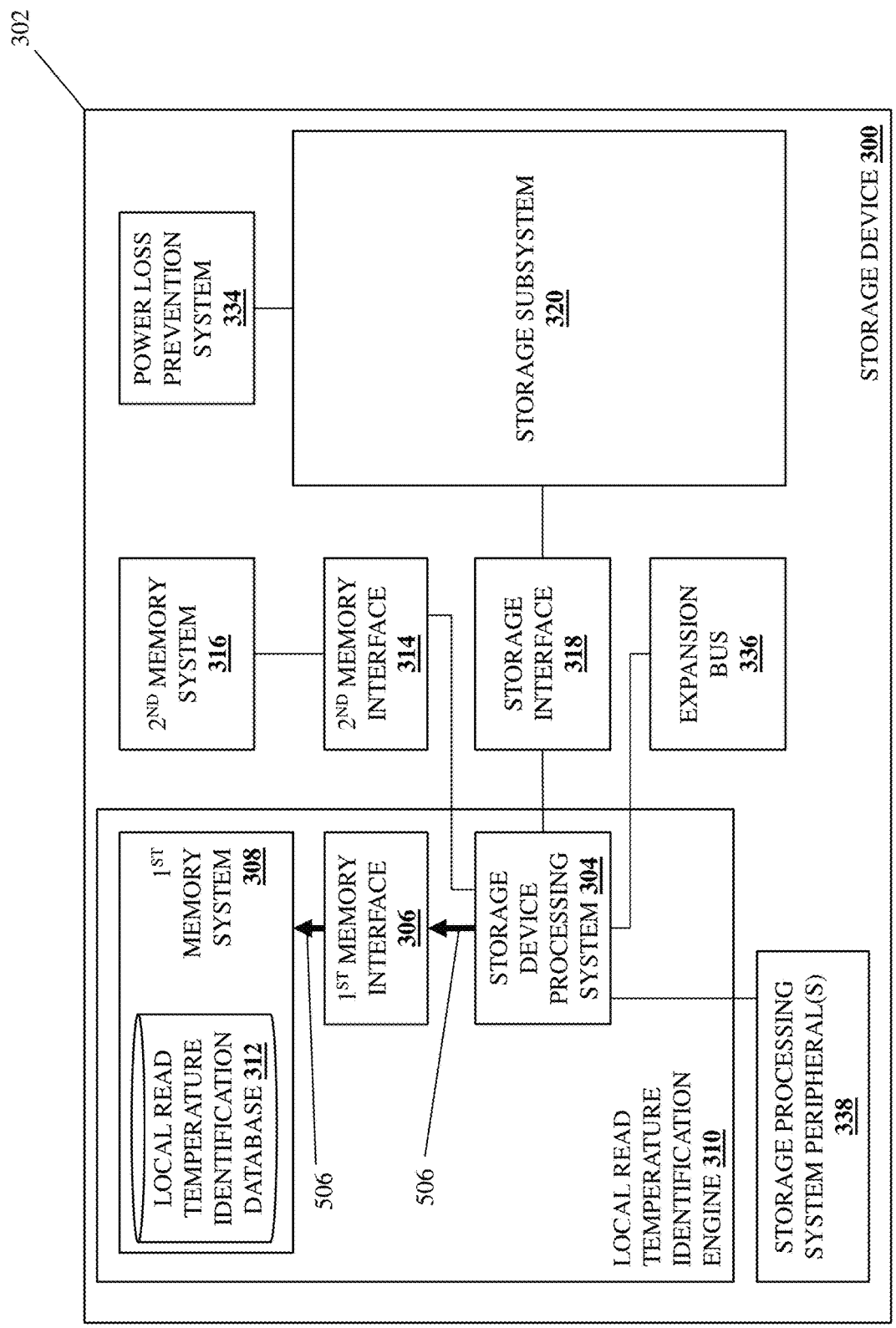
FIG. 5D is a schematic view illustrating an embodiment of the storage device of FIG. 3A operating during the method of FIG. 4.

With reference to FIG. 5D, the storage device processing system 304 may then perform read disturb information storage operations 506 that include accessing the first memory system 308 vis the first memory interface 306 and storing the read disturb information in the local read temperature identification database 312. As such, following block 402, each of the storage devices 210a-210c/300 in the computing device 200 may have determined and stored read disturb information for each NAND row 332a-332i included in each of its NAND blocks 324 provided by each of its NAND dies 322 in its storage subsystem 320.

In some embodiments, at block 402 and prior to or subsequent to storing the read disturb information in the local read temperature identification database 312, the storage device processing system 304 in the storage device 300 may perform read disturb information isolation operations in order to isolate data in the read disturb information determined for each NAND row 332a-332i included in each of its NAND blocks 324 provided by each of its NAND dies 322 in its storage subsystem 320. The inventors of the present disclosure have developed several techniques for isolating read disturb information that are described in U.S. patent application Ser. No. 17/578,694, filed Jan. 19, 2022, the disclosure of which is incorporated by reference herein in its entirety. As described in those patent documents, the read disturb information determined at block 402 by the storage device processing system 304 for each NAND row 332a-332i included in each of its NAND blocks 324 provided by each of its NAND dies 322 in its storage subsystem 320 may include "noise" and/or other information artifacts that are not indicative of the read disturb effect, and thus different isolation techniques may be performed on the read disturb information in order to allow the storage device processing system 304 to more accurately characterized the read disturb effect for each NAND row 332a-332i included in each of its NAND blocks 324 provided by each of its NAND dies 322 in its storage subsystem 320. As such, in some embodiments, the read disturb information stored in the local read temperature identification database 312 in each storage device 210a-210c/300 may be isolated read disturb information.

Figure 6:
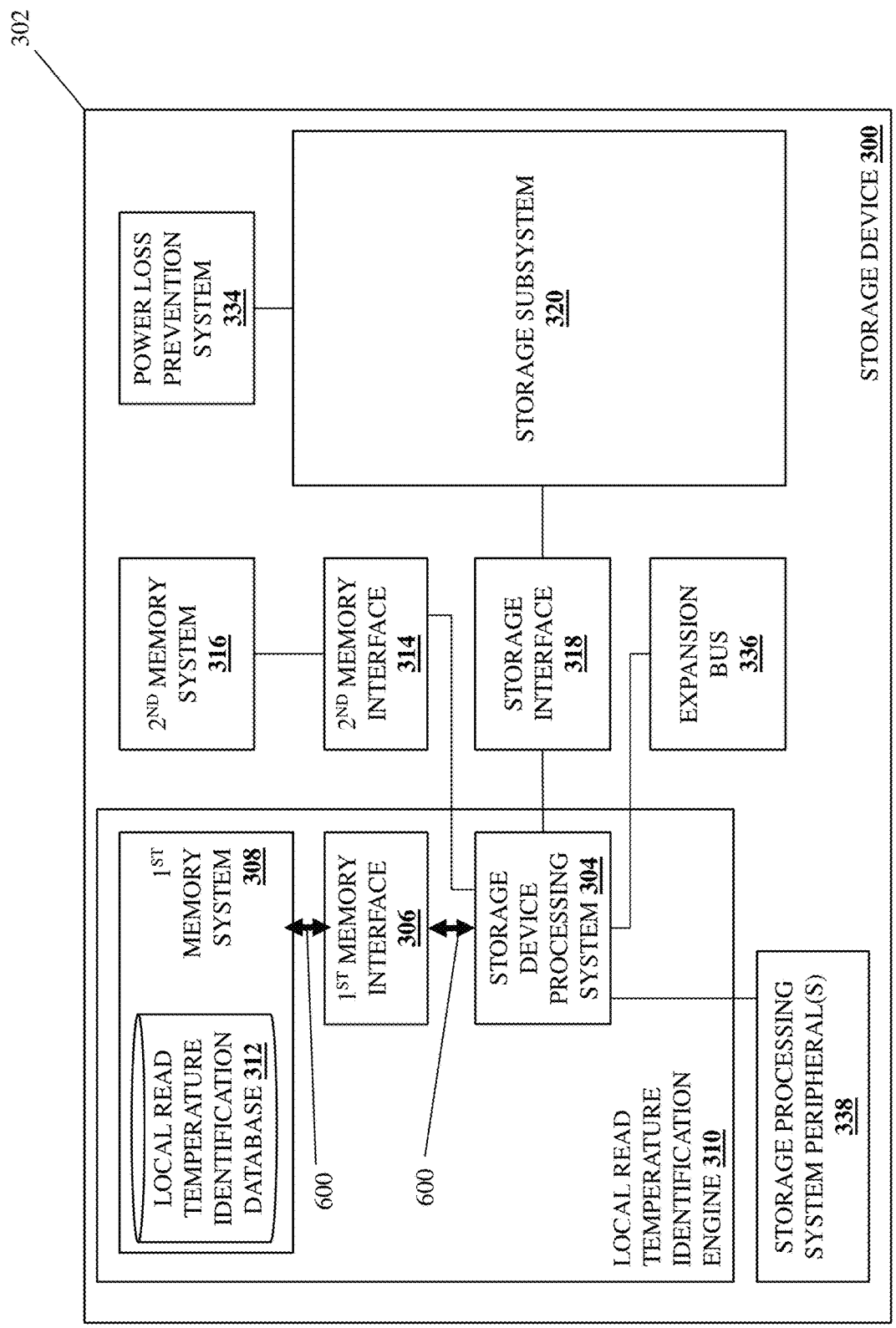
FIG. 6 is a schematic view illustrating an embodiment of the storage device of FIG. 3A operating during the method of FIG. 4.

The method 400 then proceeds to block 404 where the storage device(s) use the read disturb information to identify a subset of rows in block(s) in that storage device that have higher read temperatures than other rows in the block(s) in that storage device. With reference to FIG. 6, in an embodiment of block 404, the storage device processing system 304 may perform read temperature identification operations 600 that may include accessing the read disturb information stored in the local read temperature identification database 312 (e.g., via the first memory interface 306 and the first memory system 308), and identifying relative read temperatures of each NAND row 332a-332i included in each of its NAND blocks 324 provided by each of its NAND dies 322 in its storage subsystem 320. However, while the read temperature information is described as being stored in the local read temperature identification database 312 prior to being accessed and used to identify relative read temperatures of NAND rows, one of skill in the art in possession of the present disclosure will recognize that the read temperature information may be used to identify relative read temperatures of NAND rows upon its collection and without storing it in the local read temperature identification database 312 (e.g., relative read temperatures of NAND rows may be identified "on the fly" as read disturb information is collected at block 402) while remaining within the scope of the present disclosure as well.

As discussed above, the read disturb signature determined for each NAND row will differ depending on whether that NAND row has been read a relatively higher number of times, whether that NAND row has been read a relatively lower number of times, whether that NAND row has been read a relatively intermediate number of times, etc. Furthermore, one of skill in the art in possession of the present disclosure will appreciate how NAND rows that have been read a relatively higher number of times may be identified as having a relatively high read temperature, NAND rows that have been read a relatively lower number of times have be identified as having a relatively low read temperature, NAND rows that have been read a relatively intermediate number of times may be identified as having a relatively intermediate temperature, and so on.

As such, in some embodiments of block 404, the storage device processing system 304 may analyze each read disturb signature determined for each NAND row 328a-328i included in each of its NAND blocks 324 provided by each of its NAND dies 322 in its storage subsystem 320, and determine whether that read disturb signature identifies a relatively high read temperature (e.g., because the NAND rows adjacent the NAND row for which that read disturb signature was generated experienced relatively high fail bit counts), whether that read disturb signature identifies a relatively low read temperature (e.g., because the NAND rows adjacent the NAND row for which that read disturb signature was generated experienced relatively low fail bit counts), whether that read disturb signature identifies a relatively intermediate read temperature (e.g., because the NAND rows adjacent the NAND row for which that read disturb signature was generated experiences relatively intermediate fail bit counts), and/or whether that read disturb signature identifies other read temperature granularities that are distinguishable from the relatively high read temperature, the relatively low read temperature, and the relatively intermediate read temperature discussed above.

Furthermore, in some embodiments of block 404, the storage device 300 may operate to process current and previously determined read disturb information for a NAND row in order to generate a read temperature for that NAND row, and the inventors of the present disclosure describe techniques for storage devices to generate read temperature in U.S. patent application Ser. No. 17/580,359, filed Jan. 20, 2022; U.S. patent application Ser. No. 17/580,756, filed Jan. 21, 2022; and U.S. patent application Ser. No. 17/580,888, filed Jan. 21, 2022; the disclosures of which are incorporated by reference herein in their entirety.

As will be appreciated by one of skill in the art in possession of the present disclosure, any relative read temperature metrics may be assigned to the relatively high read temperature, relatively low read temperature, relatively intermediate read temperature, and so on, in order to indicate the different read temperatures for each of the NAND rows. For example, the NAND row read temperatures identified as discussed above using NAND row read disturb signatures may not provide exact numerical read temperatures (e.g., as may be provided in conventional read temperature identification systems may operate to record the exact number of reads of a NAND row), but the inventors of the present disclosure have found that the use of the NAND row read disturb signatures to provide NAND row read temperatures as discussed above provide for the accurate identification of relative temperatures of the different NAND rows in a storage subsystem. Furthermore, as read disturb signature analysis becomes more accurate in the future, the inventors of the present disclosure expect that any particular read disturb signature may then be associated with a number of reads of a NAND row, and thus envision doing so while remaining within the scope of the present disclosure as well.

While the embodiments discussed below describe the use of the read temperature determined as described above to generate a local logical storage element read temperature map, the inventors of the present disclosure have developed techniques for storage devices to identify and use read temperatures based on the read disturb effect to move data without the need to generate a local logical storage element read temperature map that are described in U.S. patent application Ser. No. 17/579,654, filed Jan. 20, 2022, the disclosure of which is incorporated by reference herein in its entirety.

The method 400 then proceeds to block 406 where each of the storage device(s) generate a local logical storage element read temperature map identifying a subset of logical storage elements that are associated with that storage device and that have higher read temperatures than other logical storage elements associated with that storage device, as well as to block 408 where the storage device(s) store the local logical storage element read temperature map generated by that storage device. As described in further detail below, in some embodiments local logical storage element read temperature maps may be generated by mapping read temperatures identified for physical storage to a logical identifier (e.g., via a "reverse lookup", as opposed to "forward lookups" via a logical-to-physical mapping). Furthermore, as also described in further detail below, in some embodiments previous read temperatures mapped to logical storage element(s) in logical-to-physical mappings may be maintained when current read temperatures are identified by mapping the current read temperatures to the logical storage element(s) along with the historical read temperature(s) that were previously mapped to the new storage element(s) in the logical-to-physical mappings, which allows a history of read temperature(s) of any logical storage element to be identified, and may provide particular benefits when data is moved between physical storage locations (i.e., when that data is written from a previous physical storage location to a new physical storage location, and both of those physical storage locations are mapped to particular logical storage element(s)) because it allows the read temperature associated with that data to follow that data as it is moved between physical storage locations.

In an embodiment, at block 406, the storage device processing system 304 in the storage device 300 may generate a local logical storage element read temperature map using the relative read temperatures identified for each NAND row 332a-332i included in each of its NAND blocks 324 provided by each of its NAND dies 322 in its storage subsystem 320 at block 404. In an embodiment, the storage device 300 may utilize Logical Block Addressing (LBA), which one of skill in the art in possession of the present disclosure will recognize logically divides the storage subsystem 320 into logical storage elements (e.g., 512 byte to 4096 byte sectors), with the first logical storage element identified as logical block 0, the second logical storage element identified as logical block 1, and so on, and with each logical storage element mapped to a respective NAND row 332a-332i included in the NAND blocks 324 provided by the NAND dies 322 in the storage subsystem 320.

As such, block 406 may include the storage device processing system 304 mapping, in a local logical storage element read temperature map, the read temperature determined for each NAND row at block 404 to the logical storage element that is mapped to that NAND row. Thus, continuing with the example provided above, a read temperature identified for a first NAND row may be mapped, in the local logical storage element read temperature map, to an LBA block 0 that is mapped to the first NAND row; a read temperature identified for a second NAND row may be mapped, in the local logical storage element read temperature map, to an LBA block 1 that is mapped to the second NAND row; a read temperature identified for a third NAND row may be mapped, in the local logical storage element read temperature map, to an LBA block 2 that is mapped to the third NAND row; and so on until a read temperature is mapped to each of the LBA blocks.

In a specific example, any NAND row may be mapped to one or more logical storage elements, and in the event a NAND row has a particular read temperature, each logical storage element mapped to that NAND row will have that particular read temperature. As such, the present disclosure may provide read temperature granularity at the NAND row level. Furthermore, while most storage device implementations today map logical blocks to NAND rows such that each logical block is fully contained within that NAND row, one of skill in the art in possession of the present disclosure will appreciate that a logical block may "straddle" multiple NAND rows, and in such cases read temperatures of that logical block may be computed by combining the read temperatures determined for those multiple NAND rows using any of variety of techniques that would be apparent to one of skill in the art in possession of the present disclosure. Thus, following block 406, each of the storage devices 210a-210c/300 may have generated a respective local logical storage element read temperature map, and at block 408 each of the storage devices 210a-210c/300 may have stored that local logical storage element read temperature map in its local read temperature identification database 312.

Figure 7A:
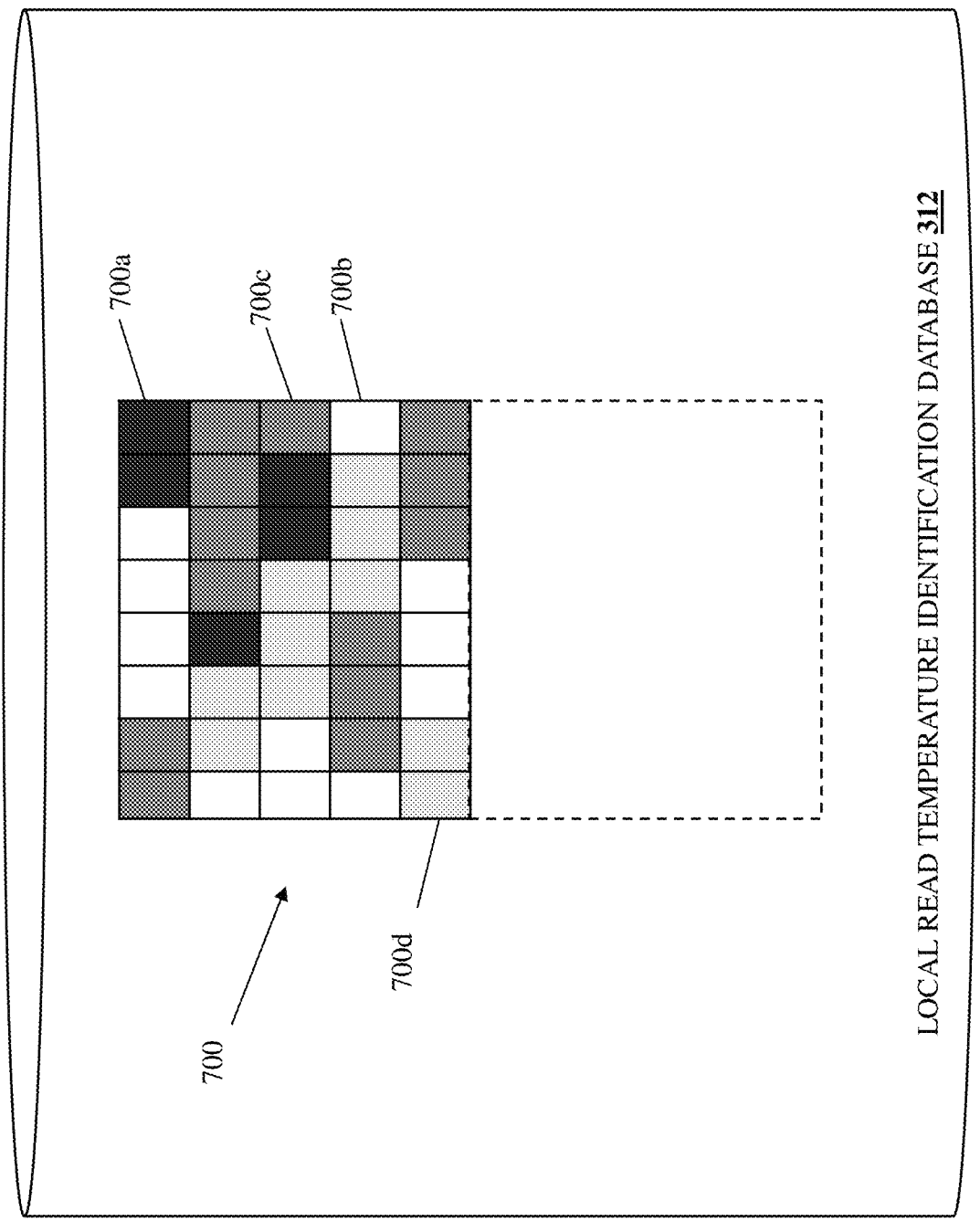
FIG. 7A is a schematic view illustrating an embodiment of local logical storage element read temperature map generated by a first storage device in the computing device of FIG. 2 during the method of FIG. 4.

With reference to FIG. 7A, an example of a local logical storage element read temperature map 700 is illustrated that may have been generated and stored by a first of the storage devices 210a-210c/300 in its local read temperature identification database 312. In the illustrated example, the local logical storage element read temperature map 700 includes relatively high read temperature logical storage elements 700a (illustrated as black boxes in the local logical storage element read temperature map 700), relatively low read temperature logical storage elements 700b (illustrated as white boxes in the local logical storage element read temperature map 700), relatively high-intermediate read temperature logical storage elements 700c (illustrated as dark grey boxes in the local logical storage element read temperature map 700), and relatively low-intermediate read temperature logical storage elements 700d (illustrated as light grey boxes in the local logical storage element read temperature map 700). However, one of skill in the art in possession of the present disclosure will recognize that the inclusion of other levels of read temperature granularity in local logical storage element read temperature maps will fall within the scope of the present disclosure as well. As will be appreciated by one of skill in the art in possession of the present disclosure, the dashed line in FIG. 7A is provided to indicate that the local logical storage element read temperature map 700 is one of a plurality of local logical storage element read temperature maps that provide the total logical storage space for the computing device 200.

Figure 7B:
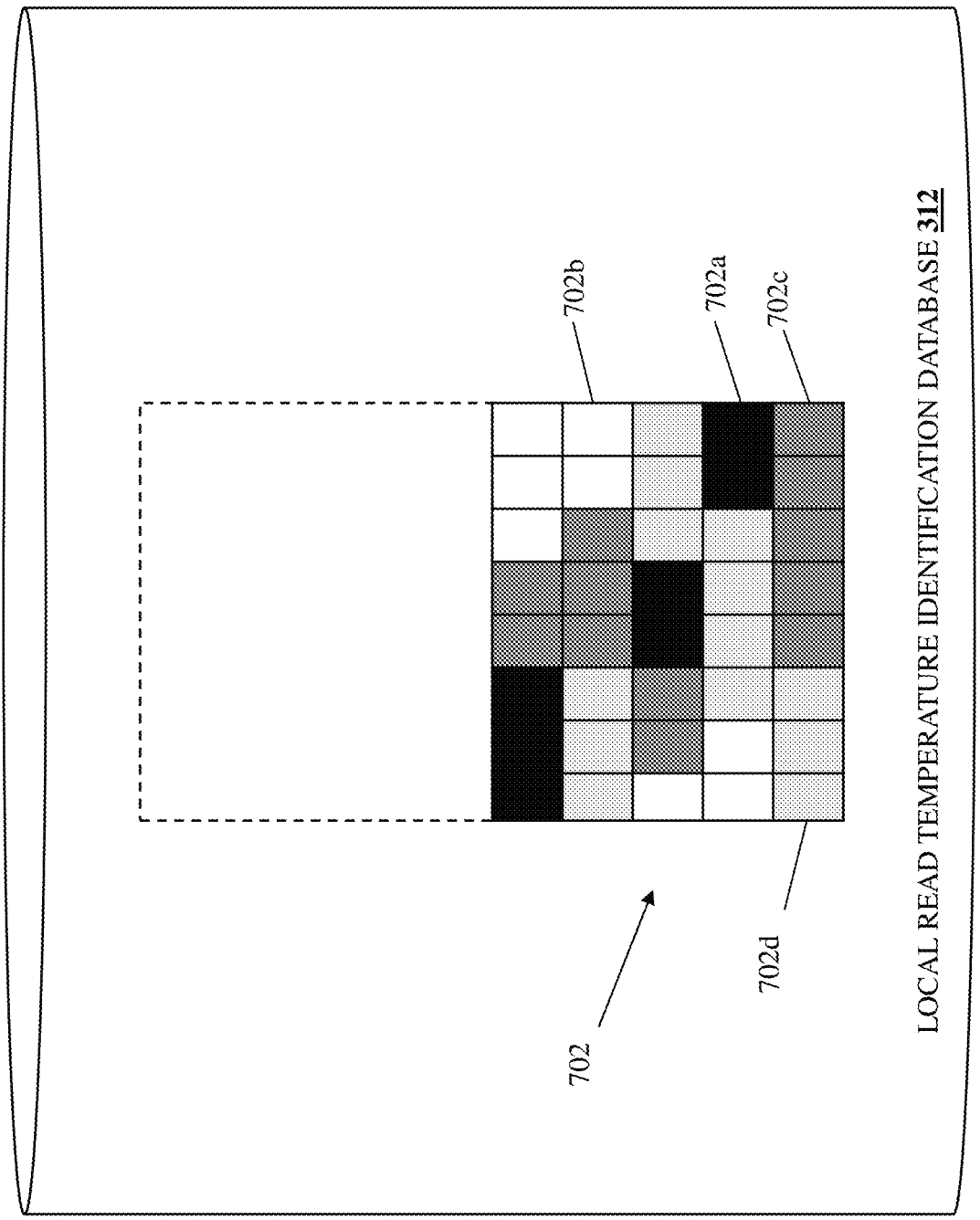
FIG. 7B is a schematic view illustrating an embodiment of local logical storage element read temperature map generated by a second storage device in the computing device of FIG. 2 during the method of FIG. 4.

With reference to FIG. 7B, an example of a local logical storage element read temperature map 702 is illustrated that may have been generated and stored by a second of the storage devices 210a-210c/300 in its local read temperature identification database 312. In the illustrated example, the local logical storage element read temperature map 702 includes relatively high read temperature logical storage elements 702a (illustrated as black boxes in the local logical storage element read temperature map 702), relatively low read temperature logical storage elements 702b (illustrated as white boxes in the local logical storage element read temperature map 702), relatively high-intermediate read temperature logical storage elements 702c (illustrated as dark grey boxes in the local logical storage element read temperature map 70), and relatively low-intermediate read temperature logical storage elements 702d (illustrated as light grey boxes in the local logical storage element read temperature map 702). However, one of skill in the art in possession of the present disclosure will recognize that the inclusion of other levels of read temperature granularity in local logical storage element read temperature maps will fall within the scope of the present disclosure as well. As will be appreciated by one of skill in the art in possession of the present disclosure, the dashed line in FIG. 7B is provided to indicate that the local logical storage element read temperature map 702 is one of a plurality of local logical storage element read temperature maps that provide the total logical storage space for the computing device 200. Furthermore, while examples of only two local logical storage element read temperature maps 700 and 702 generated by two storage devices are provided, one of skill in the art in possession of the present disclosure will appreciate that storage systems may include many more storage devices, and each of those storage devices may generate a local logical storage element read temperature map while remaining within the scope of the present disclosure as well.

While the embodiments discussed below describe the use of local logical storage element read temperature maps from different storage devices to generate a global logical storage element read temperature map, the inventors of the present disclosure have developed techniques for storage devices to use their local logical storage element read temperature map to move data that are described in U.S. patent application Ser. No. 17/579,689, filed Jan. 20, 2022, the disclosure of which is incorporated by reference herein in its entirety. Furthermore, the global read temperature identification engine 204 (or other host subsystem in the computing device 200) may operate to adjust read temperatures included in the local logical storage element read temperature map based on data characteristics of the data stored in corresponding logical storage elements, and the inventors of the present disclosure describe techniques for host subsystem read temperature adjustments in U.S. patent application Ser. No. 17/580,756, filed Jan. 21, 2022; and U.S. patent application Ser. No. 17/580,888, filed Jan. 21, 2022; the disclosures of which are incorporated by reference herein in their entirety.

Figure 8A:
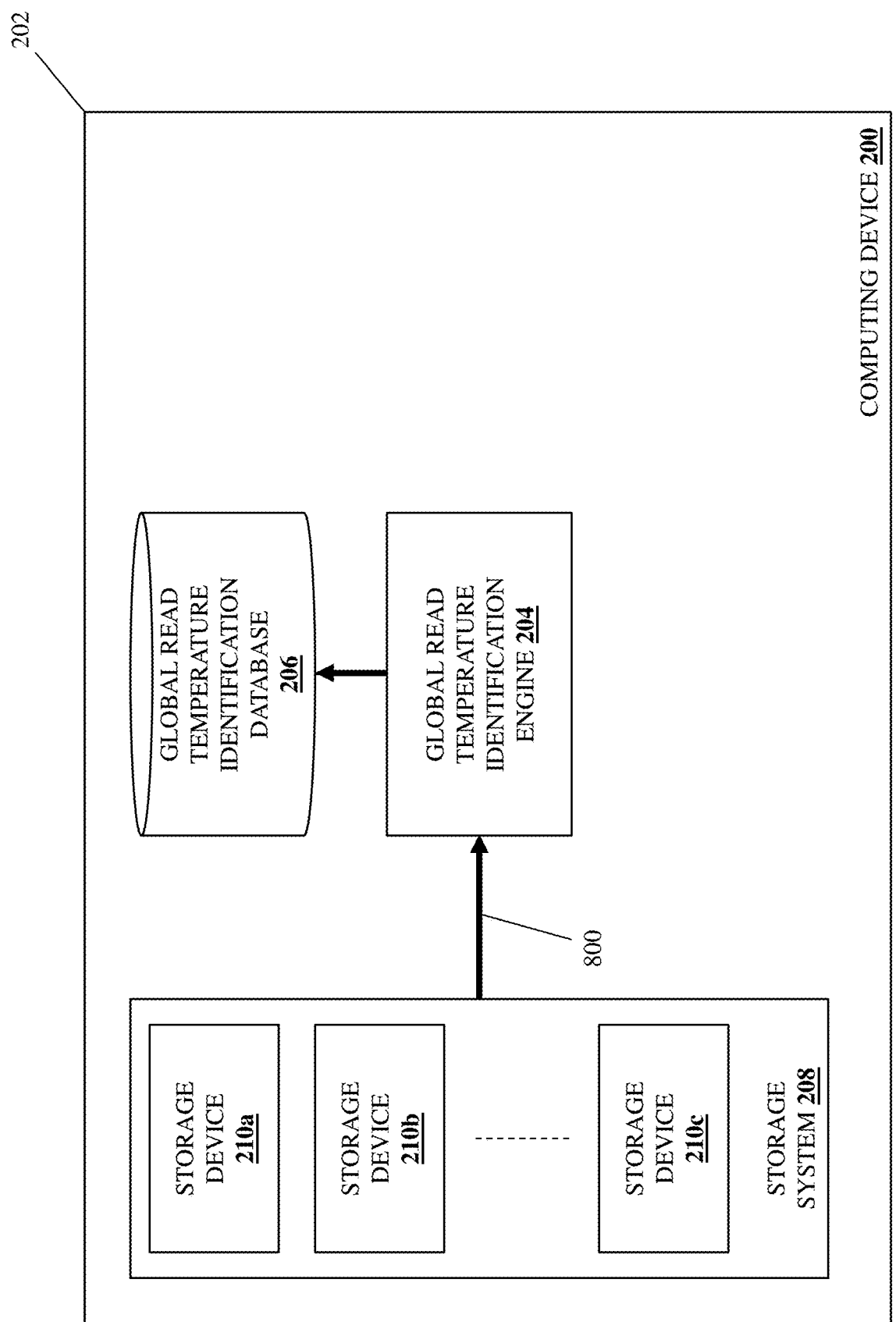
FIG. 8A is a schematic view illustrating an embodiment of the computing device of FIG. 2 operating during the method of FIG. 4.

The method 400 then proceeds to block 410 where a global read temperature identification subsystem retrieves the local logical storage element read temperature map(s) generated by the storage device(s). With reference to FIG. 8A, in an embodiment of block 410, the global read temperature identification engine 204 in the computing device 200 may perform local logical storage element read temperature map retrieval operations 800 in order to retrieve the local logical storage element read temperature maps generated and stored by the storage devices 210a, 210b, and up to 210c at blocks 406 and 408. The inventors of the present disclosure have developed several techniques for accessing and utilizing local logical storage element read temperature maps, information provided therein, and/or associated information, which are described in U.S. patent application Ser. No. 17/579,282, filed Jan. 19, 2022; and U.S. patent application Ser. No. 17/579,020, filed Jan. 19, 2022; the disclosures of which are incorporated by reference herein in their entirety.

As will be appreciated by one of skill in the art in possession of the present disclosure, in some examples the global read temperature identification engine 204 in the computing device 200 may access the local read temperature identification databases 312 in the first memory system 308 in each of the storage devices 210a-210c/300 in order to retrieve the local logical storage element read temperature maps stored therein, while in other embodiments the global read temperature identification engine 204 in the computing device 200 may provide requests for those local logical storage element read temperature maps such that each of the storage devices 210a-210c/300 transmit them to the global read temperature identification engine 204.

Figure 8B:
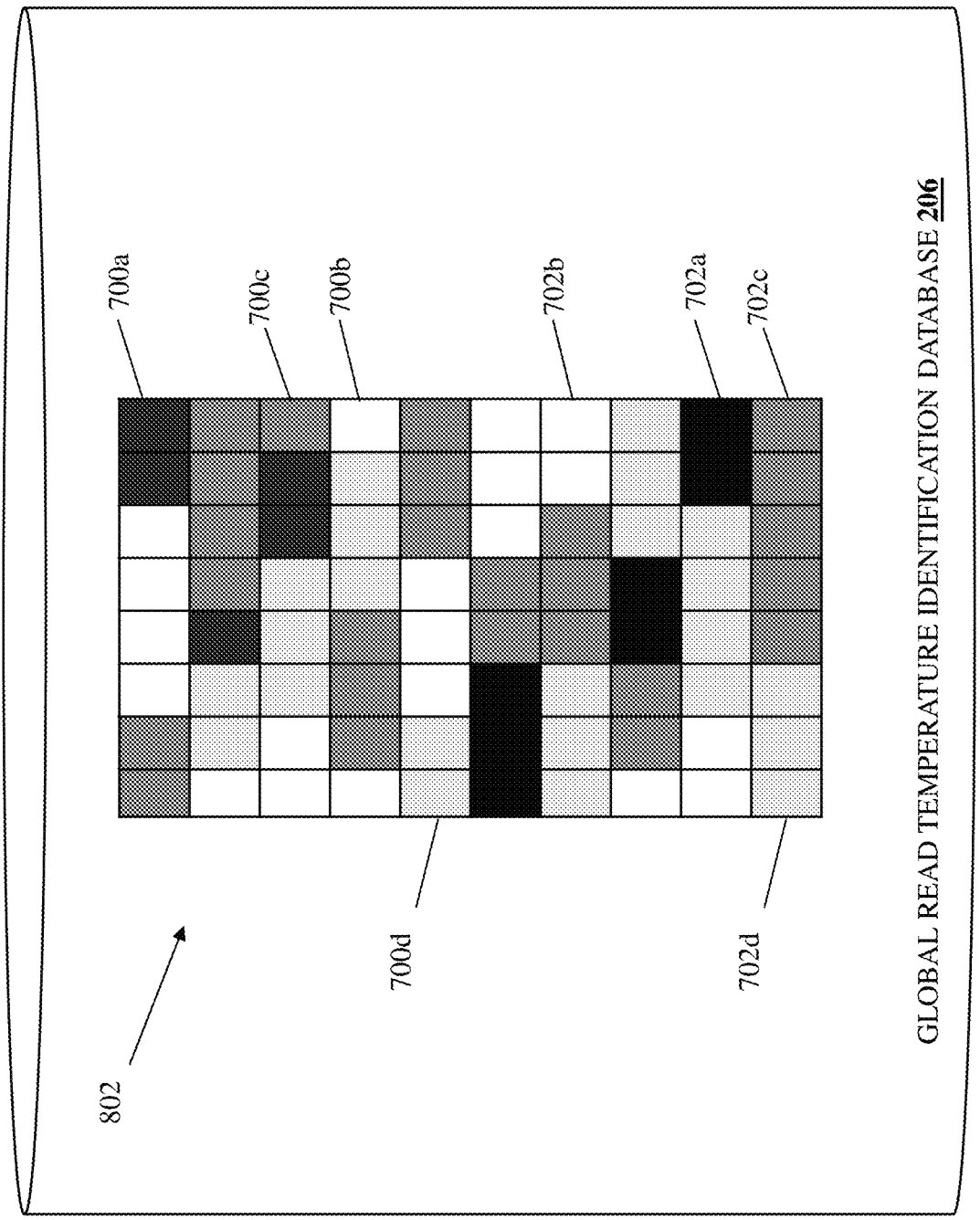
FIG. 8B is a schematic view illustrating an embodiment of global logical storage element read temperature map generated by the computing device of FIG. 2 during the method of FIG. 4.

The method 400 then proceeds to block 412 where the global read temperature identification subsystem uses the local logical storage element read temperature map(s) to generate a global logical storage element read temperature map, as well as to optional block 414 where the global read temperature identification subsystem stores the global logical storage element read temperature map. In some embodiment, at block 412, the global read temperature identification engine 204 in the computing device 200 may concatenate the local logical storage element read temperature maps retrieved from the storage devices 210a-210c/300 to generate a global logical storage element read temperature map that it then stores in the global read temperature identification database 206. For example, FIG. 8B illustrates an example of a global logical storage element read temperature map 802 that may have been generated by the global read temperature identification engine 204 via concatenation of the local logical storage element read temperature maps 700 and 702 discussed above with reference to FIGS. 7A and 7B, and then stored by the global read temperature identification engine 204 in its global read temperature identification database 312.

However, one of skill in the art in possession of the present disclosure will appreciate how the generation of a global logical storage element read temperature map via concatenation of local logical storage element read temperature maps provides a simplified example of the use of local logical storage element read temperature maps to generate a global logical storage element read temperature map, and that the local logical storage element read temperature maps discussed above may be utilized to generate the global logical storage element read temperature map in other manners that will fall within the scope of the present disclosure as well. For example, the generation of the global logical storage element read temperature map using the local logical storage element read temperature maps may depend on how the global read temperature identification engine 204 is configured to track read temperatures, how the global read temperature identification engine 204 is configured to organize data (e.g., data may be "striped" across the storage devices 210a-210c), and/or based on other factors that would be apparent to one of skill in the art in possession of the present disclosure.

For example, in some embodiments the computing device 200 may store data in the storage devices 210a-210b independently of each other (e.g., as the logical blocks discussed above), in which case the generation of the global logical storage element read temperature map via concatenation of local logical storage element read temperature maps may be appropriate. However, in other embodiments, the computing device 200 may utilize more complex software that organizes the storage of the data in the storage devices 210a-210c in "groups" of logical blocks. For example, for performance considerations a data group of data A, B, and C may be provided by three respective logical blocks, and may be written to each of three respective storage devices, but the computing device 200 may view that data group as "atomic" such that the read temperature that matters is the read temperature of that data group. In such an embodiment, a "higher level" "group global logical storage element read temperature map" may be generated in order to allow the tracking of data group read temperatures, and the inventors of the present disclosure are developing techniques for doing so. One example of such an embodiment is a Redundant Array of Independent Drives (RAID) storage system, but one of skill in the art in possession of the present disclosure will appreciate that other storage systems may introduce similar considerations as well.

Furthermore, the inventors of the present disclosure have developed techniques for generating global logical storage element read temperature maps using local logical storage element read temperature maps which are described in U.S. patent application Ser. No. 17/579,020, filed Jan. 19, 2022, the disclosure of which is incorporated by reference herein in its entirety. As described in that patent document, data in local logical storage element read temperature maps generated by different storage devices may be scaled relative to each other so that the read temperatures of storage locations in different storage devices with different utilizations (e.g., a first storage device with one million reads and a second storage device with ten million reads) may be accurately compared relative to each other (i.e., "hot" storage locations in the first storage device with one million reads may not be "hot" relative to "hot" storage locations in the second storage device with ten million reads).

In some embodiments, a subset of the local logical storage element read temperature maps generated by the storage devices 210a-210c may be retrieved and used by the global read temperature identification engine 204 at block 412. For instance, if the memory system in the computing device 300 does not have sufficient space to store the global logical storage element read temperature map (or for other reasons that memory space is allocated for the storage of other data), a global logical storage element read temperature map may be generated that only identifies logical storage elements with relatively "hot" red temperatures. As such, in some embodiments, the local logical storage element read temperature maps retrieved from the storage devices 210a-210c may only identify logical storage elements having a particular read temperature (e.g., those with relatively "hot" read temperatures), allowing for the generation of the global logical storage element read temperature map identifying logical storage elements with that particular temperature as well. However, in other embodiments, the global read temperature identification engine 204 may be configured to retrieve the local logical storage element read temperature map(s) from the storage devices 210a-210c, and then utilize a filter to generate a filtered global logical storage element read temperature map that identifies particular read temperatures from the local logical storage element read temperature map(s).

In an embodiment, following block 412, the computing device 200 (e.g., the processing system in the computing device 200) may utilize the global logical storage element read temperature map (which may have been stored in the global read temperature identification database 206) in order to provide for the storage of data, movement of data, and/or other data operations that would be apparent to one of skill in the art in possession of the present disclosure. For example, data stored in NAND rows with relatively high read temperatures may be moved to relatively high capability/cost storage devices, data stored in NAND rows with relatively low read temperatures may be moved to relatively low capability/cost storage devices, data stored in NAND rows with relatively intermediate read temperatures may be moved to relatively intermediate capability/cost storage devices, etc. In another example, the computing device 200 (e.g., the processing system in the computing device 200) may utilize the global logical storage element read temperature map in order to perform load balancing (e.g., when the storage devices 210a-210c are the same type of capability/cost storage device, load balancing reads to those storage devices can result in a higher performing storage system (relative to the performance of that storage system without the load balancing). However, while a few specific examples of operations based on identified read temperatures have been described, one of skill in the art in possession of the present disclosure will appreciate how the read temperatures identified in the global logical storage element read temperature map may be utilized to perform any of a variety of read-temperature-based operations while remaining within the scope of the present disclosure as well.

As will be appreciated by one of skill in the art in possession of the present disclosure, global read temperature identification engine 204 that created the global logical storage element read temperature map 802 may perform any of the read-temperature-based operations discussed above. However, one of skill in the art in possession of the present disclosure will also recognize that other subsystems in the computing device 200 (i.e., other than the global read temperature identification engine 204) may perform the read-temperature-based operations discussed above while remaining within the scope of the present disclosure. Furthermore, subsystems outside the computing device 200 may perform the read-temperature-based operations discussed above while remaining within the scope of the present disclosure as well. As such, access to the global logical storage element read temperature map 802 and/or the local logical storage element read temperature maps 700 and 702 may be provided to subsystems other than the storage devices and global read temperature identification engine 204 discussed above, allowing the information stored therein (as well as information used to generated those maps) to be utilized by those other subsystems in any of a variety of manners that will be apparent to one of skill in the art in possession of the present disclosure.

Thus, systems and methods have been described that utilize the read disturb effect that produces noise in adjacent NAND rows when any particular NAND row is read to identify NAND rows that are read more often than other NAND rows and thus have higher "read temperatures" than those other NAND rows. For example, the read-disturb-based read temperature identification system of the present disclosure may include storage device(s) that each determine read disturb information for each block in that storage device, use that read disturb information to identify a subset of rows in at least one block in that storage device that have a higher read temperature than the other rows in the at least one block in that storage device, and, based on that identification, generate and store a local logical storage element read temperature map that identifies a subset of logical storage elements associated with that storage device that have a higher read temperature than the other logical storage elements associated with that storage device. A global read temperature identification subsystem coupled to the storage device(s) may then retrieve the local logical storage element read temperature map generated by each of the storage device(s) and use them to generate a global logical storage element read temperature map.

As such, the read disturb effect that happens automatically in response to conventional read operations and that persists across power cycles may be leveraged to generate read temperature maps for storage devices and storage systems, thus addressing many of the issues with conventional read temperature identification systems discussed above. As will be appreciated by one of skill in the art in possession of the present disclosure, systems and methods of the present disclosure allow a determination of the relative read temperatures of data within storage devices by the storage device themselves (i.e., without requiring processing cycles of a host processor in the server device and/or storage system in which they are located), and with the advent of Storage Class Memory (SCM) devices and low-cost NAND devices that is causing the storage landscape to fracture further than it already has, the opportunity and value associated with placing particular data in the most efficient storage media has increased, and may be realized with the novel read-disturb-based read temperature identification techniques described herein.

Figure 9:
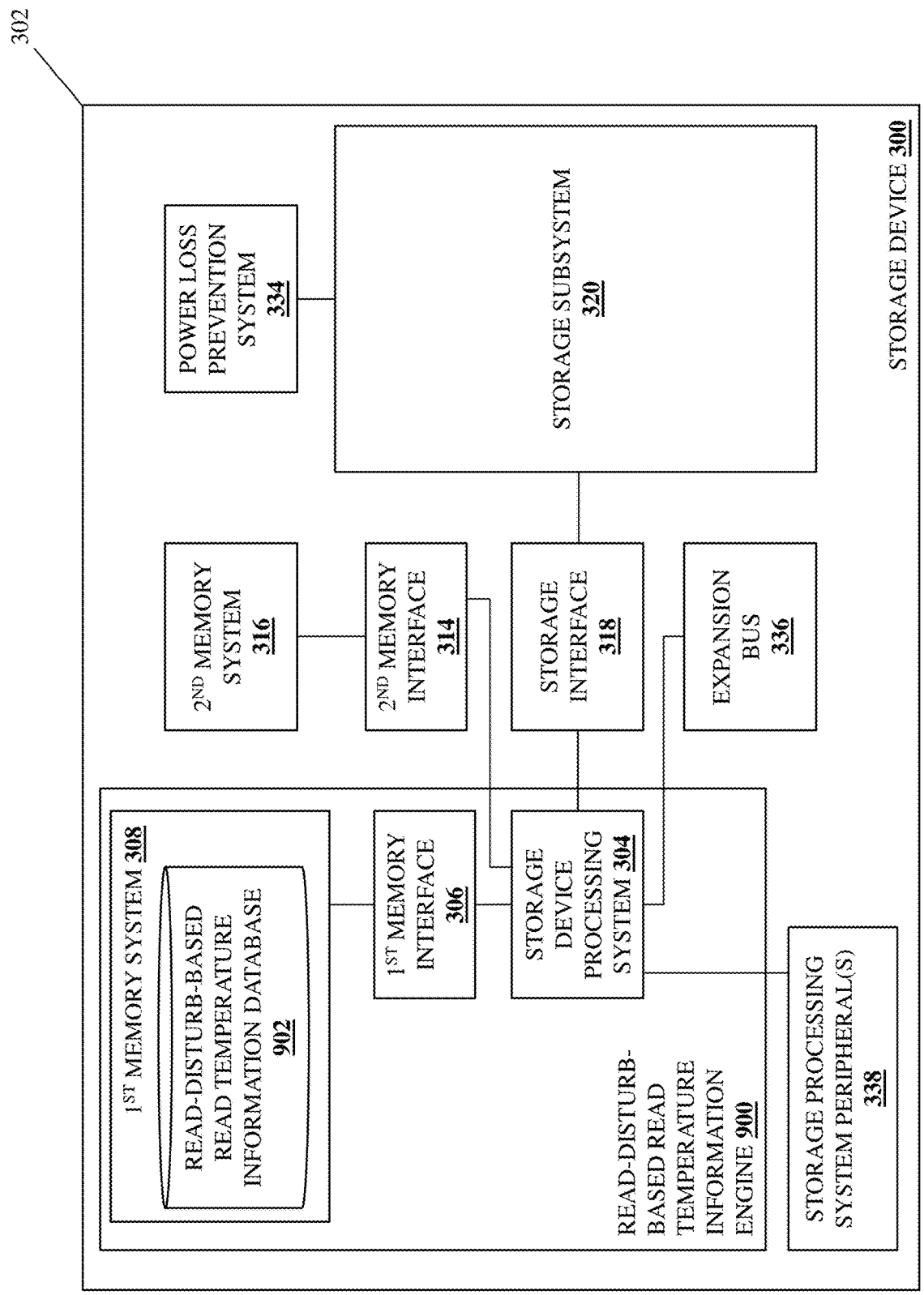
FIG. 9 is a schematic view illustrating an embodiment of a storage device that may be included in the computing device of FIG. 2 and that may provide the read-disturb-based physical storage read temperature information identification system of the present disclosure.

Referring now to FIG. 9, an embodiment of the storage device 300 discussed above with reference to FIGS. 3A-3E is illustrated. In the embodiments illustrated and discussed below, the first memory system 308 may include instructions that, when executed by the storage processing system 304, cause the storage device processing system 304 to provide a read-disturb-based read temperature information engine 900 that is configured to perform the functionality of the read-disturb-based read temperature information engines and/or storage devices discussed below. In the embodiments discussed below with regard to the method 1000 the read-disturb-based read temperature information engine 900 provides a read-disturb-based physical storage read temperature information identification engine, while in the embodiments discussed below with regard to the method 1300 the read-disturb-based read temperature information engine 900 provides a read-disturb-based logical storage read temperature information identification engine, and in the embodiments discussed below with regard to the method 1700 the read-disturb-based read temperature information engine 900 provides a read-disturb-based logical storage read temperature information maintenance engine. However, one of skill in the art in possession of the present disclosure will appreciate that the different functionality described below for the read-disturb-based read temperature information engine 900 may be integrated into a single engine, or provided by different engines, while remaining within the scope of the present disclosure. Furthermore, the local read temperature identification engine 310 discussed above and the read-disturb-based read temperature information engine 900 described below may also be integrated as part of the same engine, although systems with separate local read temperature identification engines and read-disturb-based read temperature information identification engines are envisioned as falling within the scope of the present disclosure as well.

As also illustrated in the specific examples provided herein, the first memory system 308 may also include a read-disturb-based read temperature information identification database 902 that is configured to store any of the information utilized by the read-disturb-based read temperature information engine 900 discussed below. In some embodiments, the local read temperature identification database 312 discussed above and the read-disturb-based read temperature information database 902 described below may be integrated as part of the same database, although systems with separate local read temperature identification databases and read-disturb-based read temperature information databases are envisioned as falling within the scope of the present disclosure as well. Furthermore, one of skill in the art in possession of the present disclosure will recognize that other embodiments of the present disclosure may provide the read-disturb-based read temperature information database 902 in other locations while remaining within the scope of the present disclosure as well. For example, the read-disturb-based read temperature information database 902 may be provided by the second memory system 316 while remaining within the scope of the present disclosure. However, while a specific storage device 300 has been illustrated and described, one of skill in the art in possession of the present disclosure will recognize that storage devices (or other devices operating according to the teachings of the present disclosure in a manner similar to that described below for the storage device 300) may include a variety of components and/or component configurations for providing conventional storage device functionality, as well as the functionality discussed below, while remaining within the scope of the present disclosure as well.

Figure 10:
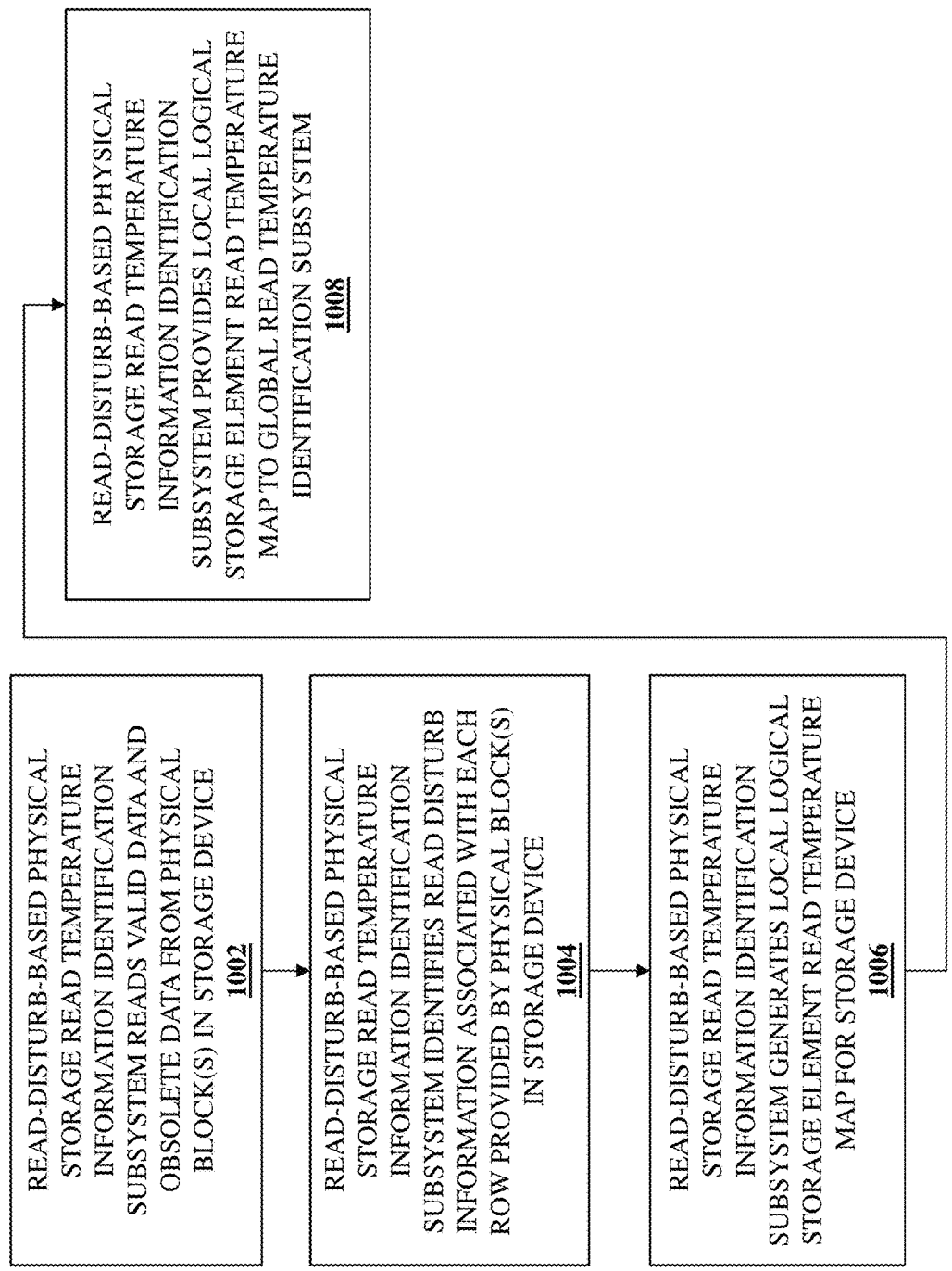
FIG. 10 is a flow chart illustrating an embodiment of a method for identifying read-disturb-based physical storage read temperature information.

With reference to FIG. 10, an embodiment of a method 1000 for identifying read-disturb-based physical storage read temperature information is illustrated. As discussed below, the systems and methods of the present disclosure provide for the identification of read disturb information for physical storage via the reading of both valid data and obsolete data from at least one physical block in that storage device. For example, the read-disturb-based physical storage read temperature information identification system of the present disclosure may include a global read temperature identification subsystem coupled to at least one storage device. Each at least one storage device reads valid data and obsolete data from at least one physical block in that storage device and, based on the reading of the valid data and the obsolete data, generates read disturb information associated with each row provided by the at least one physical block in that storage device. Each at least one storage devices then uses the read disturb information associated with each row provided by the at least one physical block in that storage device to generate a local logical storage element read temperature map for that storage device that it provides to the global read temperature identification subsystem. As such, read disturb information may be identified from physical storage for use in determining the read temperatures of logical storage elements as discussed above.

As will be appreciated by one of skill in the art in possession of the present disclosure, the preparation of data for writing to a particular NAND row may include performing a plurality of data preparation operations such as Cyclic Redundancy Check (CRC) operations that provide a CRC code with that data that may later be used to detect the mis-correction of errors associated with that data, scrambling operations that may operate to randomize the data to minimize interference between values/cell voltages, Error Correction Code (ECC) operations that provide ECC with the data that allows for the correction of errors, and/or other data preparation operations that would be apparent to one of skill in the art in possession of the present disclosure. As such, data written to a NAND row will be written to that NAND row as encoded data with 'redundancy" data and/or other encoded data error correction information known in the art, and a subsequent reading of that encoded data from the NAND row may include errors in that encoded data that may be corrected using that redundancy data and/or other encoded data error correction information.

For examples, errors can be introduced into encoded data stored in NAND rows as a result of the physical design of the NAND device, aging (e.g., program/erase operations) of the NAND device, data retention (e.g., charge leakage over time) in the NAND device, the read disturb effect discussed above, and/or other error introduction issues that would be apparent to one of skill in the art in possession of the present disclosure. As such, subsequent to reads of encoded data, a plurality of conventional data recovery operations may be performed such as ECC correction operations that utilize the ECC to correct errors associated with the encoded data, descrambling operations that operate to de-scramble the encoded data, CRC check operations that utilize the CRC code included in the encoded data to detect for the mis-correction of errors associated with the encoded data, and/or other data recovery operations that one of skill in the art in possession of the present disclosure would recognize as operating to reconstruct the originally written data from the data read from the NAND device. Thus, data read from a NAND row will have its errors conventionally corrected using redundancy data and/or other encoded data error correction information included with that data in order to allow for the reading of that data (or the faster reading of that data due to the reduced errors and/or fewer attempts needed to correctly read that data), after which that redundancy data and/or other encoded data error correction information is conventionally not returned to the subsystem that requested the data read.

Furthermore, one of skill in the art in possession of the present disclosure will also appreciate that data writes like those discussed above may also include the writing of "padding" data that operates to fill up unused portions of NAND rows, and conventionally such padding data is not written with the redundancy data or other encoded data error correction information (e.g., the ECC described above) because the content of such padding data is provided as "filler" and errors in such padding data are not important. However, as discussed below, some embodiments of the present disclosure may provide for the writing of any padding data with corresponding redundancy data or other encoded data error correction information (e.g., the ECC described above) in order to allow read disturb information associated with that padding data to be determined. For example, padding data may be provided by randomized values, and error correction information written with such padding data may be utilized to determine whether those randomized values have changed.

As will be appreciated by one of skill in the art in possession of the present disclosure, the read disturb information (described herein as being utilized to identify read temperatures of storage locations) has conventionally been considered an error that must be corrected using data recovery techniques like those described above. However, the read-disturb-based read temperature identification benefits described herein require such read disturb information to be identified, which may include performing read disturb information identification operations that read the encoded data from NAND rows that include errors as discussed above, and one of skill in the art in possession of the present disclosure will appreciate how the conventional data read operations and the read disturb information identification operations may operate on the same data (e.g., encoded data including errors), but with the distinction that conventional read operations are typically performed on a particular NAND row in a NAND block, while the read disturb information identification operations will typically be performed on at least a plurality of NAND rows that provide a subset of the NAND rows in a NAND block (and in some cases on all of the NAND rows in each of the NAND blocks in the storage subsystem).

The method 1000 begins at block 1002 where a read-disturb-based physical storage read temperature information identification subsystem reads valid data and obsolete data from physical block(s) in a storage device. As will be appreciated by one of skill in the art in possession of the present disclosure, in some embodiments, block 1002 of the method 1000 may be performed as part of block 402 of the method 400 discussed above. Furthermore, during the "current" time period discussed in the examples below, physical blocks in a storage device may include "valid" data that may be provided by the most current copy of any particular data that will be read when a request for that particular data is received by the storage device, as well as "obsolete" data that may be provided by an "old" copy of any particular data that is not read when a request for that particular data is received by the storage device. To provide a specific example, during a first time period that is prior to the current time period discussed in the examples below, the storage device may write first data to a first row in a first physical block in the storage device, and as long as that first data remains in that physical storage location following the first time period (i.e., that first data is not rewritten to another physical storage location), that first data provides the valid data described above.

However, during a second time period that is subsequent to the first time period but that is also prior to the current time period discussed in the examples below, the storage device may copy the first data and write that copy of the first data as second data to a second row in a second physical block in the storage device. As such, at the current time period discussed in the examples below, the first data remaining in the first row of the first physical block in the storage device may provide the "obsolete" data discussed above, and the second data written in the second row of the second physical block in the storage device may provide the "valid" data discussed above (i.e., as long as the second data remains in that physical storage location following the second time period). As will be appreciated by one of skill in the art in possession of the present disclosure, the "obsolete" data described herein is sometimes referred to as "garbage" data, and will typically be erased from the physical block in which it is stored at a future time during "garbage collection operations".

Furthermore, in some embodiments of the present disclosure, any storage device with physical block(s) including both valid data and obsolete data during the current time period discussed in the examples below may have previously written the valid data and "pre-obsolete" data (i.e., data that was initially written to provide valid data at a storage location during a first time period, but was then moved to provide obsolete data at that storage location during a subsequent second time period as described above) to the physical block(s) in that storage device with error correction information such that each of the valid data and the pre-obsolete data is associated with respective error correction information, and may have subsequently made a copy of the pre-obsolete data and written that copy to a different row in the physical block(s) in that storage device in order to "move" that data, resulting in the obsolete data being left with respective error correction information in a row in the physical block(s) in that storage device.

Figure 11:
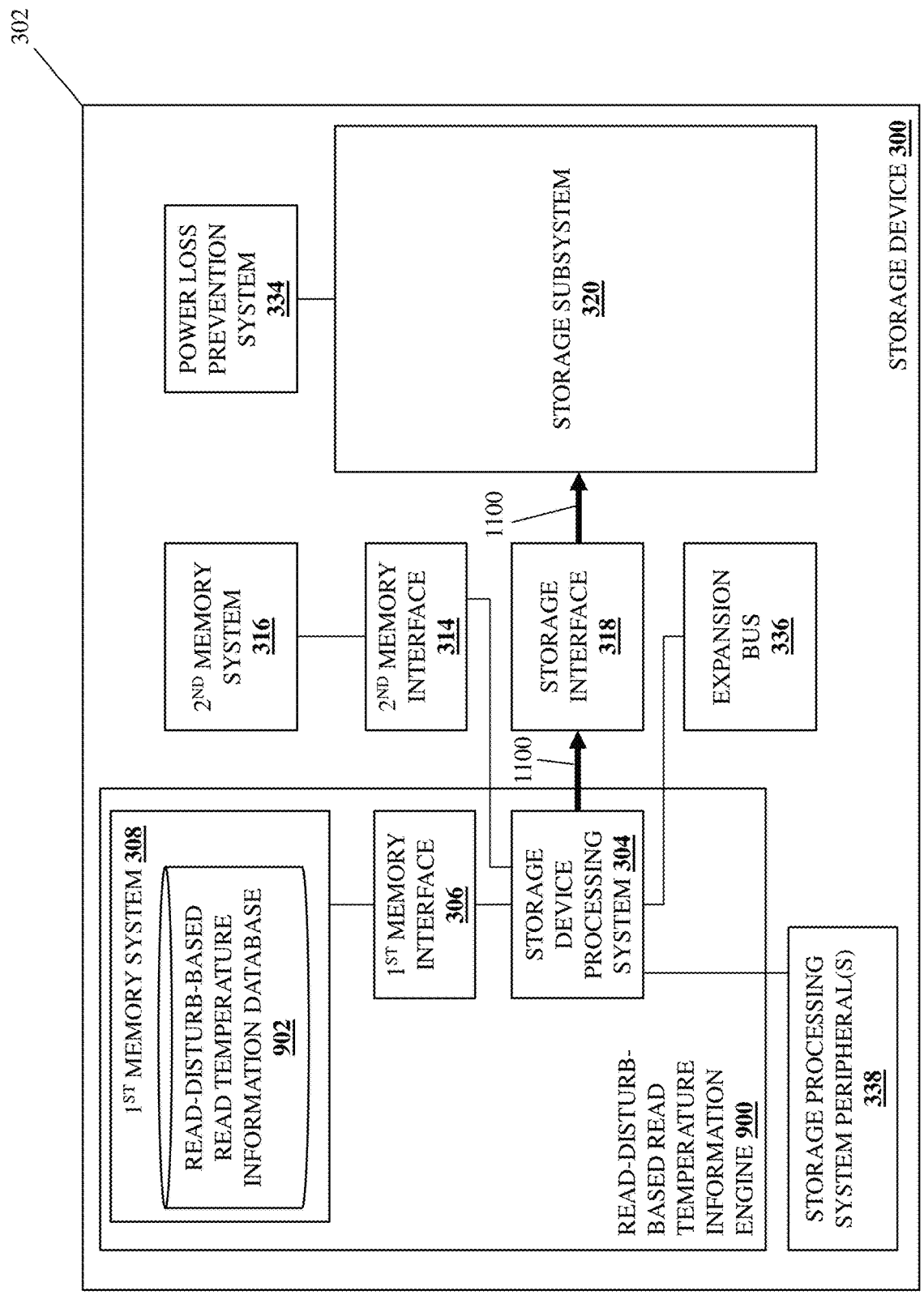
FIG. 11 is a schematic view illustrating an embodiment of the storage device of FIG. 9 operating during the method of FIG. 10.

As such, FIG. 11 illustrates how the read-disturb-based read temperature information engine 900 (a read-disturb-based physical storage read temperature information identification engine in this embodiment) provided by the storage device processing system 304 may have performed data write operations 1100 with the storage subsystem 320 via the storage interface 318 to write data to NAND rows 332 in the NAND blocks 324 in the storage subsystem 320 (e.g., providing the valid data discussed above in the NAND rows 332 in the NAND blocks 324 in the storage subsystem 320), and/or move data between NAND rows 332 in the NAND blocks 324 in the storage subsystem 320 (e.g., providing the valid data and obsolete data discussed above in the NAND rows 332 in the NAND blocks 324 in the storage subsystem 320). Furthermore, as described above, some embodiments of the present disclosure may provide corresponding redundancy data or other encoded data error correction information (e.g., the ECC described above) with all data written in the NAND rows 332 in the NAND blocks 324 in the storage subsystem 320 (e.g., even with padding data that conventionally is not provided with redundancy data or other encoded data error correction information). However, embodiments in which not all data is written in the NAND rows 332 in the NAND blocks 324 in the storage subsystem 320 with corresponding redundancy data or other encoded data error correction information will remain within the scope of the present disclosure as well.

Figure 12:
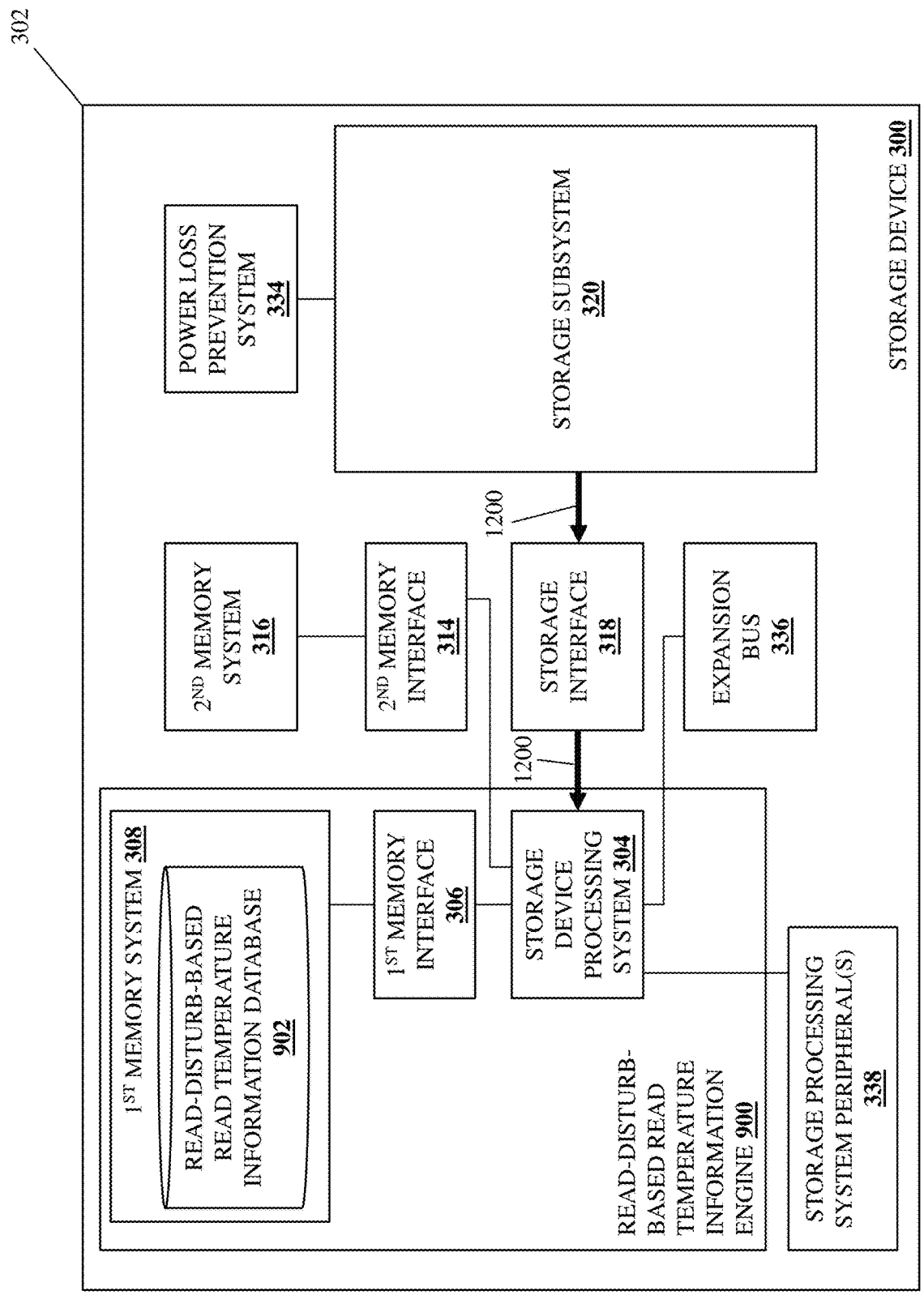
FIG. 12 is a schematic view illustrating an embodiment of the storage device of FIG. 9 operating during the method of FIG. 10.

With reference to FIG. 12, in an embodiment of block 1002, the read-disturb-based read temperature information engine 900 (a read-disturb-based physical storage read temperature information identification engine in this embodiment) provided by the storage device processing system 304 may perform data read operations 1200 with the storage subsystem 320 via the storage interface 318 to read valid data and obsolete data from one or more of the NAND blocks 324 in the storage subsystem 320. As discussed above, while some embodiments of the present disclosure provide for the readings of subsets of NAND rows 332 in one or more NAND blocks 324 in the storage subsystem 320 at block 1002 in order to allow for the identification of read disturb information with a portion of the storage subsystem 320, many embodiments of the present disclosure provide for the reading of all of the NAND rows 332 in each of the NAND blocks 324 in the storage subsystem 320 at block 1002 in order to allow for the identification of read disturb information for the entire storage subsystem 320.

As such, for any NAND row 332 in the NAND block(s) 324 read at block 1002, some embodiments of block 1002 may include the storage device processing system 304 reading any data (i.e., valid data, obsolete data, padding data) and corresponding error correction information (e.g., ECC) in that NAND row 332, and as discussed above some embodiments of the present disclosure operate to provide respective error correction information with any data written to the storage subsystem 320 (including padding data that is not conventionally provided error correction information). However, as also discussed above, some embodiments of the present disclosure do not utilize the error correction information to identify read disturb information, and thus those embodiments of block 1002 may include the storage device processing system 304 reading only the data in that NAND row 332 (or at least some data that does not include error correction information (e.g., the padding data discussed above)).

The method 1000 then proceeds to block 1004 where the read-disturb-based physical storage read temperature information identification subsystem identifies read-disturb information associated with each row provided by the physical block(s) in the storage device. As will be appreciated by one of skill in the art in possession of the present disclosure, in some embodiments, block 1004 of the method 1000 may be performed as part of block 402 of the method 400 discussed above. In some embodiments of block 1004, the read-disturb-based read temperature information engine 900 (a read-disturb-based physical storage read temperature information identification engine in this embodiment) provided by the storage device processing system 304 may perform read disturb information identification operations that include using the valid data and the obsolete data and their corresponding error correction information that was read at block 1002 in order to identify fail bit counts for each NAND row from which that valid data and obsolete data was read, which as discussed above may provide a read disturb signature for any particular NAND row 332, an example of which is illustrated in FIG. 5B. However, while the use of fail bit counts in order to determine read disturb information that provides read disturb signatures has been described, as discussed above the inventors of the present disclosure have developed other techniques for determining read disturb information that are described in U.S. patent application Ser. No. 17/581,879, filed Jan. 22, 2022, the disclosure of which is incorporated by reference herein in its entirety.

As will be appreciated by one of skill in the art in possession of the present disclosure, the reading of both valid data and obsolete data from each of the NAND rows 332 in the NAND block(s) 324 in the storage subsystem 320 may provide for the identification of the read disturb signature associated with any particular NAND row 332 in any particular NAND block 324, as the read disturb signature for any particular NAND row 332 that stores valid data is actually provided by its adjacent NAND rows 332 that may store valid data, obsolete data, and/or padding data. Furthermore, one of skill in the art in possession of the present disclosure will appreciate how embodiments of the present disclosure that utilize error correction information written with corresponding data to identify read disturb information will benefit from the writing of all data (including padding data) to the NAND rows 332 in the NAND blocks 324 with error correction information so that an accurate read disturb signature for any particular NAND row 332 may be identified (e.g., because the fail bit count for any adjacent NAND row that is used to provide the read disturb signature for any particular NAND row cannot be determined if no error correction information is provided with the data stored in that adjacent NAND row).

The method 1000 then proceeds to block 1006 where the read-disturb-based physical storage read temperature information identification subsystem generates a local logical storage element read temperature map for the storage device. In an embodiment, at block 1006, the read-disturb-based read temperature information engine 900 (a read-disturb-based physical storage read temperature information identification engine in this embodiment) provided by the storage device processing system 304 may perform local logical storage element read temperature map generation operations to generate a local logical storage element read temperature map in substantially the same manner as described above with reference to block 406 of the method 400 and using the read disturb information that was identified for the NAND rows 332 in the NAND block(s) 324 using the valid data and obsolete data read from those NAND rows 332. As such, following block 1006, any or all of the storage devices 210a-210c may have generated a local logical storage element read temperature map similar to those illustrated and discussed above with regard to FIGS. 7A and 7B.

The method 1000 then proceeds to block 1008 where the read-disturb-based physical storage read temperature information identification subsystem provides the local logical storage element read temperature map to a global temperature identification subsystem. In an embodiment, at block 1008, the read-disturb-based read temperature information engine 900 (a read-disturb-based physical storage read temperature information identification engine in this embodiment) provided by the storage device processing system 304 may perform local logical storage element read temperature map provisioning operations to provide the local logical storage element read temperature map to the global read temperature identification engine 204 in substantially the same manner as described above with reference to blocks 408 and 410 of the method 400 (e.g., by the storage device processing system 304 storing the local logical storage element read temperature map, and the global read temperature identification engine 204 retrieving that local logical storage element read temperature map). Furthermore, as discussed above with regard to block 412, the global read temperature identification engine 204 may then use local logical storage element read temperature maps retrieved from the storage device(s) 210a-210c to generate a global logical storage element read temperature map.

Thus, systems and methods have been described that provide for identification of read disturb information for physical storage via the reading of both valid data and obsolete data from at least one physical block in that storage device. For example, the read-disturb-based physical storage read temperature information identification system of the present disclosure may include a global read temperature identification subsystem coupled to at least one storage device. Each at least one storage device reads valid data and obsolete data from at least one physical block in that storage device and, based on the reading of the valid data and the obsolete data, generates read disturb information associated with each row provided by the at least one physical block in that storage device (or at least one of the rows provided by the at least one physical block in that storage device). Each at least one storage devices then uses the read disturb information associated with each row provided by the at least one physical block in that storage device to generate a local logical storage element read temperature map for that storage device that it provides to the global read temperature identification subsystem. As such, read disturb information may be identified from physical storage for use in determining the read temperatures of logical storage elements associated with a storage device.

Figure 13:
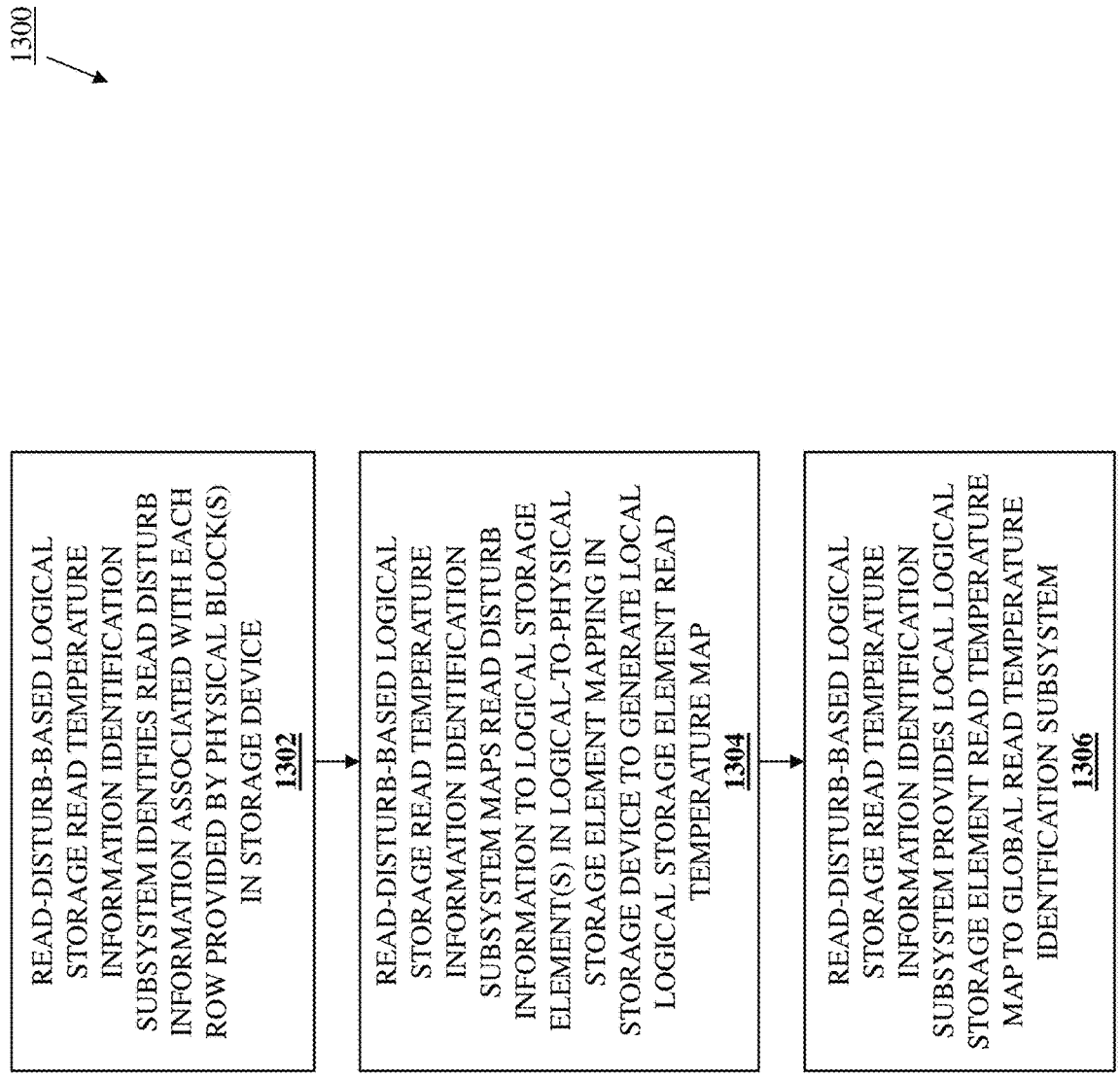
FIG. 13 is a flow chart illustrating an embodiment of a method for identifying read-disturb-based logical storage read temperature information.

With reference to FIG. 13, an embodiment of a method 1300 for identifying read-disturb-based logical storage read temperature information is illustrated. As discussed below, the systems and methods of the present disclosure provide for the mapping of physical storage read disturb information to logical storage elements in a logical-to-physical storage element mapping of a storage device in order to generate a local logical element read temperature map for that storage device. For example, the read-disturb-based logical storage read temperature identification system of the present disclosure may include a global read temperature identification subsystem coupled to at least one storage device. Each at least one storage device identifies read disturb information associated with each row provided by the at least one physical block in that storage device from at least one physical block in that storage device, and maps the read disturb information associated with each row provided by the at least one physical block in that storage device to one or more logical storage elements included in a logical-to-physical storage element mapping for that storage device to generate a local logical storage element read temperature map. Each at least one storage device may then provide its local logical storage element read temperature map to the global read temperature identification subsystem. As such, read disturb information identified for physical storage in a storage device may be mapped to logical storage elements associated with that storage device to generate a local logical storage element read temperature map for that storage device that is based on physical storage read disturb information.

The method 1300 begins at block 1302 where a read-disturb-based logical storage read temperature information identification subsystem identifies read disturb information associated with each row provided by physical block(s) in a storage device. In an embodiment, at block 1302, the read-disturb-based read temperature information engine 900 (a read-disturb-based logical storage read temperature information identification engine in this embodiment) provided by the storage device processing system 304 may perform physical storage read disturb information identification operations to identify read disturb information associated with NAND rows 332 in the NAND block(s) 324 in the storage subsystem 320. As will be appreciated by one of skill in the art in possession of the present disclosure, in some embodiments block 1302 of the method 1300 may be performed as part of block 402 of the method 400 discussed above, and/or may be performed substantially as described above with regard to blocks 1002 and 1004 of the method 1000 discussed above.

As such, following block 1302, the read-disturb-based read temperature information engine 900 (a read-disturb-based logical storage read temperature information identification engine in this embodiment) provided by the storage device processing system 304 may have identified read disturb information for a plurality of NAND rows 332 in NAND block(s) 324 in the storage subsystem 302, and as discussed above that read disturb information for each of those NAND rows 332 may be indicative of a respective read temperature (e.g., read disturb information identified for some NAND rows 332 may be indicative of a relatively "hot" read temperature, read disturb information identified for some NAND rows 332 may be indicative of a relatively "intermediate" read temperature, read disturb information identified for some NAND rows 332 may be indicative of h a relatively "cold" read temperature, etc.).

Figure 14:
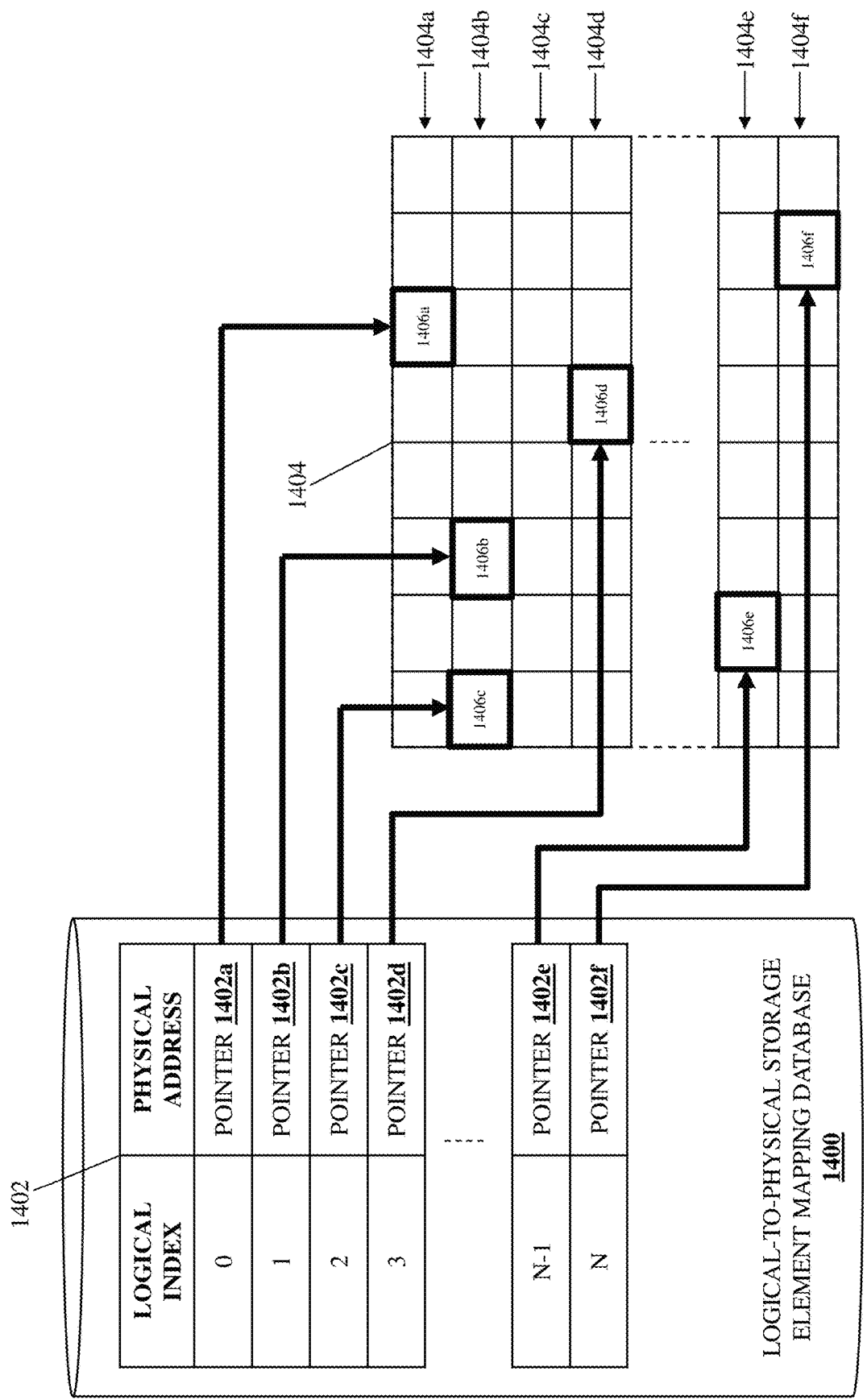
FIG. 14 is a schematic view illustrating an embodiment of a logical-to-physical storage element mapping that may be utilized during the method of FIG. 13.

The method 1300 then proceeds to block 1304 where the read-disturb-based logical storage read temperature information identification subsystem maps read disturb information to logical storage element(s) in a logical-to-physical storage element mapping in the storage device to generate a local logical storage element read temperature map. With reference to FIG. 14, an embodiment of a logical-to-physical storage element mapping database 1400 is illustrated that may, for example, be provided by the read-disturb-based read temperature information database 902 (a read-disturb-based logical storage read temperature information identification database in this embodiment). In a specific example, the logical-to-physical storage element mapping database 1400 may be provided by a Flash Translation Layer (FTL) logical mapping database that stores a FTL logical map as described below, although other databases storing other maps that provide the functionality discussed below will fall within the scope of the present disclosure as well.

In the illustrated embodiment, logical-to-physical storage element mapping database 1400 stores a logical-to-physical storage element map 1402 (e.g., an FTL logical map) that associates logical storage indices (e.g., each "LOGICAL INDEX" identified in FIG. 14) with physical storage locations (e.g., each "PHYSICAL ADDRESS" identified in FIG. 14 that may be provided by physical address range(s) and/or other physical storage location indicators known in the art). In the specific example illustrated in FIG. 14, the logical-to-physical storage element map 1402 associates a logical index "0" with a physical address pointer 1402a, a logical index "1" with a physical address pointer 1402b, a logical index "2" with a physical address pointer 1402c, a logical index "3" with a physical address pointer 1402d, and up to a logical index "N−1" with a physical address pointer 1402e, and a logical index "N" with a physical address pointer 1402f.

FIG. 14 also illustrates a schematic view of physical storage 1404 that, in the examples below, includes rows 1404a, 1404b, 1404c, 1404d, and up to 1404e, and 1404f. In a specific example, the physical storage 1404 in FIG. 14 may be provided by a NAND block having NAND rows 1404a-1404f, although other physical storage implementations will fall within the scope of the present disclosure as well. Furthermore, FIG. 14 illustrates how each of the physical address pointers in the logical-to-physical storage element map 1402 "point" to portions of a NAND row (sometimes called "chunks", which one of skill in the art in possession of the present disclosure will appreciate are typically provided with a size of 4K, but which may be provided with sizes of 8K, 16K, and/or other sizes while remaining within the scope of the present disclosure as well.)

As such, the physical address pointer 1402a associated with the logical index "0" in the logical-to-physical storage element map 1402 points to a portion/chunk 1406a in the NAND row 1404a, the physical address pointer 1402b associated with the logical index "1" in the logical-to-physical storage element map 1402 points to a portion/chunk 1406b in the NAND row 1404b, the physical address pointer 1402c associated with the logical index "2" in the logical-to-physical storage element map 1402 points to a portion/chunk 1406c in the NAND row 1404b, the physical address pointer 1402d associated with the logical index "3" in the logical-to-physical storage element map 1402 points to a portion/chunk 1406d in the NAND row 1404d, the physical address pointer 1402e associated with the logical index "N−1" in the logical-to-physical storage element map 1402 points to a portion/chunk 1406e in the NAND row 1404e, and the physical address pointer 1402f associated with the logical index "N" in the logical-to-physical storage element map 1402 points to a portion/chunk 1406f in the NAND row 1404f. As will be appreciated by one of skill in the art in possession of the present disclosure, any portion/chunk in any NAND row may be empty (i.e., that portion/chunk may store "dummy" data, "padding" data, or other non-used data known in the art) at any particular time, and thus any of the physical address pointers in the logical-to-physical storage element map 1402 may point to an empty physical storage location at any particular time as illustrated and described in some of the specific examples below.

Figure 15:
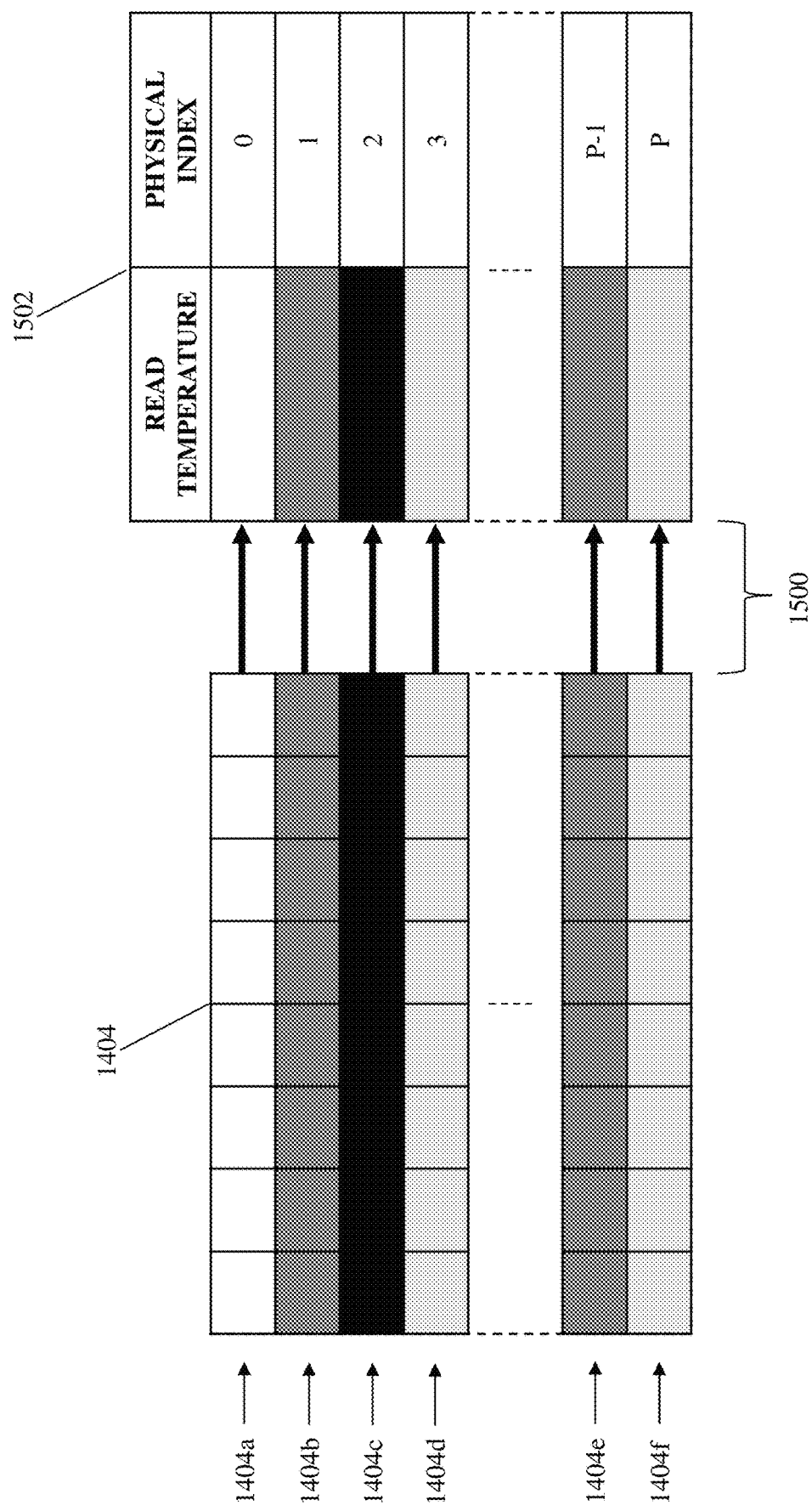
FIG. 15 is a schematic view illustrating an embodiment of a read temperature information/physical storage mapping that may be generated during the method of FIG. 13.

As discussed above, the read disturb information identified for the NAND rows 332 in the NAND block(s) 324 of the storage subsystem 320 at block 1302 is indicative of a respective read temperature for each of those NAND rows 332. FIG. 15 illustrates the schematic view of physical storage 1404 discussed above with reference to FIG. 14 with an example of read temperatures associated with each of the NAND rows 1404a-1404f based on the read disturb information determined at block 1302 of the method 1300, with the NAND row 1404a associated with a relatively "cold" read temperature, the NAND row 1404b associated with a relatively "high intermediate" read temperature, the NAND row 1404c associated with a relatively "hot" read temperature, the NAND row 1404d associated with a relatively "low intermediate" read temperature, and up to the NAND row 1404e associated with a relatively "high intermediate" read temperature, the NAND row 1404f associated with a relatively "low intermediate" read temperature.

With continued reference to FIG. 15, in an embodiment of block 1304, the read-disturb-based read temperature information engine 900 (a read-disturb-based logical storage read temperature information identification engine in this embodiment) provided by the storage device processing system 304 may perform local physical storage read temperature mapping operations 1500 that operate to map the read temperature associated with each of the NAND rows 1404a-1404f in the NAND block 1404 to respective physical storage indices (e.g., each "PHYSICAL INDEX" identified in FIG. 15 that may be provided by a physical address range that covers the corresponding NAND row). To provide a specific example, each of the NAND rows 1404a-1404f may be made up of 8 portions/chunks that each are ~4K in size, and thus each physical storage index may be ~32K in size (i.e., to cover its corresponding NAND row that is 8 portions/chunks * ~4K per portion/chunk=~32K in size). However, while a specific example is provided, one of skill in the art in possession of the present disclosure will appreciate how physical storage indices may have different sizes based on how NAND rows are provided in the storage device, the type of data (e.g., CRC data, ECC data, etc.) included in the NAND rows, and/or based on other storage device factors that would be apparent to one of skill in the art in possession of the present disclosure.

As such, in some embodiments during block 1304, a local physical storage read temperature map 1502 may be provided that includes a physical index "0" associated with the relatively "cold" read temperature of the NAND row 1404a, a physical index "1" associated with the relatively "high intermediate" read temperature of the NAND row 1404b, a physical index "2" associated with the relatively "hot" read temperature of the NAND row 1404c, a physical index "3" associated with the relatively "low intermediate" read temperature of the NAND row 1404d, and up to a physical index "P-1" associated with the relatively "high intermediate" read temperature of the NAND row 1404e, and a physical index "P" associated with the relatively "low intermediate" read temperature of the NAND row 1404f.

Figure 16:
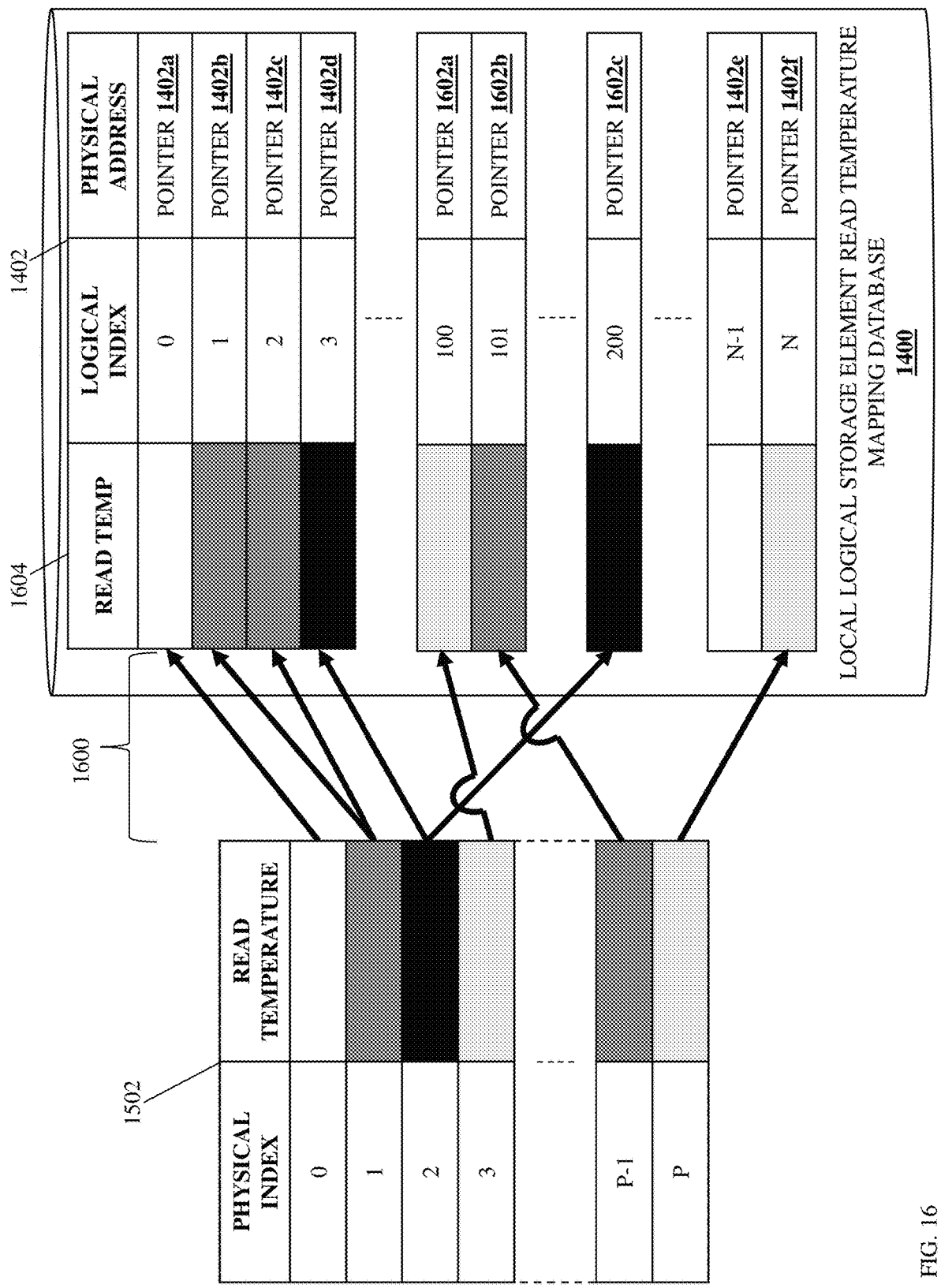
FIG. 16 is a schematic view illustrating an embodiment of a read temperature information/logical storage element mapping that may be generated during the method of FIG. 13.

With reference to FIG. 16, in an embodiment of block 1304, the read-disturb-based read temperature information engine 900 (a read-disturb-based logical storage read temperature information identification engine in this embodiment) provided by the storage device processing system 304 may then perform local logical storage element read temperature map generation operations 1600 that may include mapping the read temperatures, which were mapped to respective physical indices in the local physical storage read temperature map 1502) to one or more logical storage elements in the logical-to-physical storage element map 1402. As will be appreciated by one of skill in the art in possession of the present disclosure, FIG. 16 illustrates the logical-to-physical storage element mapping database 1400 storing the logical-to-physical storage element map 1402 of FIG. 14 that has been expanded to show additional logical storage indices (i.e., the logical index "100" associated with a physical address pointer 1602a, the logical index "101" associated with a physical address pointer 1602b, and up to the logical index "200" associated with a physical address pointer 1602c) in order to provide a specific example of local logical storage element read temperature map generation operations.

As such, in the specific example illustrated in FIG. 16, at block 1304 the read-disturb-based read temperature information engine 900 (a read-disturb-based logical storage read temperature information identification engine in this embodiment) provided by the storage device processing system 304 may map the relatively "cold" read temperature that was mapped to the physical index "0" in the local physical storage read temperature map 1502 to the logical index "0" in the logical-to-physical storage element map 1402, map the relatively "high intermediate" read temperature that was mapped to the physical index "1" in the local physical storage read temperature map 1502 to the logical indices "1" and "2" in the logical-to-physical storage element map 1402, map the relatively "hot" read temperature that was mapped to the physical index "2" in the local physical storage read temperature map 1502 to the logical indices "3" and "200" in the logical-to-physical storage element map 1402, map the relatively "low intermediate" read temperature that was mapped to the physical index "3" in the local physical storage read temperature map 1502 to the logical index "100" in the logical-to-physical storage element map 1402, map the relatively "high intermediate" read temperature that was mapped to the physical index "P-1" in the local physical storage read temperature map 1502 to the logical index "101" in the logical-to-physical storage element map 1402, and map the relatively "low intermediate" read temperature that was mapped to the physical index "P" in the local physical storage read temperature map 1502 to the logical index "N" in the logical-to-physical storage element map 1402.

As will be appreciated by one of skill in the art in possession of the present disclosure, the logical index "N-1" is associated with the pointer 1402e that does not point to a physical storage location (e.g., the logical index N-1 was never written by the host) in the example illustrated in FIG. 16, and thus no read temperature may be associated with the logical index "N-1" at block 1304 of the method 1300. In some embodiments, the "mapping" of the read temperatures (which were mapped to respective physical indices in the local physical storage read temperature map 1502) to one or more logical storage indices in the logical-to-physical storage element map 1402 may be provided by a "reverse lookup" that allows the physical address pointers, which are associated with the respective logical indices in the logical-to-physical storage element map 1402 and point to respective physical address ranges, to also point to respective read temperatures in a reverse lookup table 1604 (e.g., a physical-to-logical translation as opposed to "forward lookups" that provide logical-to-physical translations). However, while a reverse lookup technique for associating read temperatures with logical indices is illustrated and described, one of skill in the art in possession of the present disclosure will appreciate that the association of read temperatures with logical indices in a logical-to-physical storage element map may be performed in a variety of manners that will fall within the scope of the present disclosure as well.

In some embodiments, any "current" read temperatures (i.e., read temperatures determined during a current performance of the method 1300) may be used to overwrite corresponding "previous" read temperatures (i.e., read temperatures determined during a previous performance of the method 1300) mapped to any respective logical index (e.g., in the reserve lookup table 1604). As will be appreciated by one of skill in the art in possession of the present disclosure, the association of only current read temperatures with logical indices in the local logical storage element read temperature map may provide an "instant view" local logical storage element read temperature map that, at any particular time, identifies the current read temperatures of data in the storage subsystem 320. In some examples the instant view local logical storage element read temperature map discussed above may be provided in response to a request from the global read temperature identification subsystem at any point during its updating (i.e., when only portions of the instant view local logical storage element read temperature map have been updated), while in other examples the updating of the instant view local logical storage element read temperature map may be provided in response to a request from the global read temperature identification subsystem once its updating has been completed. Furthermore, as discussed in further detail below, while the association of only current read temperatures with logical indices in the local logical storage element read temperature map have been described, some embodiments of the present disclosure may provide for the maintenance of previous read temperatures in order to provide local logical storage element read temperature maps that may be based on both current and previous read temperatures.

The method 1300 then proceeds to block 1306 where the read-disturb-based logical storage read temperature information identification subsystem provides the local logical storage element read temperature map to a global read temperature identification subsystem. In an embodiment, at block 1306, the read-disturb-based read temperature information engine 900 (a read-disturb-based logical storage read temperature information identification engine in this embodiment) provided by the storage device processing system 304 may perform local logical storage element read temperature map provisioning operations to provide the local logical storage element read temperature map to the global read temperature identification engine 204 in substantially the same manner as described above with reference to blocks 408 and 410 of the method 400 (e.g., by the storage device processing system 304 storing the local logical storage element read temperature map, and the global read temperature identification engine 204 retrieving that local logical storage element read temperature map). Furthermore, as discussed above with regard to block 412, the global read temperature identification engine 204 may then use local logical storage element read temperature maps retrieved from the storage device(s) 210a-210c to generate a global logical storage element read temperature map.

Thus, systems and methods have been described that provide for the mapping of physical storage read disturb information to logical storage elements in a logical-to-physical storage element mapping of a storage device in order to generate a local logical element read temperature map for that storage device. For example, the read-disturb-based logical storage read temperature identification system of the present disclosure may include a global read temperature identification subsystem coupled to at least one storage device. Each at least one storage device identifies read disturb information associated with each row provided by the at least one physical block in that storage device from at least one physical block in that storage device, and maps the read disturb information associated with each row provided by the at least one physical block in that storage device to one or more logical storage elements included in a logical-to-physical storage element mapping for that storage device to generate a local logical storage element read temperature map. Each at least one storage device may then provide its local logical storage element read temperature map to the global read temperature identification subsystem. As such, read disturb information identified for physical storage in a storage device may be mapped to logical storage elements associated with that storage device to generate a local logical storage element read temperature map for that storage device that is based on physical storage read disturb information.

Figure 17:
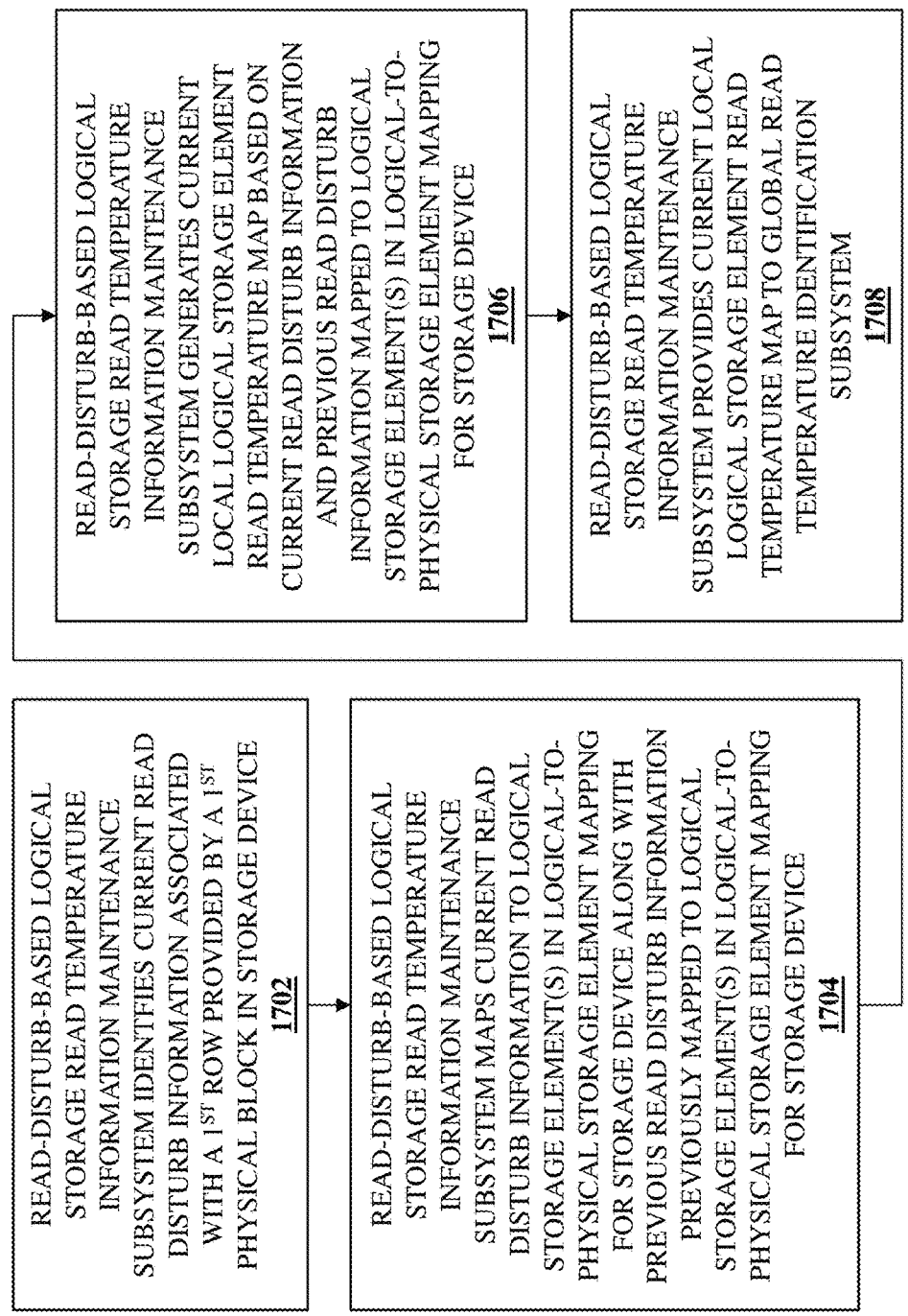
FIG. 17 is a flow chart illustrating an embodiment of a method for maintaining read-disturb-based logical storage read temperature information.

With reference to FIG. 17, an embodiment of a method 1700 for maintaining read-disturb-based logical storage read temperature information is illustrated. As discussed below, the systems and methods of the present disclosure provide for the mapping of logical storage elements to both current read disturb information and previous read disturb information in order to allow for the identification of read temperatures of those logical storage elements based on at least some of their history of read temperatures. For example, the read-disturb-based logical storage read temperature information maintenance system of the present disclosure may include a global read temperature identification subsystem coupled to storage device(s). Each storage device identifies, from a physical block in that storage device, current read disturb information associated with a row provided by the physical block in that storage device, and maps the current read disturb information to logical storage element(s) included in a logical-to-physical storage element mapping for that storage device along with previous read disturb information that was previously mapped to those logical storage element(s) included in the logical-to-physical storage element mapping for that storage device. Based on the current read disturb information and the previous read disturb information mapped to the logical storage element(s) included in the logical-to-physical storage element mapping for that storage device, each storage device generates a current local logical storage element read temperature map that it provides to the global read temperature identification subsystem. As such, as data is moved between physical storage locations, the history of read temperatures of the logical storage element(s) associated with that data may be utilized to provide more accurate read temperatures to be identified for the logical storage element(s).

The method 1700 begins at block 1702 where a read-disturb-based logical storage read temperature information maintenance subsystem identifies current read disturb information associated with a first row provided by a first physical block in a storage device. In an embodiment, the "current" iteration of the method 1700 may follow a performance of the method 1300 (or one or more "previous" iterations of the method 1700) such that read disturb information was previously associated with a plurality of NAND rows 332 in NAND block(s) 324 prior to the beginning of the current iteration of the method 1700. For example, at the beginning of the current iteration of the method 1700, a local logical storage element read temperature map for the storage subsystem 320 in the storage device may identify read temperatures that are based on read disturb information that was previously associated with logical storage elements in that logical storage element read temperature map (referred to as "previous" read disturb information in the examples below), and during the current iteration of the method 1700 any of those logical storage elements may then be associated with read temperatures that are based on "new" read disturb information (referred to as "current" read disturb information in the examples below). Furthermore, the inventors of the present disclosure have developed techniques that provide for persisting previously determined read temperatures across storage device power cycles that are described in U.S. patent application Ser. No. 17/579,988, filed Jan. 20, 2022, the disclosure of which is incorporated by reference herein in its entirety.

Figure 18A:
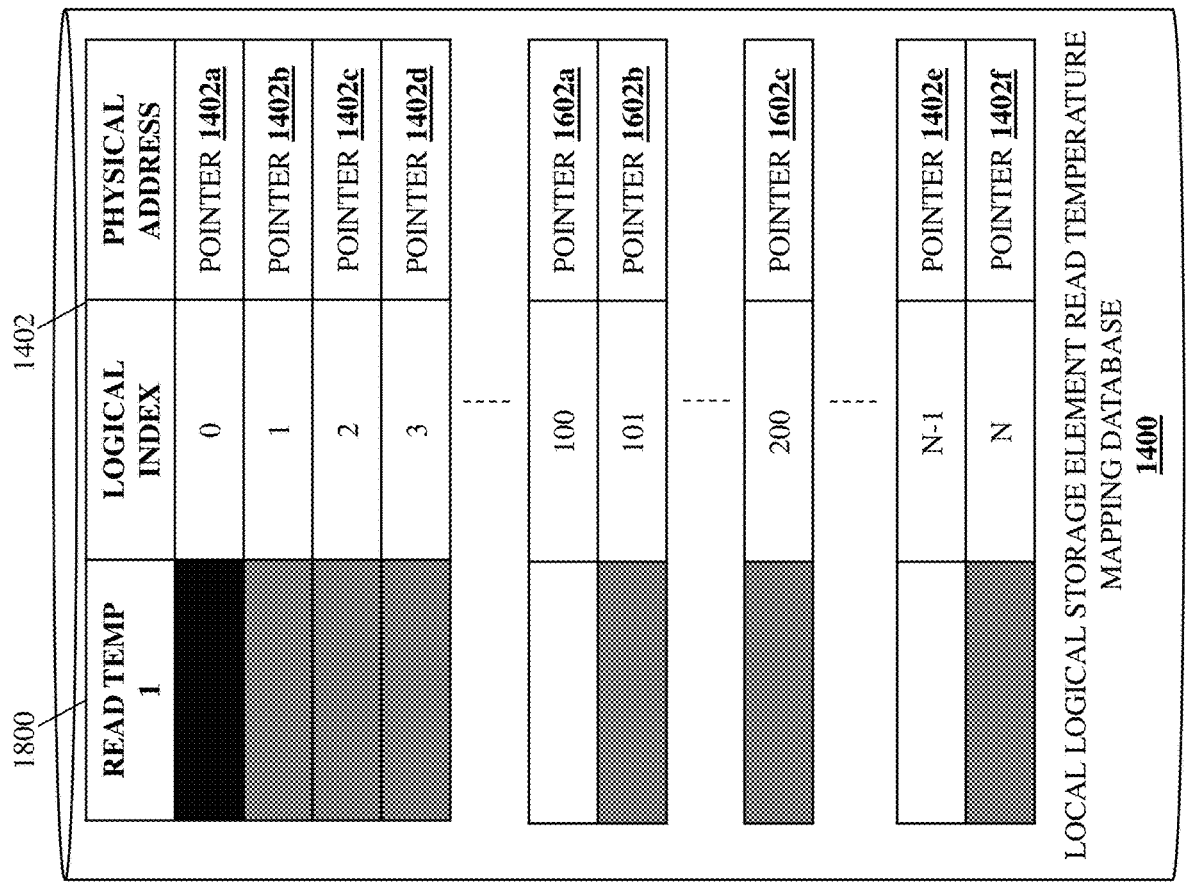
FIG. 18A is a schematic view illustrating an embodiment of a read temperature information/logical storage element mapping that may be generated during the method of FIG. 17.
Figure 18A:
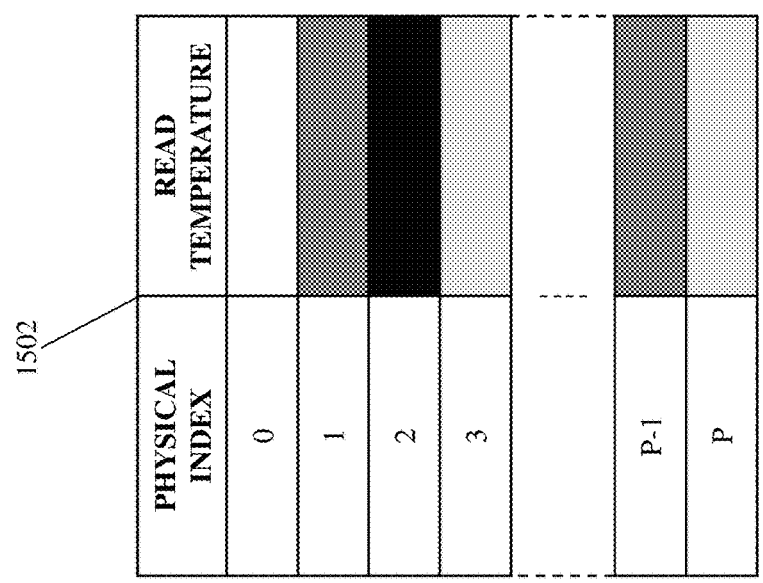

FIG. 18A illustrates an example of a local logical storage element read temperature map in the local logical storage element read temperature mapping database 1400 at the beginning of the current iteration of the method 1700, with a previously determined relatively "hot" read temperature mapped to the logical index "0" in the logical-to-physical storage element map 1402 (e.g., via a table 1800 that may have been generated before the read lookup table 1604 discussed above with regard to the method 1300); a previously determined relatively "cold" read temperature mapped to the logical indices "100" and "N−1" in the logical-to-physical storage element map 1402 (e.g., via the table 1800); and a previously determined relatively "high intermediate" read temperature mapped to the logical indices "1", "2", "3", "101", "200", and "N" in the logical-to-physical storage element map 1402 (e.g., via the table 1800). However, while the specific technique for identifying read disturb information described above with reference to the method 1300 has been described as being used during block 1702, one of skill in the art in possession of the present disclosure will appreciate how other read disturb information identification techniques will fall within the scope of the present disclosure as well.

Thus, in an embodiment of block 1702, the read-disturb-based read temperature information engine 900 (a read-disturb-based logical storage read temperature information maintenance engine in this embodiment) provided by the storage device processing system 304 may identify current read disturb information associated with any NAND row 332 in a NAND block 324 in the storage subsystem 320 in substantially the same manner as described above at blocks 1302. As such, in some embodiments the identification of current read disturb information for each of the NAND rows 1404a-1404f may result in corresponding current read temperatures being associated with each of those NAND rows 1404a-1404f, and the current read temperatures associated with each of those NAND rows 1404a-1404f may then be mapped to corresponding physical indices as described above. With reference back to FIG. 18A, during the current iteration of the method 1700, the local physical storage read temperature map 1502 discussed above with regard to the method 1300 may be provided that, similarly as described above with reference to FIGS. 15 and 16, includes a physical index "0" associated with the current relatively "cold" read temperature identified for the NAND row 1404a, a physical index "1" associated with the current relatively "high intermediate" read temperature identified for the NAND row 1404b, a physical index "2" associated with the current relatively "hot" read temperature identified for the NAND row 1404c, a physical index "3" associated with the current relatively "low intermediate" read temperature identified for the NAND row 1404d, and up to a physical index "P–1" associated with the current relatively "high intermediate" read temperature identified for the NAND row 1404e, and a physical index "P" associated with the current relatively "low intermediate" read temperature identified for the NAND row 1404f.

The method 1700 then proceeds to block 1704 where the read-disturb-based logical storage read temperature information maintenance subsystem maps the current read disturb information to logical storage element(s) in a logical-to-physical storage element mapping for the storage device along with previous read disturb information previously mapped to the logical storage element(s) in the logical-to-physical storage element mapping for the storage device. In an embodiment of block 1704, the read-disturb-based read temperature information engine 900 (a read-disturb-based logical storage read temperature information maintenance engine in this embodiment) provided by the storage device processing system 304 may then map the current read temperatures mapped to the physical indices in the local physical storage read temperature map 1502 to the logical indices in the logical-to-physical storage element map 1402 similarly as described above with reference to FIG. 16, while allowing the previous read temperatures to remain mapped to those logical indices in the logical-to-physical storage element map 1402 as well. However, in other embodiments, the read-disturb-based read temperature information engine 900 provided by the storage device processing system 304 may combine the current read temperatures with previous read temperatures to generate a single composite read temperature for each logical index in the logical-to-physical storage element map 1402 while remaining within the scope of the present disclosure as well.

Figure 18B:
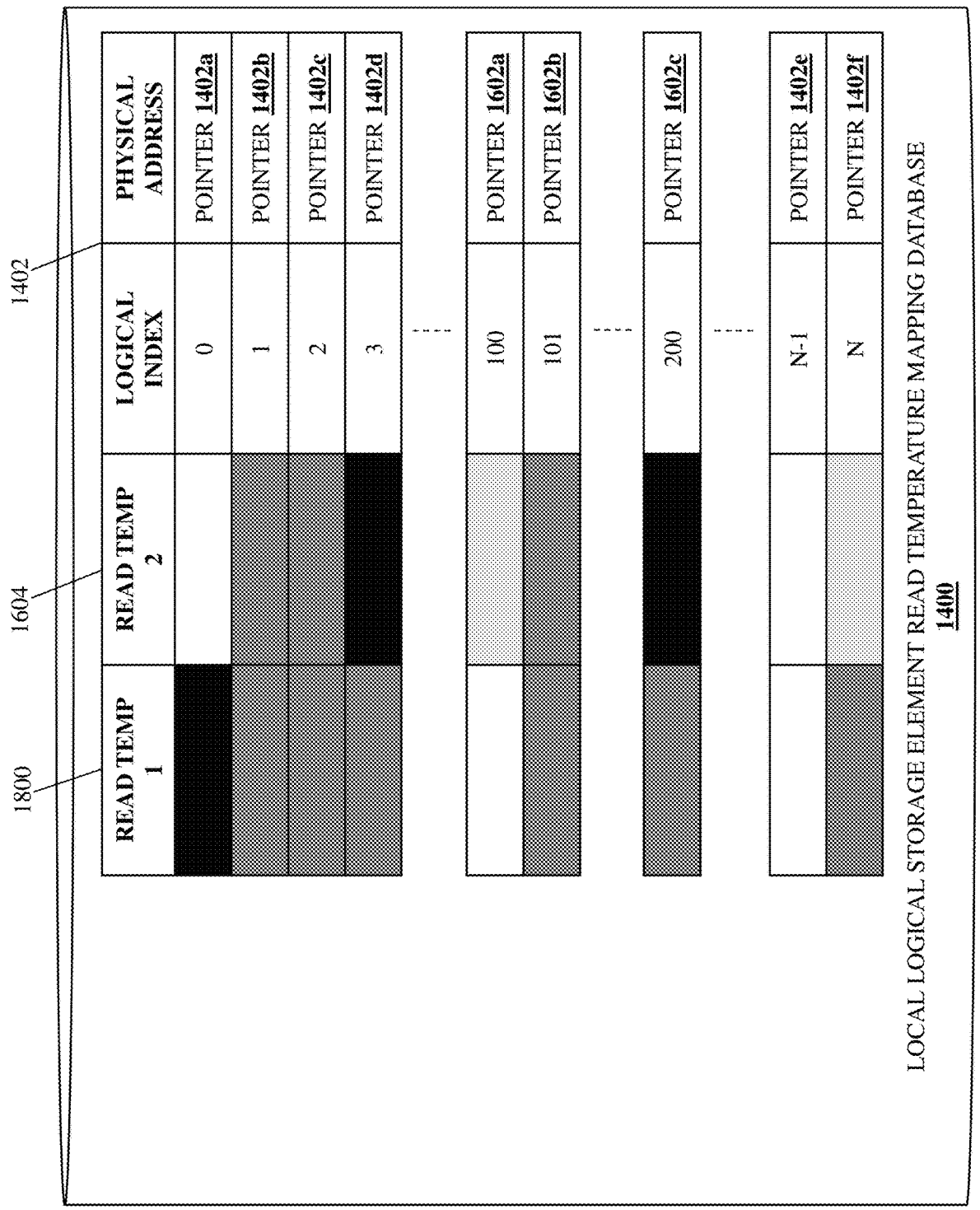
FIG. 18B is a schematic view illustrating an embodiment of a read temperature information/logical storage element mapping that may be generated during the method of FIG. 17.
Figure 18C:
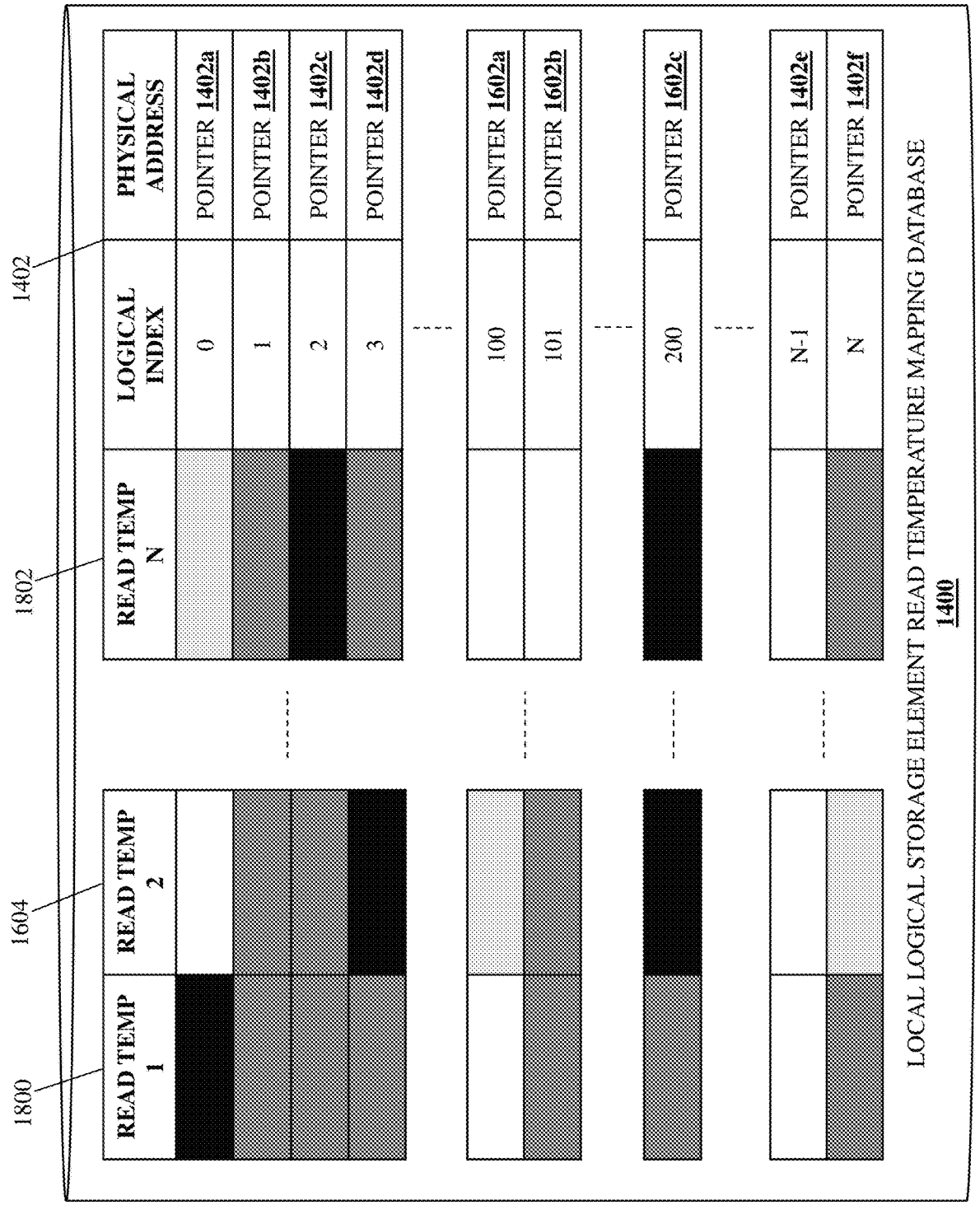
FIG. 18C is a schematic view illustrating an embodiment of a read temperature information/logical storage element mapping that may be generated during the method of FIG. 17.

For example, FIG. 18B illustrates the local logical storage element read temperature mapping database 1400 storing the logical-to-physical storage element map 1402 that maps the logical indices to physical addresses, with the previous read temperatures mapped to those logical indices via the table 1800 ("READ TEMP 1" in the illustrated example), and the current read temperatures mapped to those logical indices as well via the reverse table lookup 1604 ("READ TEMP 2" in the illustrated example). Furthermore, FIG. 18C illustrates the local logical storage element read temperature mapping database 1400 following a subsequent iteration of the method 1700 (i.e., where the "current" read temperatures described above as being identified during the first iteration off the method 1700 have become "previous" read temperatures upon subsequent iteration(s) of the method 1700) that includes the logical-to-physical storage element map 1402 that maps the logical indices to physical addresses, with the previous read temperatures mapped to those logical indices via the reverse table lookup 1800 ("READ TEMP 1" in the illustrated example), the previous read temperatures mapped to those logical indices as well via the table 1604 ("READ TEMP 2" in the illustrated example), and the current read temperatures mapped to those logical indices as well via the table 1802 ("READ TEMP 2" in the illustrated example).

As such, one of skill in the art in possession of the present disclosure will appreciate how any number of previous read temperatures may be mapped to the logical indices in the logical-to-physical storage element map 1402 after multiple iterations of the method 1700, and how previous read temperatures mapped to logical indices may be "aged out" or otherwise discarded as they age in order to allow only relatively recent previous read temperatures to be utilized to identify a read temperature of those logical indices to a user. Furthermore, the mapping of previous read temperatures to any logical index in the logical-to-physical storage element map 1402 may be performed each time a read of the associated NAND row occurs, or may be performed once for any particular previous read temperature (as that previous read temperature will be fixed) and mapped in a separate "historical" lookup table. As such, composite read temperatures generated from current and previous read temperatures may be associated with each logical index, or each current read temperature and previous read temperature determined for a physical index may be associated with the physical index and then looked up when the read temperature of the logical index associated with the physical index is needed.

Furthermore, in addition to associating read temperatures with logical storage elements, in some embodiments the read-disturb-based read temperature information engine 900 (a read-disturb-based logical storage read temperature information maintenance engine in this embodiment) provided by the storage device processing system 304 may also identify when data associated with a logical index is moved to a different physical storage location (e.g., when data associated with a logical index is moved between physical storage locations such that the physical address pointer associated with that logical index changes). For example, any particular read temperature may be associated with any logical index via two or three bits of data, while one bit of data may be associated with that read temperature and used to identify whether its associated data was moved between physical storage locations since the previous read temperature was identified. As such, any previous read temperatures or current read temperature mapped to a logical index may also indicate whether its associated data was moved to a new storage location since the most recent previous read temperature was identified for that logical index/data (e.g., a "data movement indicator" may be associated with a read temperature in the table 1604 that is associated with a particular logical index in order to identify that its associated data was moved between physical storage locations subsequent to the identification of the read temperature in the table 1800 associated with that particular logical index). As discussed below, the identification of whether a read temperature was determined for data that has moved between storage locations may be used to determine how to identify the current read temperature mapped to any logical index.

The method 1700 then proceeds to block 1706 where the read-disturb-based logical storage read temperature information maintenance subsystem generates a current local logical storage element read temperature map based on the current read disturb information and the previous read disturb information mapped to the logical storage element(s) in the logical-to-physical storage element mapping for the storage device. In an embodiment, at block 1706, the read-disturb-based read temperature information engine 900 (a read-disturb-based logical storage read temperature information maintenance engine in this embodiment) provided by the storage device processing system 304 may use the previous read temperatures and current read temperature indicated by the previous read disturb information and current read disturb information, respectively, that is mapped to the logical indices in the logical-to-physical storage element map 1402 in order to generate a local logical storage element read temperature map. For example, for any logical index in the logical-to-physical storage element map 1402, the storage device processing system 304 may generate a "reported" read temperature that is based on the previous read temperature(s) and current read temperature indicated by the previous read disturb information and current read disturb information, respectively, that is mapped to that logical index, and provide that reported read temperature in the local logical storage element read temperature map (i.e., as a read temperature of a logical storage element in that local logical storage element read temperature map).

For example, FIG. 18C illustrates how the logical index "0" may have been mapped to a relatively "hot" previous read temperature in the table 1800 ("READ TEMP 1") identified at a first time, a relatively "cold" previous read temperature in the table 1604 ("READ TEMP 2") identified at a second time that is subsequent to the first time, and a relatively "low intermediate" current read temperature in the table 1800 ("READ TEMP N") identified at a third time that is subsequent to the second time. In one specific example, the reported read temperature for the logical block "0" may be the relatively "low intermediate" current read temperature, particularly in situations where there is no indication associated with any of the previous read temperatures and/or the current read temperature that the data was moved between storage locations.

However, in another specific example, the relatively "cold" previous read temperature in the reverse lookup table 1604 ("READ TEMP 2") identified at the second time may include an indication that the associated data was moved between storage locations following the identification of the relatively "hot" previous read temperature in the reverse lookup table 1800 ("READ TEMP 1") identified at the first time (e.g., as indicated by the sudden change of read temperature for the logical block "0" from relatively "hot" to relatively "cold") and, in response, the reported read temperature may identify a relatively "hot" or relatively "high intermediate" read temperature due to, for example, the knowledge of that data movement followed by increasing read temperature (i.e., from relatively "cold" to relatively "low intermediate" following that data movement in the illustrated example). Furthermore, information associated with the time at which data was moved between storage locations (e.g., how long ago data was moved between storage locations) may allow a current read temperature for that data to be ignored (e.g., if the associated data was moved relatively recently) or considered (e.g., if the associated data was moved relatively long ago) in the determination of the read temperature that will be identified for that data/logical index.

As will be appreciated by one of skill in the art in possession of the present disclosure, the movement of data between storage locations will cause the read disturb information associated with that data to "reset" (i.e., the writing of that data to the new physical storage location will be followed by no read disturb effects associated with that new physical storage location until subsequent reads are performed), and thus relatively "hot" data moved to a new storage location may require some time to generate corresponding read disturb information that may identify that data and its logical index as relatively "hot". Thus, in the example above, the reported read temperature for the logical index "0" may be relatively "hot" or relatively "high intermediate" read temperature despite actual identified relatively "cold" and relatively "low intermediate" read temperatures in the reverse lookup tables 1604 and 1802 for the logical index "0", respectively, because of 1) the knowledge of the previous relatively "hot" read temperature in the table 1800 for the logical index "0", 2) the knowledge of the movement of data prior to identifying the relatively "cold" read temperature in the table 1604 for the logical index "0", and 3) the knowledge of the increasing of read temperatures from the table 1604 to the table 1802 for the logical index "0". In other words, the data associated with the logical index "0" may be assumed to remain relatively "hot" because of its previous "hotness" and its increasing "hotness" subsequent to being moved between physical storage locations.

In another example, the logical index "200" may have been mapped to a relatively "high intermediate" previous read temperature in the table 1800 ("READ TEMP 1") identified at a first time, a relatively "hot" previous read temperature in the table 1604 ("READ TEMP 2") identified at a second time that is subsequent to the first time, and a relatively "hot" current read temperature in the table 1802 ("READ TEMP N") identified at a third time that is subsequent to the second time. In one specific example, the reported read temperature for the logical block "200" may be the relatively "hot" current read temperature, but given the trend from relatively "high intermediate" read temperature to multiple consecutive relatively "hot" read temperatures, some examples may allow for the reporting of relatively "sustained hot" read temperature for the logical block "200". However, while a few specific examples have been provided, one of skill in the art in possession of the present disclosure will appreciate how the read-disturb-based read temperature information engine 900 (a read-disturb-based logical storage read temperature information maintenance engine in this embodiment) provided by the storage device processing system 304 may utilize any techniques for determining a reported read temperature based on a current read temperature and any number of previous read temperatures (as well as data movement identifications) while remaining within the scope of the present disclosure as well.

The method 1700 then proceeds to block 1708 where the read-disturb-based logical storage read temperature information maintenance subsystem provides the current local logical storage element read temperature map to a global read temperature identification subsystem. In an embodiment, at block 1708, the read-disturb-based read temperature information engine 900 (a read-disturb-based logical storage read temperature information maintenance engine in this embodiment) provided by the storage device processing system 304 may perform local logical storage element read temperature map provisioning operations to provide the local logical storage element read temperature map to the global read temperature identification engine 204 in substantially the same manner as described above with reference to blocks 408 and 410 of the method 400 (e.g., by the storage device processing system 304 storing the local logical storage element read temperature map, and the global read temperature identification engine 204 retrieving that local logical storage element read temperature map). Furthermore, as discussed above with regard to block 412, the global read temperature identification engine 204 may then use local logical storage element read temperature maps retrieved from the storage device(s) 210a-210c to generate a global logical storage element read temperature map.

Thus, systems and methods have been described that provide for the mapping of logical storage elements to both current read disturb information and previous read disturb information in order to allow for the identification of read temperatures of those logical storage elements based on at least some of their history of read temperatures. For example, the read-disturb-based logical storage read temperature information maintenance system of the present disclosure may include a global read temperature identification subsystem coupled to storage device(s). Each storage device identifies, from a physical block in that storage device, current read disturb information associated with a row provided by the physical block in that storage device, and maps the current read disturb information to logical storage element(s) included in a logical-to-physical storage element mapping for that storage device along with previous read disturb information that was previously mapped to those logical storage element(s) included in the logical-to-physical storage element mapping for that storage device. Based on the current read disturb information and the previous read disturb information mapped to the logical storage element(s) included in the logical-to-physical storage element mapping for that storage device, each storage device generates a current local logical storage element read temperature map that it provides to the global read temperature identification subsystem. As such, as data is moved between physical storage locations, the history of read temperatures of the logical storage element(s) associated with that data allow a more accurate read temperature to be identified for the logical storage element(s).

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A read-disturb-based physical storage read temperature information identification system, comprising:
a global read temperature identification subsystem; and
at least one storage device coupled to the global read temperature identification subsystem, wherein each at least one storage device is configured to:
read, from at least one physical block in that storage device, valid data and obsolete data;
identify, based on the reading of the valid data and the obsolete data from the at least one physical block in that storage device, read disturb information associated with each row provided by the at least one physical block in that storage device;
generate, using the read disturb information associated with each row provided by the at least one physical block in that storage device, a local logical storage element read temperature map for that storage device; and
provide the local logical storage element read temperature map to the global read temperature identification subsystem.

2. The system of claim 1, wherein each at least one storage device is configured, prior to reading the valid data and the obsolete data from the at least one physical block in that storage device, to:
write the valid data and pre-obsolete data to the at least one physical block in that storage device with error correction information such that each of the valid data and the pre-obsolete data is associated with respective error correction information; and
move the pre-obsolete data between rows in the at least one physical block in that storage device such that the obsolete data is left with respective error correction information in the at least one physical block in that storage device.

3. The system of claim 2, wherein each at least one storage device is configured to:
identify the read disturb information associated with each row provided by the at least one physical block in that storage device based on the respective error correction information associated with the valid data and the respective error correction information associated with the obsolete data.

4. The system of claim 2, wherein at least one of the valid data and the obsolete data includes padding data that was written with respective error correction information.

5. The system of claim 4, wherein each at least one storage device is configured to:
identify the read disturb information associated with at least one of the rows provided by the at least one physical block in that storage device based on the respective error correction information associated with the padding data.

6. The system of claim 1, wherein each at least one storage device is configured to:
store the local logical storage element read temperature map in a local memory system in that storage device.

7. The system of claim 1, wherein the global read temperature identification subsystem is configured to:
generate, using the local logical storage element read temperature map generated by each at least one storage device, a global logical storage element read temperature map.

8. A storage device, comprising:
a processing system; and
a memory system that is coupled to the processing system and that includes instructions that, when executed by the processing system, cause the processing system to provide a read-disturb-based physical storage read temperature information identification engine that is configured to:
- read, from at least one physical block in a storage device, valid data and obsolete data;
- identify, based on the reading of the valid data and the obsolete data from the at least one physical block in the storage device, read disturb information associated with each row provided by the at least one physical block in the storage device;
- generate, using the read disturb information associated with each row provided by the at least one physical block in the storage device, a local logical storage element read temperature map for the storage device; and
- provide the local logical storage element read temperature map to a global read temperature identification subsystem.

9. The storage device of claim 8, wherein the read-disturb-based physical storage read temperature information identification engine is configured, prior to reading the valid data and the obsolete data from the at least one physical block in the storage device, to:
- write the valid data and pre-obsolete data to the at least one physical block in the storage device with error correction information such that each of the valid data and the pre-obsolete data is associated with respective error correction information; and
- move the pre-obsolete data between rows in the at least one physical block in the storage device such that the obsolete data is left with respective error correction information in the at least one physical block in the storage device.

10. The storage device of claim 9, wherein the read-disturb-based physical storage read temperature information identification engine is configured to:
- identify the read disturb information associated with each row provided by the at least one physical block in the storage device based on the respective error correction information associated with the valid data and the respective error correction information associated with the obsolete data.

11. The storage device of claim 9, wherein at least one of the valid data and the obsolete data includes padding data that was written with respective error correction information.

12. The storage device of claim 11, wherein the read-disturb-based physical storage read temperature information identification engine is configured to:
- identify the read disturb information associated with at least one of the rows provided by the at least one physical block in the storage device based on the respective error correction information associated with the padding data.

13. The storage device of claim 8, wherein the read-disturb-based physical storage read temperature information identification engine is configured to:
- store the local logical storage element read temperature map in a local memory system in the storage device.

14. A method for providing read-disturb-based physical storage read temperature identification, comprising:
- reading, by a read-disturb-based physical storage read temperature information identification subsystem from at least one physical block in a storage device, valid data and obsolete data;
- identifying, by the read-disturb-based physical storage read temperature information identification subsystem based on the reading of the valid data and the obsolete data from the at least one physical block in the storage device, read disturb information associated with each row provided by the at least one physical block in the storage device;
- generating, by the read-disturb-based physical storage read temperature information identification subsystem using the read disturb information associated with each row provided by the at least one physical block in the storage device, a local logical storage element read temperature map for the storage device; and
- providing, by the read-disturb-based physical storage read temperature information identification subsystem, the local logical storage element read temperature map to a global read temperature identification subsystem.

15. The method of claim 14, further comprising:
- writing, by the read-disturb-based physical storage read temperature information identification subsystem prior to reading the valid data and the obsolete data from the at least one physical block in the storage device, the valid data and pre-obsolete data to the at least one physical block in the storage device with error correction information such that each of the valid data and the pre-obsolete data is associated with respective error correction information; and
- moving, by the read-disturb-based physical storage read temperature information identification subsystem prior to reading the valid data and the obsolete data from the at least one physical block in the storage device, the pre-obsolete data between rows in the at least one physical block in the storage device such that the obsolete data is left with respective error correction information in the at least one physical block in the storage device.

16. The method of claim 15, further comprising:
- identifying, by the read-disturb-based physical storage read temperature information identification subsystem, the read disturb information associated with each row provided by the at least one physical block in the storage device based on the respective error correction information associated with the valid data and the respective error correction information associated with the obsolete data.

17. The method of claim 14, wherein at least one of the valid data and the obsolete data includes padding data that was written with respective error correction information.

18. The method of claim 17, further comprising:
- identifying, by the read-disturb-based physical storage read temperature information identification subsystem, the read disturb information associated with at least one of the rows provided by the at least one physical block in the storage device based on the respective error correction information associated with the padding data.

19. The method of claim 14, further comprising:
- storing, by the read-disturb-based physical storage read temperature information identification subsystem, the local logical storage element read temperature map in a local memory system in the storage device.

20. The method of claim 14, further comprising:
- generating, by the global read temperature identification subsystem using the local logical storage element read temperature map generated by the read-disturb-based physical storage read temperature information identification subsystem, a global logical storage element read temperature map.

* * * * *